(12) United States Patent
Shimura

(10) Patent No.: US 11,754,926 B2
(45) Date of Patent: Sep. 12, 2023

(54) METHOD OF FORMING RESIST PATTERN, RESIST COMPOSITION AND METHOD OF PRODUCING THE SAME

(71) Applicant: TOKYO OHKA KOGYO CO., LTD., Kawasaki (JP)

(72) Inventor: Eiichi Shimura, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 477 days.

(21) Appl. No.: 16/678,648

(22) Filed: Nov. 8, 2019

(65) Prior Publication Data
US 2020/0150541 A1  May 14, 2020

(30) Foreign Application Priority Data
Nov. 14, 2018 (JP) .................. 2018-214080

(51) Int. Cl.
| | |
|---|---|
| *G03F 7/039* | (2006.01) |
| *G03F 7/32* | (2006.01) |
| *G03F 7/20* | (2006.01) |
| *C08L 65/02* | (2006.01) |
| *C08L 33/02* | (2006.01) |
| *C08L 33/14* | (2006.01) |

(52) U.S. Cl.
CPC ............. *G03F 7/325* (2013.01); *C08L 33/02* (2013.01); *C08L 33/14* (2013.01); *C08L 65/02* (2013.01); *G03F 7/0397* (2013.01); *G03F 7/20* (2013.01)

(58) Field of Classification Search
CPC ...... G03F 7/039; G03F 7/0392; G03F 7/0397; G03F 7/30; C08L 33/02
See application file for complete search history.

(56) References Cited

U.S. PATENT DOCUMENTS

| | | | |
|---|---|---|---|
| 5,350,660 A | 9/1994 | Urano et al. | |
| 2006/0223010 A1* | 10/2006 | Tsuji | ............... G03F 7/0392 430/311 |
| 2007/0275320 A1* | 11/2007 | Washio | ............... G03F 7/0392 430/4 |

FOREIGN PATENT DOCUMENTS

| | | |
|---|---|---|
| JP | 2004-211258 A | 8/1992 |
| JP | 2011-052562 A | 2/1999 |
| JP | 2015-526752 A | 9/2015 |

OTHER PUBLICATIONS

Office Action issued in Japanese Patent Application No. 2018-214080, dated Jun. 28, 2022.

* cited by examiner

*Primary Examiner* — Daborah Chacko-Davis
(74) *Attorney, Agent, or Firm* — Knobbe, Martens, Olson & Bear, LLP

(57) ABSTRACT

A method of forming a resist pattern, including forming a resist composition using a resist film; exposing the resist film; and alkali-developing the exposed resist film to form a positive-tone resist pattern, wherein the resist composition includes a first resin component and a second resin component which satisfies a specific relationship $DR_{MIX} < DR_{P1}$ and $DR_{MIX} < DR_{P2}$, wherein $DR_{P1}$ is the dissolution rate of the first resin component (P1) in an alkali developing solution, $DR_{P2}$ is the dissolution rate of the second resin component (P2) in an alkali developing solution, and $DR_{MIX}$ is the dissolution rate of a mixed resin of the first resin component (P1) and the second resin component (P2).

8 Claims, No Drawings

METHOD OF FORMING RESIST PATTERN, RESIST COMPOSITION AND METHOD OF PRODUCING THE SAME

TECHNICAL FIELD

The present invention relates to a method of forming a resist pattern, a resist composition and a method of producing the same.

Priority is claimed on Japanese Patent Application No. 2018-214080, filed Nov. 14, 2018, the content of which is incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the manufacture of semiconductor devices, liquid crystal display devices, and electronic components, pattern miniaturization has rapidly progressed, and photofabrication is the basis for the manufacture.

Photofabrication is a general term for processing techniques for manufacturing various precision parts by using a photosensitive resin composition (resist composition) to form a coating film on the surface of a workpiece, patterning the coating film by photolithography, and using the patterned coating film as a mask for chemical etching, electrolytic etching, or electroforming mainly based on electroplating.

In particular, along with downsizing of electronic devices, high-density packaging technology for semiconductor packages has progressed, and multi-pin thin film packaging of packages, formation of fine rewiring, and reduction in package size have been achieved. In addition, heterogeneous integration by packages, and SiP (system in package) using package technologies such as Fan-Out, TSV, and 2.1D/2.5D/3D have been actively studied.

In order to meet these requirements, characteristics applicable to photofabrication are required. Namely, resist materials are required to have not only lithography properties such as sensitivity to exposure light sources and resolution that can reproduce patterns with fine dimensions, but also resistance during substrate processing such as chemical etching, resist etching, electrolytic etching, or wet etching using resist as a mask, resistance to plating processes such as electrolytic/electroless plating, and resistance to lift-off processes.

As a resist material that satisfies such requirements, as a positive resist, a chemically amplified resist composition containing a base material component whose solubility in a developing solution is changed by the action of an acid and an acid generator component that generates an acid upon exposure is used (see, for example, Patent Literatures 1 and 2).

For example, when the developing solution is an alkali developing solution (alkaline development process), as a chemically amplified positive resist composition, a resist composition containing a resin component having a portion soluble in a developing solution protected with an acid-dissociable, dissolution-inhibiting group (protective group) such that the resin component is hardly soluble in a developing solution, and an acid generator component is generally used. The reason why the resin component is rendered hardly soluble in a developing solution is because this greatly affects the amount of remaining film in the unexposed area.

When a resist film formed using such a resist composition, by conducting selective exposure in the formation of a resist pattern, an acid is generated from the acid generator component in the exposed portion, and deprotection of the protective group introduced in advance proceeds by the action of the acid, such that the exposed portion of the resist film becomes soluble in an alkali developing solution. Thus, by conducting alkali developing, the unexposed portions of the resist film remain to form a positive resist pattern.

In such photofabrication, it is necessary to form a resist pattern with a required film thickness on the surface of a support or a workpiece depending on the application.

When rewiring is formed in Fan-Out of a semiconductor package, for example, a resist film having a film thickness of about 3 µm is formed, a resist pattern is formed by exposure through a predetermined mask pattern followed by development, and then the non-resist portion is subjected to plating with a conductor such as copper, so as to form a wiring portion.

Alternatively, when forming bumps or metal posts of a semiconductor package, for example, a resist film of about 60 µm is formed, and after forming a resist pattern in the same manner as described above, a non-resist portion is subjected to plating with a conductor such as copper, so as to form the bumps and metal posts.

Furthermore, in photofabrication in semiconductor device processing, a resist film having a film thickness of, for example, 8 µm or more is formed on the surface of the workpiece depending to the application or the like, and a resist pattern is formed, followed by etching or the like.

DOCUMENTS OF RELATED ART

Patent Literature

[Patent Literature 1] Japanese Unexamined Patent Application, First Publication No. Hei 4-211258
[Patent Literature 2] Japanese Unexamined Patent Application, First Publication No. Hei 11-52562

SUMMARY OF THE INVENTION

As semiconductor device processing, diversification of semiconductor packages, and high integration further progress, deeper etching of semiconductor devices, formation of fine wiring, and further increase in density of protruding electrodes, metal posts and the like are required. In response to such demands, in particular, in resist compositions, it is required to form a resist pattern with high sensitivity that can suppress film thickness loss of the resist film during development with higher sensitivity and to form fine patterns without residue.

However, in the conventional method of forming a resist pattern using a chemically amplified positive resist composition, in order to suppress dissolution of unexposed portions of the resist film by developing (film thickness loss of resist film by developing), it is necessary to contain, as a resist composition, a resin that is rendered hardly soluble in a developing solution by protecting portions which are soluble in the developing solution with acid dissociable, dissolution inhibiting groups (protecting groups).

The present invention takes the above circumstances into consideration, with an object of providing a method of forming a resist pattern which enables suppression of film thickness loss of a resist film by developing, and formation of a pattern with high sensitivity and suppressed generation of residue; a resist composition useful for the method, and a method of producing the same.

Conventionally, in a chemically amplified positive resist composition, a resin that is rendered hardly soluble in an alkali developing solution by adding an acid-dissociable group to a resin that is easily dissolved in an alkali developing solution (alkaline aqueous solution) is used.

In the case where a change in film thickness due to development (film loss or swelling during development) occurs in a state where the resin is provided with an acid-dissociable group, if the unexposed portions of the resist film is dissolved or swollen, it means that the resist pattern portion is affected when the resist composition is a positive resist composition.

The film thickness loss of the resist film by developing may be expressed by a dissolution rate (nm/s). The higher the dissolution rate in the alkaline developing solution, the greater the film thickness loss in the unexposed portion of the resist film during development. On the other hand, the closer the dissolution rate in the alkaline developing solution to zero, the smaller the film thickness loss in the unexposed portion of the resist film during development. Further, when the dissolution rate in the alkali developing solution takes a negative value, it means that the resist film is swollen by the alkali developing solution during development, and the amount of swelling of the resist film increases as the negative absolute value increases.

In order to control the solubility in an alkali developer to a desired value, there are known a method in which the introduction rate (protection rate) of an acid dissociable group (protective group) introduced in the resin production stage is controlled; and a method in which a resin having a high protection rate (a resin with less film thickness loss than the predetermined development film loss) and a resin having a low protection rate (a resin with a larger film thickness loss than the predetermined film thickness loss by development) are produced, and then the resins are mixed together to obtain a predetermined film thickness loss by development.

However, as a result of the studies of the present inventors, it has unexpectedly been found that, by mixing a specific combination of a first resin component (P1) with a second resin component (P2), a value smaller than the dissolution rate of each single resin in an alkaline developing solution may be achieved (that is, the first resin component (P1) and the second resin component (P2) are less soluble in an alkaline developing solution).

By selecting such a combination of resin components, it is possible to use the first resin component (P1), which has conventionally been difficult to be used in a resist composition because of its high dissolution rate in an alkaline developing solution. Further, by using the first resin component (P1) in combination with the second resin component (P2), a chemically amplified positive resist composition having a lower dissolution rate in an alkaline developing solution than both resins may be prepared, and the above problem may be solved by employing such resist composition. The present invention has been completed based on these findings.

Specifically, a first aspect of the present invention is a method of forming a resist pattern, including: using a resist composition which generates acid upon exposure and exhibits increased solubility in an alkali developing solution under action of acid to form a resist film; exposing the resist film; and alkali-developing the exposed resist film to form a positive-tone resist pattern, wherein the resist composition comprises a first resin component (P1) and a second resin component (P2), and when the dissolution rate of the first resin component (P1) in an alkali developing solution is defined $DR_{P1}$, the dissolution rate of the second resin component (P2) in an alkali developing solution is defined $DR_{P2}$ and the dissolution rate of a mixed resin of the first resin component (P1) and the second resin component (P2) is defined $DR_{MIX}$, a combination of the resin component (P1) and the second resin component (P2) which satisfies the following relationship is used:

$$DR_{MIX} < DR_{P1} \text{ and } DR_{MIX} < DR_{P2}$$

A second aspect of the present invention is a resist composition which generates acid upon exposure and exhibits increased solubility in an alkali developing solution under action of acid, the resist composition including: a first resin component (P1) and a second resin component (P2), wherein the first resin component (P1) is a polymeric compound (p10) including a structural unit (a1) derived from an acrylate ester containing an acid decomposable group that exhibits increased polarity by the action of acid, the acrylate ester optionally having the hydrogen atom bonded to the carbon atom on the α-position substituted with a substituent, and a structural unit (a0) derived from acrylic acid optionally having the hydrogen atom bonded to the carbon atom on the α-position substituted with a substituent, the resin component (P2) is a polymeric compound (p20) including a structural unit (u0) containing a phenolic hydroxy group, and when the dissolution rate of the first resin component (P1) in an alkali developing solution is defined $DR_{P1}$, the dissolution rate of the second resin component (P2) in an alkali developing solution is defined $DR_{P2}$ and the dissolution rate of a mixed resin of the first resin component (P1) and the second resin component (P2) is defined $DR_{MIX}$, the following relationship is satisfied:

$$DR_{MIX} < DR_{P1} \text{ and } DR_{MIX} < DR_{P2}.$$

A third aspect of the present invention is a method of producing a resist composition which generates acid upon exposure and exhibits increased solubility in an alkali developing solution under action of acid, the method including: mixing a first resin component (P1) with a second resin component (P2), wherein the first resin component (P1) is a polymeric compound (p10) including a structural unit (a1) derived from an acrylate ester containing an acid decomposable group that exhibits increased polarity by the action of acid, the acrylate ester optionally having the hydrogen atom bonded to the carbon atom on the α-position substituted with a substituent, and a structural unit (a0) derived from acrylic acid optionally having the hydrogen atom bonded to the carbon atom on the α-position substituted with a substituent, the resin component (P2) is a polymeric compound (p20) including a structural unit (u0) containing a phenolic hydroxy group, and when the dissolution rate of the first resin component (P1) in an alkali developing solution is defined $DR_{P1}$, the dissolution rate of the second resin component (P2) in an alkali developing solution is defined $DR_{P2}$ and the dissolution rate of a mixed resin of the first resin component (P1) and the second resin component (P2) is defined $DR_{MIX}$, a combination of the resin component (P1) and the second resin component (P2) which satisfies the following relationship is used:

$$DR_{MIX} < DR_{P1} \text{ and } DR_{MIX} < DR_{P2}.$$

According to the present invention, there is provided a novel method in which resins which by themselves are highly soluble in a developing solution may be mixed together to be rendered hardly soluble in a developing solution. More specifically, according to the present invention, there are provided a method of forming a resist pattern which enables suppression of film thickness loss of a resist film by developing, and formation of a pattern with high sensitivity and suppressed generation of residue; a resist composition useful for the method, and a method of producing the same.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The case of describing "may have a substituent" includes both of the case where the hydrogen atom (—H) is substituted with a monovalent group and the case where the methylene group (—$CH_2$—) is substituted with a divalent group.

The term "exposure" is used as a general concept that includes irradiation with any form of radiation.

The term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed. The organic compound used as the base component is broadly classified into non-polymers and polymers. In general, as a non-polymer, any of those which have a molecular weight in the range of 500 to less than 4,000 is used. Hereafter, a "low molecular weight compound" refers to a non-polymer having a molecular weight in the range of 500 to less than 4,000. As a polymer, any of those which have a molecular weight of 1,000 or more is generally used. Hereafter, a "resin" or a "polymer" refers to a polymer having a molecular weight of 1,000 or more. As the molecular weight of the polymer, the weight average molecular weight in terms of the polystyrene equivalent value determined by gel permeation chromatography (GPC) is used.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, and a halogenated alkyl group of 1 to 5 carbon atoms. Further, an itaconic acid diester having the hydrogen atom bonded to the carbon atom on the α-position substituted with a substituent containing an ester bond, and an α-hydroxyacrylate ester in which the hydrogen atom bonded to the carbon atom on the α-position has been substituted with a hydroxyalkyl group or a group in which the hydroxy group of a hydroxyalkyl group has been modified are also included in an "acrylate ester". A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

Examples of the substituent which substitutes the hydrogen atom bonded to the carbon atom on the α-position of the acrylamide include an alkyl group of 1 to 5 carbon atoms, and a halogenated alkyl group of 1 to 5 carbon atoms.

A "structural unit derived from hydroxystyrene" refers to a structural unit that is formed by the cleavage of the ethylenic double bond of hydroxystyrene. A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

In the present specification and claims, some structures represented by chemical formulae may have an asymmetric carbon, such that an enantiomer or a diastereomer may be present. In such a case, the one formula represents all isomers. The isomers may be used individually, or in the form of a mixture.

(Method of Forming a Resist Pattern)

A first aspect of the present invention is a method of forming a resist pattern, including: using a resist composition which generates acid upon exposure and exhibits increased solubility in an alkali developing solution under action of acid to form a resist film; exposing the resist film; and alkali-developing the exposed resist film to form a positive-tone resist pattern In the present embodiment, as the resist composition, a resist composition including a first resin component (P1) and a second resin component (P2) which satisfy a specific relationship regarding the dissolution rate is employed. The resist composition will be described in detail later.

The method for forming a resist pattern according to the present embodiment can be performed, for example, as follows.

Step of forming a resist film on a substrate.

Firstly, a resist composition containing a first resin component (P1) and a second resin component (P2) that satisfy a specific relationship regarding the dissolution rate is prepared.

Then, this resist composition is applied to a substrate and heated (post applied bake (PAB)) to form a resist film As a method for applying the resist composition to the substrate a spin coating method, a slit coating method, a roll coating method, a screen printing method, an applicator method, a spray coating method, an ink jet method, or the like may be employed. The conditions for the heat treatment may be appropriately determined depending on the kind of each component in the resist composition, the blending ratio, the coating film thickness, and the like. For example, the heat treatment is conducted at 70 to 150° C., preferably 80 to 140° C., for about 1 to 60 minutes.

In addition, the resist composition may not be directly applied to the substrate, but the resist composition may be applied in advance to a film or the like by the above-described application method, and an appropriate heating process may be performed to form a film (dry film). The formed dry film may be adhered to a substrate.

The film thickness of the resist film is, for example, 1 to 250 μm, preferably 1 to 100 μm, more preferably 1 to 65 μm, and still more preferably 2 to 20 μm.

The substrate is not particularly limited, and a conventionally known substrate may be used. Examples of the substrate include a substrate for electronic components, and a substrate for electronic components having a predetermined wiring pattern formed thereon. Examples of such substrate include a metal substrate, such as silicon, silicon nitride, titanium, tantalum, palladium, titanium tungsten, copper, chromium, iron, aluminum or gold, and a glass substrate or an organic material substrate having a metal thin film laminated thereon.

In particular, in the present embodiment, a resist pattern may be satisfactorily formed even on a copper substrate. As a material for the wiring pattern, for example, copper, solder, chromium, aluminum, nickel, gold, or the like may be used.

Step of Exposing the Resist Film:

Next, to the resist film formed on the substrate, radiation containing electromagnetic waves or particle beams, for example, UV or visible light having a wavelength of 240 to 500 nm is selectively irradiated to the resist film formed on the substrate through a mask having a predetermined pattern or using an apparatus capable of direct drawing without using a mask.

As a radiation source, a low-pressure mercury lamp, a high-pressure mercury lamp, an ultrahigh-pressure mercury lamp, a metal halide lamp, an argon gas laser, an excimer laser, or the like may be used. The radiation includes microwaves, infrared rays, visible rays, ultraviolet rays, X-rays, γ-rays, electron beams, proton beams, neutron beams, ion beams, and the like. The amount of the radiation of the radial ray may be appropriately determined depending on the kind of each component in the resist composition, the amount of each component, the film thickness of the coating film, and the like. The radiation contains a beam which activates the acid generator so as to generate acid.

Next, after the resist film is exposed, a heat treatment (post exposure bake (PEB)) is preferably conducted by a conventional method to promote acid diffusion and deprotection of the acid dissociable group (protecting group). In this manner, the alkali solubility of the exposed portion of the resist film is changed. The conditions for the heat treatment may be appropriately determined depending on the kind of each component in the resist composition, the blending ratio, the coating film thickness, and the like. For example, the heating temperature is preferably 80 to 150° C., and the heating time is 1 to 60 minutes.

Step of Alkali-Developing the Exposed Film:

Subsequently, for example, an alkaline aqueous solution is used as a developing solution (developer), and unnecessary portions are dissolved and removed to obtain a predetermined positive-tone resist pattern.

As the developing solution, for example, an aqueous solution of an alkali such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide (TMAH), tetraethylammonium hydroxide, pyrrole, piperidine, 1,8-diazabicyclo[5,4,0]-7-undecene or 1,5-diazabicyclo[4,3,0]-5-nonane may be used.

The concentration of the alkali in the developing solution may be appropriately selected depending on the kind of the resin and the like. For example, in the case of an aqueous TMAH solution, the concentration is preferably 0.75 to 5% by weight, and more preferably 2 to 3% by weight.

Further, an aqueous solution of alkali in which an appropriate amount of a water-soluble organic solvent such as methanol or ethanol or a surfactant is added may be used as the developing solution.

In the developing solution, the concentration of the surfactant is preferably 0.02 to 2.5% by weight.

The alkali development time may be appropriately determined depending on the kind of each component of the resist composition, the blending ratio, and the dry film thickness of the composition, and is preferably 0.5 to 30 minutes.

Further, the alkali development method may be any of a liquid piling method, a dipping method, a paddle method, a spray development method and the like. After alkali development, if necessary, washing with running water may be performed, for example, for 30 to 90 seconds, and then dried using a spin dry method, an air gun, an oven, or the like.

At the non-resist portions of the thus obtained resist pattern (portions where the resist has been removed by the alkali developing solution), a conductor such as metal may be embedded by plating for example, so as to form conductive structures such as wiring, metal posts, and/or bumps.

The plating method is not particularly limited, and various conventionally known methods may be employed. As the plating solution, solder plating solution, copper plating solution, gold plating solution, or nickel plating solution may be preferably used. Finally, the remaining resist pattern is removed by a conventional method using a stripping solution or the like. Alternatively, the thus obtained resist pattern described above may be used as a mask to perform substrate processing such as chemical etching, electrolytic etching, and wet etching.

<Resist Composition>

The resist composition used in the method of forming a resist pattern according to the present embodiment generates acid upon exposure and exhibits increased solubility in an alkali developing solution under action of acid.

The resist composition contains a resin component (P) (hereafter, sometimes referred to as "component (P)") which exhibits increased solubility in a developing solution. In the present embodiment, the component (P) includes at least a first resin component (P1) (hereafter, sometimes referred to as "component (P1)") and a second resin component (P2) (hereafter, sometimes referred to as "component (P2)").

In the present embodiment, the resist composition may include the component (P) and an acid generator component (B) (hereafter, sometimes referred to as "component (B)") which generates acid upon exposure.

When a resist film is formed using such a resist composition and selective exposure is performed on the resist film, an acid is generated in the exposed portion of the resist film, and the solubility of the resin component in the developing solution is changed by the action of the acid. On the other hand, since the solubility of the resin component in the developing solution does not change in the unexposed portion of the resist film, there is a difference in solubility in the developing solution between the exposed portion and the unexposed portion of the resist film. Therefore, by developing the resist film, the exposed portions of the resist film are dissolved and removed, thereby forming a positive-tone resist pattern.

In the resist composition, when the dissolution rate of the first resin component (P1) in an alkali developing solution is defined $DR_{P1}$, the dissolution rate of the second resin component (P2) in an alkali developing solution is defined $DR_{P2}$ and the dissolution rate of a mixed resin of the first resin component (P1) and the second resin component (P2) is defined $DR_{MIX}$, $$DR_{MIX} < DR_{P1} \text{ and } DR_{MIX} < DR_{P2}$$

a combination of the resin component (P1) and the second resin component (P2) which satisfies the following relationship is used. That is, the dissolution rate of the mixed resin in an alkaline developing solution is set to a smaller value than the dissolution rate of each individual resin in an alkaline developing solution.

As a result, in the formation of a resist pattern, even if the resin has a high dissolution rate in an alkaline developing solution and is difficult to be used, the film thickness loss by development may be suppressed, and a residue becomes unlikely to be generated.

Conventionally, as the resin component (P), a resin that is hardly soluble in an alkali developing solution obtained by introducing an acid-dissociable group into a resin that is easily dissolved in an alkali developing solution (alkaline aqueous solution) is used.

In order to control the dissolution rate of the resin in an alkali developing solution to a desired value and render the resin hardly soluble in an alkali developing solution, for example, there are known a method in which the rate of introduction of acid-dissociable groups (protective groups) introduced into the alkali-soluble resin (protection rate) is controlled at the resin production stage; and a method in which, taking into consideration of the fluctuation which occurs during production, resins having different protection rates are produced and mixed together, so as to obtain a hardly soluble resin (mixed resin) having a desired dissolution rate. In such a case, regarding the dissolution rate in an alkali developing solution, the hardly soluble resin $P'_{MIX}$ after mixing (whose dissolution rate is defined as $DR'_{MIX}$), the resin $P'_H$ prior to mixing and having a high protection rate and low dissolution rate (whose dissolution rate is defined as $DR'_{PH}$), and the resin $P'_L$ prior to mixing and having a low protection rate and high dissolution rate (whose dissolution rate is defined as $DR'_{PL}$) generally satisfy the following relationship: $DR'_{PH} < DR'_{MIX} < DR'_{PL}$.

However, in the present embodiment, a resist composition containing a combination of the component (P1) and the component (P2) which satisfies the above specific relationship regarding the dissolution rate (i.e., $DR_{MIX} < DR_{P1}$, and $DR_{MIX} < DR_{P2}$) is employed. By mixing together resins which both have a relatively high dissolution rate in an alkali developing solution, the dissolution rate of the mixed resin is rendered relatively low. As a result, in the formation of a resist pattern, film thickness loss of a resist film by developing may be suppressed, and it becomes possible to form a fine resist pattern with high resolution and suppressed generation of residue.

[Dissolution Rate of Resin in Alkali Developing Solution]

The dissolution rate (DR) of the resin in an alkaline developing solution largely varies depending on the kind, concentration, and temperature of the alkaline developer to be used. For this reason, in the present invention, a dissolution rate measured and calculated with a developing solution and development conditions to be used or planned to be used as a final resist composition during resist patterning is defined as the dissolution rate.

The dissolution rate (DR) of the resin in the alkaline developing solution is not as high as that of the developing solution, but varies depending on the film thickness of the coating film, heating conditions, and the like. Ideally, the resist composition to be used in the resist patterning is used to form a resin film having a predetermined film thickness under predetermined heating conditions (PAB) actually used or planned to be used, and then the dissolution rate is defined by the calculated value using the aforementioned developing solution and developing conditions. However, the film thickness of the coating film and the heating conditions during the formation of the coating film is appropriately modified depending on the object. Therefore, in the present invention, the "dissolution rate of a resin in an alkali developing solution" is defined as the value obtained and calculated in accordance with the following measuring method.

In the present embodiment, the measurement of the "dissolution rate of a resin in an alkali developing solution" is conducted in accordance with the following steps (1) to (6) or steps (1') to (6').

Step (1): A resin is mixed with an organic solvent component (solvent) normally used in a resist composition, so as to prepare a resin solution. The resin solution may be prepared by mixing a plurality of resins in advance, and then mixing the resins with the organic solvent component. Alternatively, a resin solution of individual resin may be prepared, and then the resin solutions may be mixed together at a desired ratio. If necessary, the resin solution may be diluted with a solvent, or an appropriate amount of a leveling agent (surfactant) may be added to the resin solution.

Step (2): The resin solution is applied to a silicon wafer, followed by a bake treatment (PAB) at 120° C. for 90 seconds, so as to form a resin film having a thickness of about 3 µm.

Step (3): The film thickness of the resin film (initial thickness X) is measured.

Step (4): The silicon wafer having the resin film formed thereon is, without conducting exposure and heat treatment after exposure (PEB), subjected to an alkaline development for 60 seconds using a developer at a predetermined temperature with a predetermined alkaline developing solution, followed by washing with water and drying (a non-heat drying, such as spin-drying or $N_2$ air blow).

Step (5): After the developing, the film thickness of the resin film (film thickness Y after development) is measured.

Step (6): The dissolution rate (DR) of the resin in an alkaline developing solution is calculated.

$DR(nm/s) = (X-Y)/60$ seconds (developing time)

In the above procedure, in the case where all of the resin film is dissolved in the development, the developing time in step (4) may be shortened to 30 seconds. Further, if it is difficult to use a silicon wafer or a developer, or if it is difficult to measure the dissolution rate by the above procedure, the dissolution rate is measured by the following steps (1') to (6').

Step (1'): A resin is mixed with an organic solvent component (solvent) normally used in a resist composition, so as to prepare a resin solution. The resin solution may be prepared by mixing a plurality of resins in advance, and then mixing the resins with the organic solvent component. Alternatively, a resin solution of individual resin may be prepared, and then the resin solutions may be mixed together at a desired ratio. If necessary, the resin solution may be diluted with a solvent, or an appropriate amount of a leveling agent (surfactant) may be added to the resin solution.

Step (2'): The resin solution is applied to a support (such as a silicon wafer) on which the film thickness is measurable, followed by a bake treatment (PAB) at 120° C. for 90 seconds, so as to form a resin film having a thickness of about 3 m.

Step (3'): The film thickness of the resin film (initial thickness X) is measured.

Step (4'): A predetermined alkali developing solution is added to a container such as a beaker or a tray. If desired, the temperature of the developing solution is adjusted, so as to obtain a predetermined temperature of the developing solution. A container having a size capable of accommodating the support formed in step (2') is selected. Alternatively, the support is cut to a size capable of being accommodated in the container.

Step (5'): The support is immersed in the alkali developing solution in the container, and the time required for the formed resin film to be completely dissolved (dissolution time Z) is measured. The dissolution time is limited to 2 minutes at the maximum. If the resin film has not been completely dissolved after 2 minutes, the support is taken out of the container, and the support is washed with water, followed by drying. Then, the film thickness of the resin (film thickness Y after developing) is measured.

Step (6'): The dissolution rate (DR) of the resin in an alkaline developing solution is calculated.

When the resin film has been completely dissolved: $DR(nm/s) = (X)/(Z)$

When the resin film has not been completely dissolved: $DR(nm/s) = (X-Y)/120$ seconds (developing time)

In the present embodiment, when the object is to compare the degree of the dissolution rate between $DR_{P1}$, $DR_{P2}$ and $DR_{MIX}$, even if the developing solution, the developing conditions, the resist film thickness and the resist film forming conditions to be employed in the ultimate resist patterning using the resist composition are not used, dissolution rate values obtained using the same developing solution, developing conditions, resin film thickness and resin film forming conditions may be compared. Specifically, as one example, in the case where a 2.38 wt % TMAH solution is used as a developing solution under developing conditions of 23° C. in the ultimate resist patterning, in the measurement of the dissolution rates and comparison of the dissolution rates, a 5 wt % TMAH solution may be used to determine DR, and compare the degree of $DR_{P1}$, $DR_{P2}$ and $DR_{MIX}$. Similarly, if DR may be measured under the same conditions even when the film thickness of the rein film and the film forming conditions are changed, the dissolution rates may be compared based on the measured values.

Furthermore, any other measuring method other than the measuring method including the above steps may be employed as long as dissolution rates can be measured which enables comparison of the degree of the dissolution rates between $DR_{P1}$, $DR_{P2}$ and $DR_{MIX}$. For example, as one example, quartz crystal microbalance (QCM) method may be used to determine the dissolution rates for comparison.

The reason is that the determined DR value may change depending on the measurement conditions and measurement method, but the DR values determined under the same conditions do not change in terms of the degree of dissolution rates.

<<First Resin Component (P1)>>

In the present embodiment, as the first resin component (P1) (component (P1)), a polymeric compound (p10) including a structural unit (a1) derived from an acrylate ester containing an acid decomposable group that exhibits increased polarity by the action of acid, the acrylate ester optionally having the hydrogen atom bonded to the carbon atom on the α-position substituted with a substituent, and a structural unit (a0) derived from acrylic acid optionally having the hydrogen atom bonded to the carbon atom on the α-position substituted with a substituent may be used.

—Structural Unit (a1)

The structural unit (a1) is a structural unit derived from an acrylate ester which may have the hydrogen atom bonded to the carbon atom on the α-position substituted with a substituent and contains an acid decomposable group which exhibits increased polarity by the action of acid and increased solubility in an alkali developing solution.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group and a sulfo group (—SO$_3$H). Among these examples, a carboxy group is preferable.

More specifically, as an example of an acid decomposable group, a group in which the aforementioned polar group has been protected with an acid dissociable group (such as a group in which the hydrogen atom of a carboxy group has been protected with an acid dissociable group) may be mentioned.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

The acid dissociable group is not particularly limited, and any of the groups that have been conventionally proposed as acid dissociable groups for the base resins of chemically amplified resists can be used.

Among the above polar groups, examples of the acid dissociable group that protects a carboxy group include an acid dissociable group represented by the following general formula (a1-r-1) (hereinafter referred to as "acetal-type acid dissociable group"), and an acid dissociable group represented by the following general formula (a1-r-2) (hereinafter, for the sake of convenience, groups represented by general formula (a1-r-2) and constituted of alkyl groups are sometimes referred to as "tertiary alkyl ester-type acid dissociable groups").

[Chemical Formula 1]

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

Acid dissociable group represented by general formula (a1-r-1):

In the formula (a1-r-1), it is preferable that at least one of $Ra'^1$ and $Ra'^2$ represents a hydrogen atom, and it is more preferable that both of $Ra'^1$ and $Ra'^2$ represent a hydrogen atom.

In the case where $Ra'^1$ or $Ra'^2$ is an alkyl group, as the alkyl group, the same alkyl groups as those described above the for the substituent which may be bonded to the carbon atom on the α-position of the aforementioned α-substituted acrylate ester can be mentioned, and an alkyl group of 1 to 5 carbon atoms is preferable. Specific examples of the alkyl group include linear or branched alkyl groups such as a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

In the formula (a1-r-1), examples of the hydrocarbon group for $Ra'^3$ include a linear, branched or cyclic alkyl group. The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

The cyclic alkyl group preferably has 3 to 20 carbon atoms, and more preferably 4 to 12. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these cyclic alkyl groups, part of the carbon atoms constituting the ring may be replaced with an ethereal oxygen atom (—O—).

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

[Chemical Formula 2]

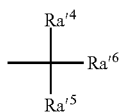

(a1-r2)

In the formula, $Ra'^4$ to $Ra'^6$ each independently represents a hydrocarbon group, provided that $Ra'^5$ and $Ra'^6$ may be mutually bonded to form a ring.

Acid dissociable group represented by general formula (a1-r2):

In formula (a1-r2), as the hydrocarbon group for $Ra'^4$ to $Ra'^6$, the same groups as those described above for $Ra'^3$ may be mentioned.

$Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned. On the other hand, in the case where $Ra'^4$ to $Ra'^6$ are not mutually bonded and independently represent a hydrocarbon group, the group represented by general formula (a1-r2-2) shown below can be mentioned.

[Chemical Formula 3]

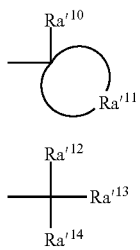

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$ the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the formula (a1-r2-1) are shown below.

[Chemical Formula 4]

(r-pr-m1)

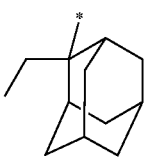

(r-pr-m2)

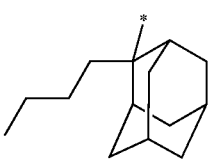

(r-pr-m3)

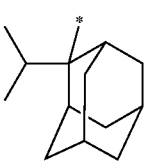

(r-pr-m4)

(r-pr-m5)

(r-pr-m6)

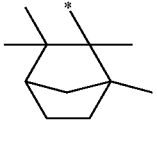

(r-pr-m7)

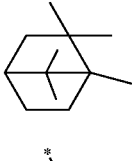

(r-pr-m8)

(r-pr-m9)

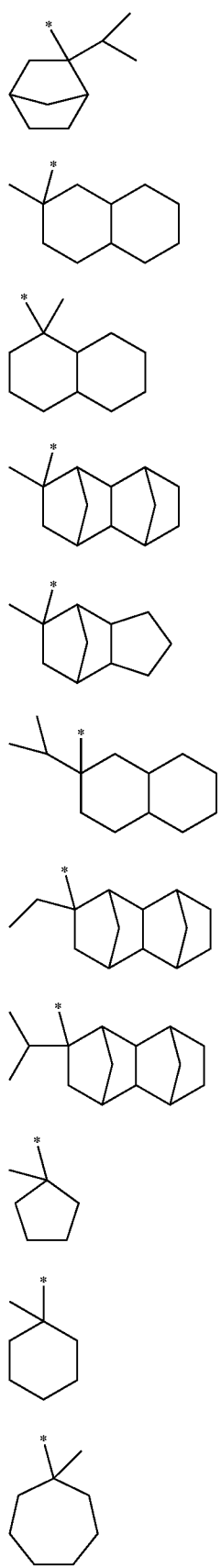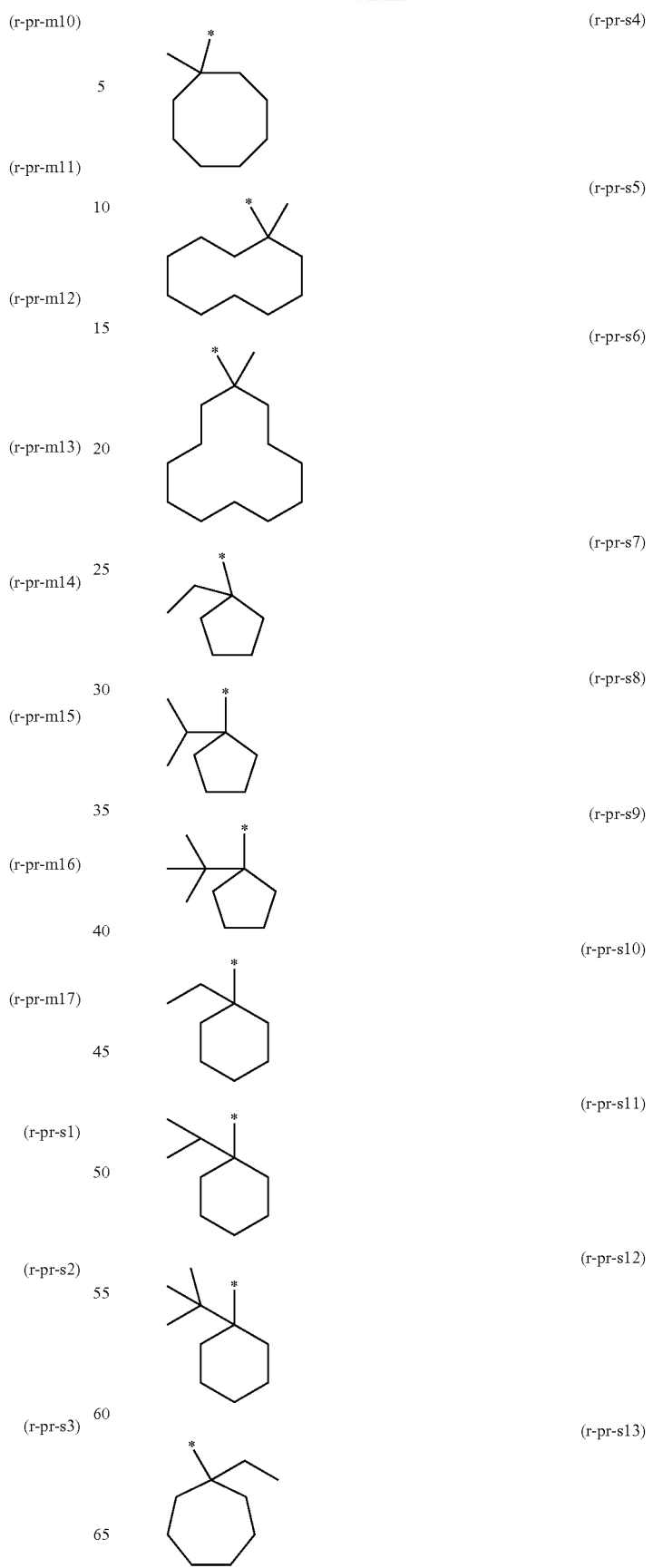

-continued
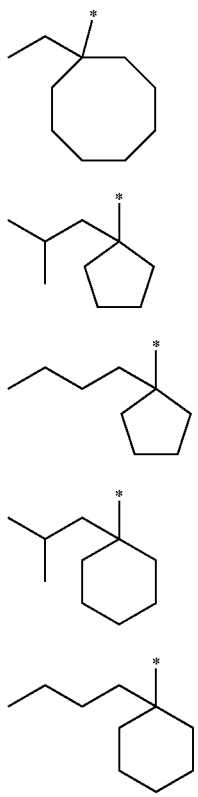
(r-pr-s14)
(r-pr-s15)
(r-pr-s16)
(r-pr-s17)
(r-pr-s18)
Specific examples of the formula (a1-r2-2) are shown below.
[Chemical Formula 5]
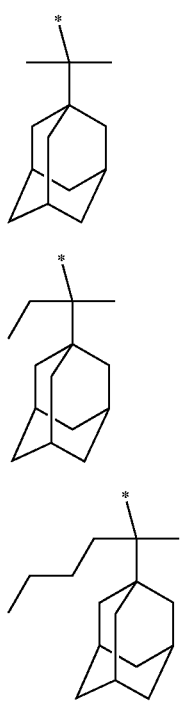
(r-pr-cm1)
(r-pr-cm2)
(r-pr-cm3)
-continued
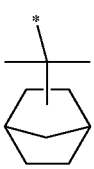
(r-pr-cm4)
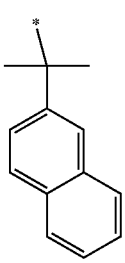
(r-pr-cm5)
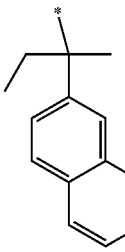
(r-pr-cm6)
(r-pr-cm7)
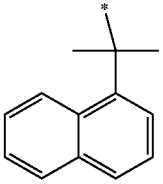
(r-pr-cm8)
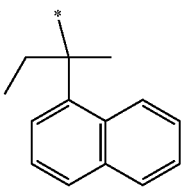
(r-pr-cs1)
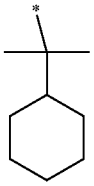
(r-pr-cs2)
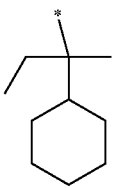

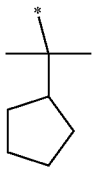
(r-pr-cs3)

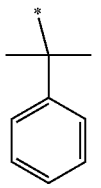
(r-pr-cs4)

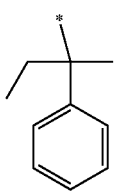
(r-pr-cs5)

(r-pr-c1)

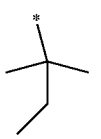
(r-pr-c2)

(r-pr-c3)

Specific examples of preferable structural units for the structural unit (a1) include structural units represented by general formula (a1-1) shown below.

[Chemical Formula 6]

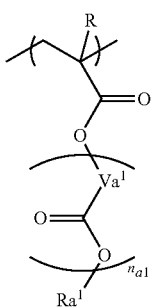
(a1-1)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; $n_{a1}$ each independently represents an integer of 0 to 2; $Ra^1$ represents an acid dissociable group represented by the aforementioned formula (a1-r-1) or (a1-r-2).

In formula (a1-1) above, the alkyl group of 1 to 5 carbon atoms is preferably a linear or branched alkyl group, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The divalent hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); a group in which one hydrogen atom has been removed from the aforementioned aromatic hydrocarbon ring (aryl group) and one hydrogen atom thereof has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group); and a group in which two hydrogen atoms have been removed from an aromatic compound containing 2 or more aromatic rings (e.g., biphenyl, fluorene or the like) The alkylene group (alkyl chain within the arylalkyl group) preferably has 1 to 4 carbon atom, more preferably 1 or 2, and most preferably 1.

Specific examples of the structural unit (a1-1) are shown below. In the formulae shown below, Ra represents a hydrogen atom, a methyl group or a trifluoromethyl group.

[Chemical Formula 7]

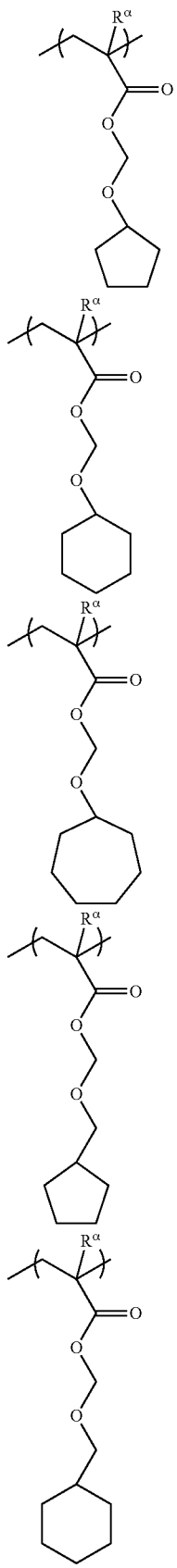

-continued
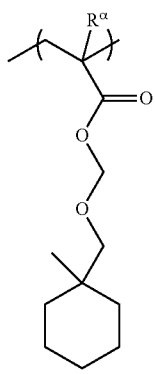
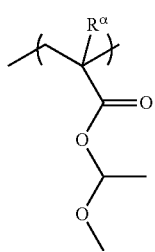
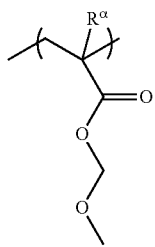
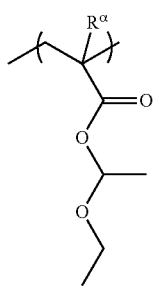
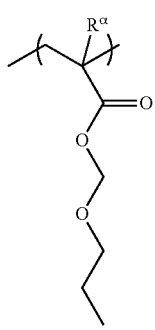
-continued
[Chemical Formula 8]
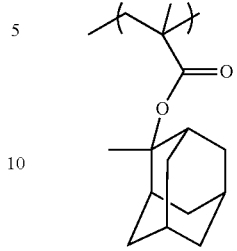
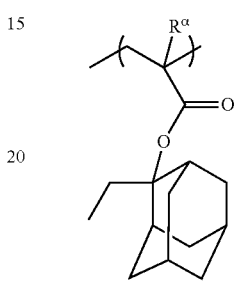
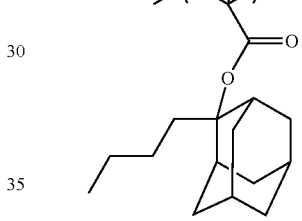
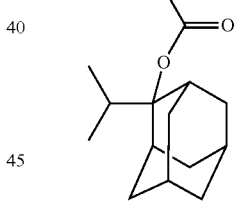
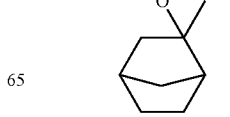

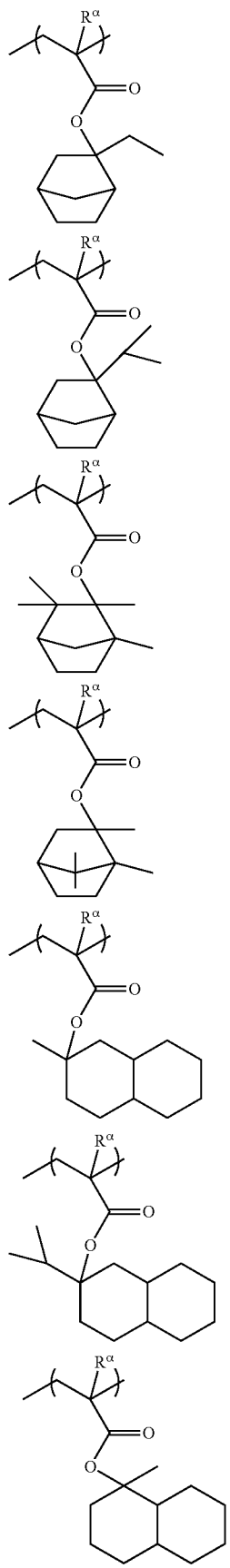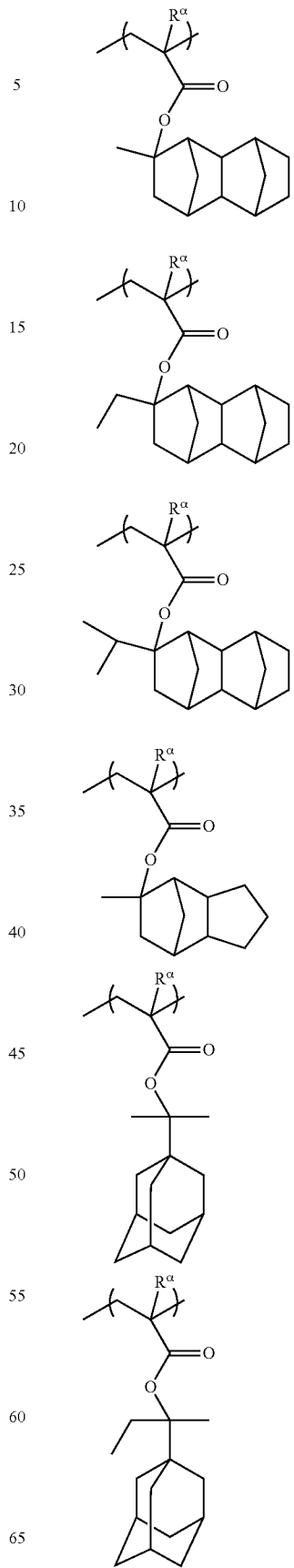

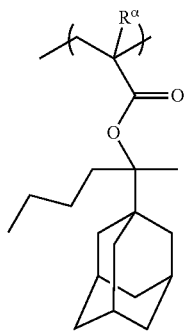
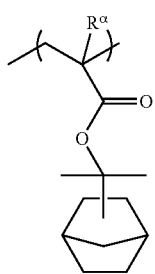
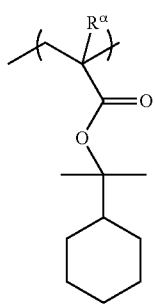
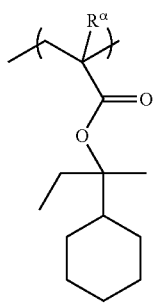
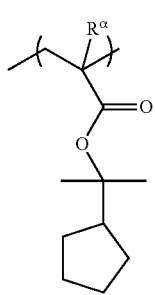
[Chemical Formula 9]
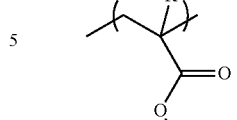
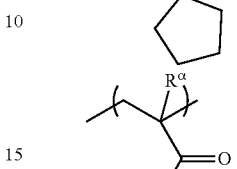
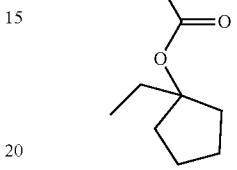
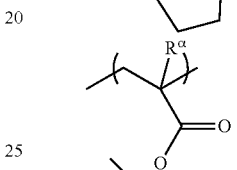
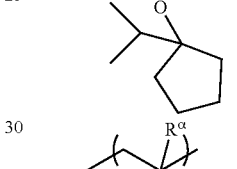
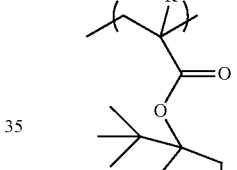
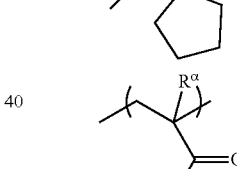
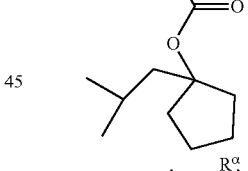
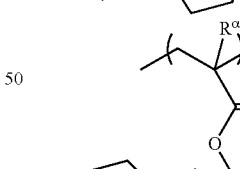
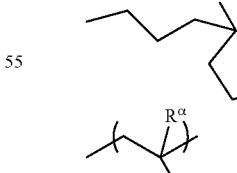
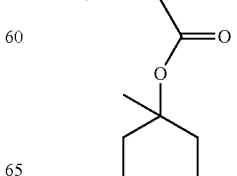

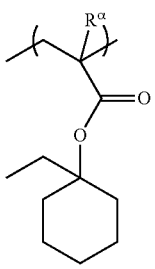

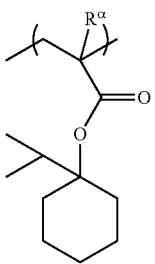

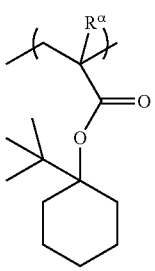

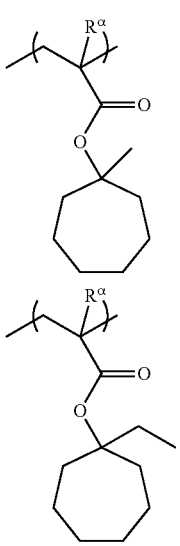

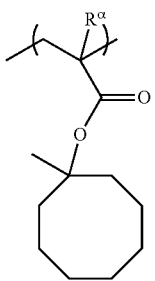

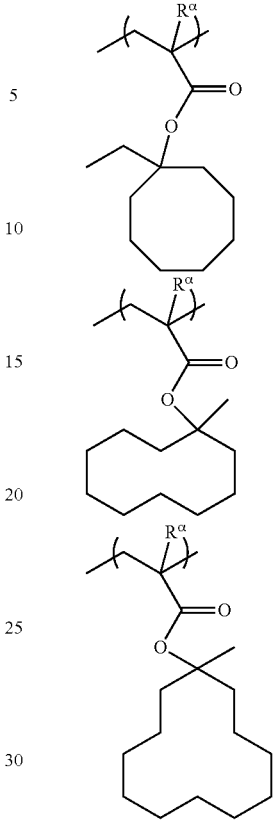

As the structural unit (a1) contained in the component (P1), 1 kind of structural unit may be used, or 2 or more kinds of structural units may be used.

In the component (P1), the amount of the structural unit (a1) based on the combined total (100 mol %) of all structural units constituting the component (P1) is preferably 5 to 99 mol %, more preferably 10 to 80 mol %, and still more preferably 15 to 60 mol %.

When the amount of the structural unit (a1) is at least as large as the lower limit of the above-mentioned range, a resist pattern can be reliably obtained, and various lithography properties such as resolution are further improved. On the other hand, when the amount of the structural unit (a1) is no more than the upper limit of the above-mentioned range, a good balance can be achieved with the other structural units.

—Structural Unit (a0)

The structural unit (a0) is represented by general formula (a0-0) shown below.

[Chemical Formula 10]

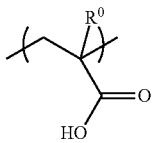

(a0-0)

In the formula, $R^0$ represents a hydrogen atom, an alkyl group of 1 to 5 carbon atoms or a halogenated alkyl group of 1 to 5 carbon atoms.

In formula (a0-0), $R^0$ represents a hydrogen atom, an alkyl group of 1 to 5 carbon atoms or a halogenated alkyl group of 1 to 5 carbon atoms.

As the alkyl group of 1 to 5 carbon atoms for $R^0$, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As $R^0$, a hydrogen atom, an alkyl group of 1 to 5 carbon atoms or a fluorinated alkyl group of 1 to 5 carbon atoms is preferable, and in terms of industrial availability, a hydrogen atom or a methyl group, i.e., acrylic acid or methacrylic acid is more preferable.

As the structural unit (a0) contained in the component (P1), 1 kind of structural unit may be used, or 2 or more kinds of structural units may be used.

In the component (P1), the amount of the structural unit (a0) based on the combined total (100 mol %) of all structural units constituting the component (P1) is preferably 1 to 40 mol %, more preferably 5 to 30 mol %, and still more preferably 10 to 25 mol %.

When the amount of the structural unit (a0) is at least as large as the lower limit of the above-mentioned range, various properties such as sensitivity, and reduction of residue are improved. On the other hand, when the amount of the structural unit (a0) is no more than the upper limit of the above-mentioned range, a good balance can be achieved with the other structural units.

—Other Structural Units

If desired, the component (P1) may include, in addition to the structural units (a0) and (a1), any other structural unit.

Examples of the other structural unit include a structural unit derived from a polymerizable compound having an ether bond.

Examples of the polymerizable compound having an ether bond include radical polymerizable compounds such as a (meth) acrylic acid derivative having an ether bond and an ester bond, and specific examples include 2-methoxyethyl (meth)acrylate, 2-ethoxyethyl (meth)acrylate, methoxytriethyleneglycol (meth)acrylate, 3-methoxybutyl (meth)acrylate, ethylcarbitol (meth)acrylate, phenoxypolyethyleneglycol (meth)acrylate, methoxypolypropyleneglycol (meth)acrylate, and tetrahydrofurfuryl (meth)acrylate.

The polymerizable compound having an ether bond is preferably 2-methoxyethyl (meth)acrylate, 2-ethoxyethyl (meth)acrylate, or methoxytriethyleneglycol (meth)acrylate. These polymerizable compounds may be used alone, or in a combination of two or more.

For appropriately controlling the physical or chemical properties, the component (P1) may further include a structural unit derived from another polymerizable compound. Examples of such polymerizable compounds include known radical polymerizable compounds and anionic polymerizable compounds.

Examples of such polymerizable compounds include monocarboxylic acids such as crotonic acid; dicarboxylic acids such as maleic acid, fumaric acid, and itaconic acid; 2-methacryloyloxyethyl succinic acid, 2-methacryloyloxyethyl maleic acid, 2-methacryloyloxyethyl phthalic acid, 2-methacryloyloxyethyl hexahydrophthalic acid and other methacrylic acid derivatives having a carboxyl group and an ester bond; acrylic acid alkyl esters such as methyl (meth) acrylate, ethyl (meth)acrylate, and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate, benzyl (meth) acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and polymerizable compounds containing amide bonds such as acrylamide and methacrylamide.

If desired, the base component (P1) may further include a structural unit (a4) containing an acid non-dissociable cyclic group. When the component (A1) includes the structural unit (a4), dry etching resistance, thermal resistance or plating resistance of the resist pattern to be formed is improved.

An "acid non-dissociable, aliphatic cyclic group" in the structural unit (a4) refers to a cyclic group which is not dissociated by the action of acid generated upon exposure, and remains in the structural unit.

As the structural unit (a4), a structural unit which contains a non-acid-dissociable aliphatic cyclic group, and is also derived from an acrylate ester is preferable. As the cyclic group, any of the multitude of conventional polycyclic groups used within the resin component of resist compositions may be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 11]

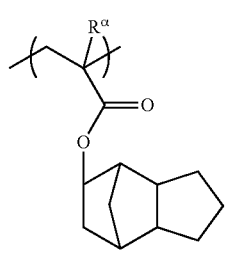

(a4-1)

-continued

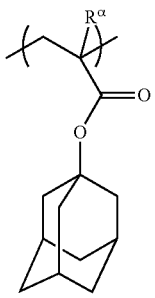
(a4-2)

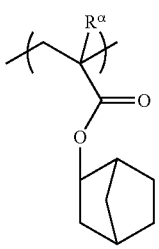
(a4-3)

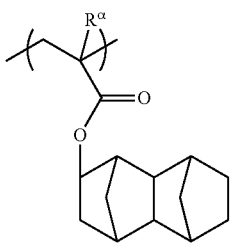
(a4-4)

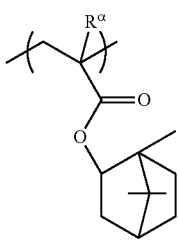
(a4-5)

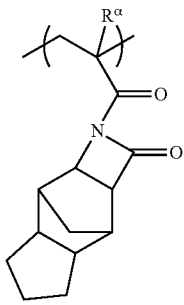
(a4-6)

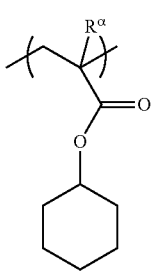
(a4-7)

In the formulae, Ra is the same as defined above.

As the structural unit (a4) contained in the component (P1), 1 kind of structural unit may be used, or 2 or more kinds of structural units may be used.

In the resist composition of the present embodiment, the resin component (P1) is a polymeric compound having the structural unit (a1) and the structural unit (a0).

Preferable examples of the component (P1) include a polymeric compound having a structural unit (a1), a structural unit (a0) and a structural unit derived from a polymerizable compound having an ether bond; a polymeric compound having a structural unit (a1), a structural unit (a0) and a structural unit derived from a (meth)acrylic alkylester; and polymeric compound having a structural unit (a1), a structural unit (a0), a structural unit derived from a polymerizable compound having an ether bond, and a structural unit derived from a (meth)acrylic alkylester.

The weight average molecular weight (Mw) (the polystyrene equivalent value determined by gel permeation chromatography (GPC)) of the component (P1) is not particularly limited, but is preferably 5,000 to 500,000, more preferably 10,000 to 400,000, and still more preferably 20,000 to 300,000.

When the Mw of the component (P1) is no more than the upper limit of the above-mentioned preferable range, the resist composition exhibits a satisfactory solubility in a resist solvent. On the other hand, when the Mw of the component (P1) is at least as large as the lower limit of the above-mentioned preferable range, dry etching resistance and plating resistance becomes satisfactory.

The polydispersity (Mw/Mn) of the component (P1) is not particularly limited, but is preferably 1.0 to 20.0, more preferably 1.0 to 15.0, and still more preferably 1.1 to 13.5. Here, Mn is the number average molecular weight.

<<Second Resin Component (P2)>>

In the present embodiment, as the second resin component (P2) (component (P2)), a polymeric compound (p20) having a structural unit (u0) containing a phenolic hydroxy group.

Preferable examples of the polymeric compound (p20) include at least one member selected from the group consisting of a phenolic novolak resin (p21) and a polyhydroxystyrene resin (p22).

Phenolic Novolak Resin (p21):

As the phenolic novolak resin (p21) (component (p21)), for example, a resin obtainable by subjecting an aromatic compound having a phenolic hydroxy group (a phenol) and an aldehyde to an addition condensation in the presence of an acidic catalyst may be used.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglicinol, hydroxydiphenyl, bisphenol A, gallic acid, gallic acid ester, α-naphthol, and 3-naphthol.

Examples of aldehydes include formaldehyde, furfural, benzaldehyde, nitrobenzaldehyde, and acetaldehyde.

The acid catalyst used in the addition condensation reaction is not particularly limited, and examples thereof include hydrochloric acid, nitric acid, sulfuric acid, formic acid, oxalic acid, and acetic acid.

Among the above examples, as the component (p21), a resin having a structural unit represented by general formula (u21-0) shown below is preferable.

[Chemical Formula 12]

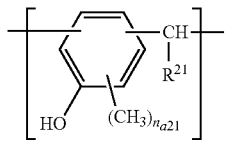
(u21-0)

In the formula, $R^{21}$ is a hydrogen atom or an organic group; and $n_{a21}$ represents an integer of 1 to 3.

In formula (u21-0), $R^{21}$ represents a hydrogen atom or an organic group. The organic group for $R^{21}$ is derived from the aldehyde used in the addition condensation. Among these examples, as $R^{21}$, a hydrogen atom (derived from formaldehyde) is preferable.

$n_{a21}$ is an integer of 1 to 3, preferably 1 or 3, and more preferably 1.

The weight average molecular weight of component (p21) is preferably 1,000 to 50,000.

Polyhydroxystyrene Resin (p22):

As the polyhydroxystyrene resin (p22) (component (p22)), for example, a resin having a structural unit represented by general formula (u22-0) shown below may be preferably used.

[Chemical Formula 13]

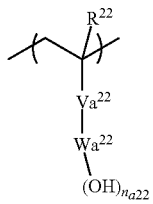
(u22-0)

In the formula, $R^{22}$ represents a hydrogen atom, an alkyl group of 1 to 5 carbon atoms or a halogenated alkyl group of 1 to 5 carbon atoms; $Va^{22}$ represents a divalent linking group or a single bond; $Wa^{22}$ represents an aromatic hydrocarbon group having a valency of $(n_{a22}+1)$; and $n_{a22}$ represents an integer of 1 to 3.

In formula (u22-0), as the alkyl group of 1 to 5 carbon atoms for $R^{22}$, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by $R^{22}$ is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As $R^{22}$, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (u22-0), preferable examples of the divalent linking group for $Va^{22}$ include a divalent hydrocarbon group which may have a substituent and a divalent linking group containing a hetero atom.

—Divalent Hydrocarbon Group which May have a Substituent:

In the case where $Va^{22}$ is a divalent linking group which may have a substituent, the hydrocarbon group may be either an aliphatic hydrocarbon group or an aromatic hydrocarbon group.

—Aliphatic Hydrocarbon Group for $Va^{22}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

—Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

—Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

—Aromatic Hydrocarbon Group for Va$^{22}$

The aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

—Divalent Linking Group Containing a Hetero Atom

In the case where Va$^{22}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (may be substituted with a substituent such as an alkyl group, an acyl group or the like), —S—, —S(=O)$_2$—, —S(=O)$_2$—O—, and a group represented by general formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m' represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$-$Y^{22}$—, m'' represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$-$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Va$^{22}$ preferably represents an ester bond [—C(=O)—O—], an ether bond (—O—), —C(=O)—NH—, a linear or branched alkylene group, a combination of these, or a single bond, and more preferably a single bond.

In formula (u22-0), examples of the aromatic hydrocarbon group for Wa$^{22}$ include a group obtained by removing ($n_{a22}$+1) hydrogen atoms from an aromatic ring. The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

In formula (u22-0), $n_{a22}$ is an integer of 1 to 3, preferably 1 or 2, and more preferably 1.

Specific examples of the structural unit represented by general formula (u22-0) are shown below.

In the following formulae, R$^\alpha$ represents a hydrogen atom, a methyl group or a trifluoromethyl group.

[Chemical Formula 14]

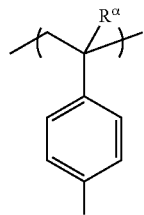
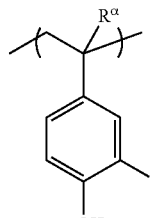
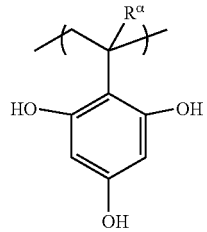
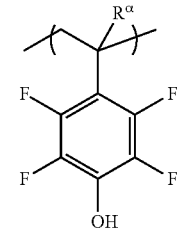

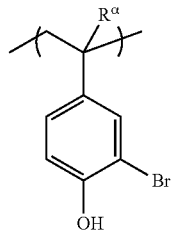
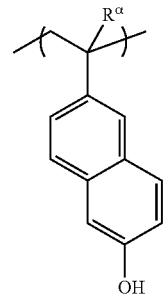
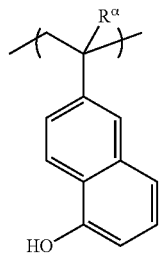
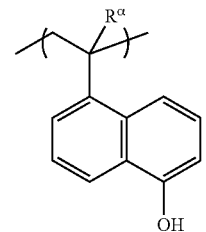
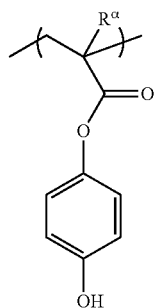
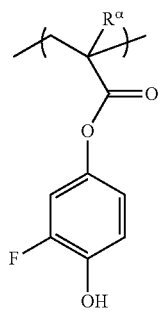
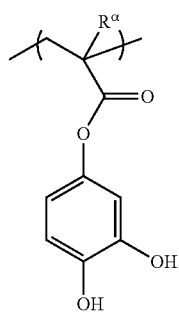
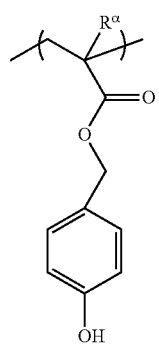
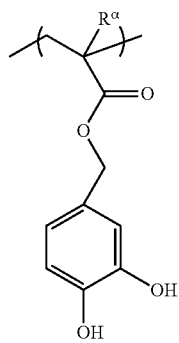
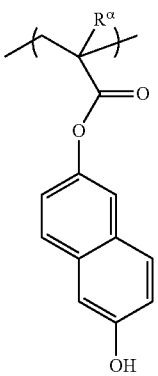

-continued

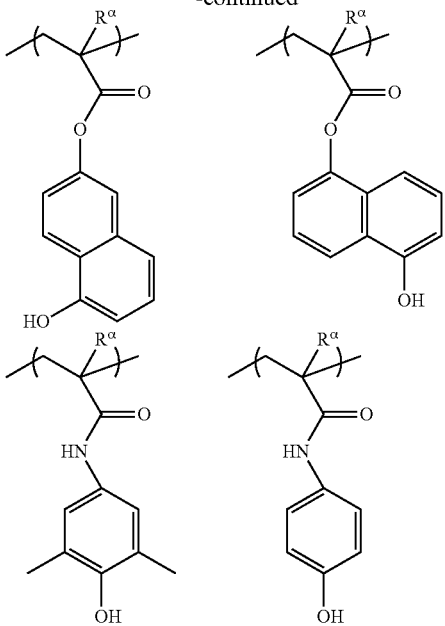

As the structural unit represented by general formula (u22-0) contained in the component (P22), 1 kind of structural unit may be used, or 2 or more kinds of structural units may be used.

In the component (p22), the amount of the structural unit represented by general formula (u22-0), based on the combined total (100 mol %) of all structural units constituting the component (p22) is preferably 40 to 100 mol %, more preferably 50 to 100 mol %, and still more preferably 60 to 100 mol %.

When the amount of the structural unit represented by general formula (u22-0) is within the above-mentioned preferable range, various properties such as sensitivity, and reduction of residue may be improved.

The component (p22) may include, in addition to the structural unit represented by general formula (u22-0), any other structural unit derived from a polymerizable compound such as styrene. Examples of such polymerizable compound include styrene, chlorostyrene, chloromethylstyrene, vinyltoluene, α-methylstyrene; and (meth)acrylic acid esters, such as methyl (meth)acrylate, ethyl (meth)acrylate, and butyl (meth)acrylate.

The weight average molecular weight of component (p22) is preferably 1,000 to 50,000.

In the resist composition used in the method of forming a resist pattern according to the present embodiment, the component (P) may contain a resin other than the component (P1) and the component (P2).

As described above, the resin component (component (P)) used in the resist composition according to the present embodiment contains a first resin component (P1) and a second resin component (P2).

In the case where the first resin component (P1) is a polymeric compound (p10) including a structural unit (a1) derived from an acrylate ester containing an acid decomposable group that exhibits increased polarity by the action of acid, the acrylate ester optionally having the hydrogen atom bonded to the carbon atom on the α-position substituted with a substituent, and a structural unit (a0) derived from acrylic acid optionally having the hydrogen atom bonded to the carbon atom on the α-position substituted with a substituent, the second resin component (P2) is a polymeric compound (p20) including a structural unit (u0) containing a phenolic hydroxy group, when the dissolution rate of the first resin component (P1) in an alkali developing solution is defined $DR_{P1}$, the dissolution rate of the second resin component (P2) in an alkali developing solution is defined $DR_{P2}$, and the dissolution rate of a mixed resin of the first resin component (P1) and the second resin component (P2) is defined $DR_{MIX}$, $DR_{MIX} < DR_{P1}$ and $DR_{MIX} < DR_{P2}$ the following relationship is preferably satisfied.

The amount of the component (P1) contained in the resist composition may be appropriately selected depending on the kind of resin. For example, the amount of the resin (P1), relative to 100 parts by weight of the total of the component (P1) and the component (P2) is preferably 10 to 70 parts by weight, more preferably 20 to 50 parts by weight, and still more preferably 30 to 40 parts by weight.

When the amount of the component (P1) is within the above-mentioned preferable range, in the formation of a resist pattern, film thickness loss by development may be suppressed, and residue is unlikely to be generated.

Further, when the polymeric compound (p10) is conventionally used alone as a resist composition, the polymer compound (p10) may have a dissolution rate in an alkali developing solution that is difficult to be solubilized in an unexposed portion.

Specifically, the dissolution rate of the polymeric compound (p10) in an alkali developing solution is preferably 10 nm/second or more, and more preferably 10 to 100 nm/second. When the dissolution rate of the component (p10) in an alkali developing solution is at least as large as the lower limit of the above-mentioned preferable range, the dissolution rate in exposed portions after exposure may be further enhanced. As a result, residue is unlikely to be generated, and sensitivity may be further improved.

Further, the dissolution rate of the polymeric compound (p20) in an alkali developing solution is preferably 5 nm/second or more, and more preferably 5 to 200 nm/second. When the dissolution rate of the component (p20) in an alkali developing solution is at least as large as the lower limit of the above-mentioned preferable range, residue is unlikely to be generated, and sensitivity may be further improved.

Furthermore, the dissolution rate $DR_{MIX}$ of a mixed resin of the component (P1) and the component (P2) in an alkali developing solution is preferably more than 0 nm/second and 35 nm/second or less, more preferably 0 nm/second and 20 nm/second or less, and still more preferably more than 0 nm/second and 10 nm/second or less.

When the dissolution rate $DR_{MIX}$ of the mixed resin in an alkali developing solution is within the above-mentioned preferable range, film thickness loss by development may be suppressed, and a pattern may be formed with satisfactory film retention ratio.

<<Component (B): Acid-Generator Component>>

As the component (B), there is no particular limitation, and any of the known acid generators used in conventional chemically amplified resist compositions may be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

Examples of onium salt acid generators include an onium salt having an organic cation represented by any one of general formulae (ca-1) to (ca-5) shown below as the cation moiety.

[Chemical Formula 15]

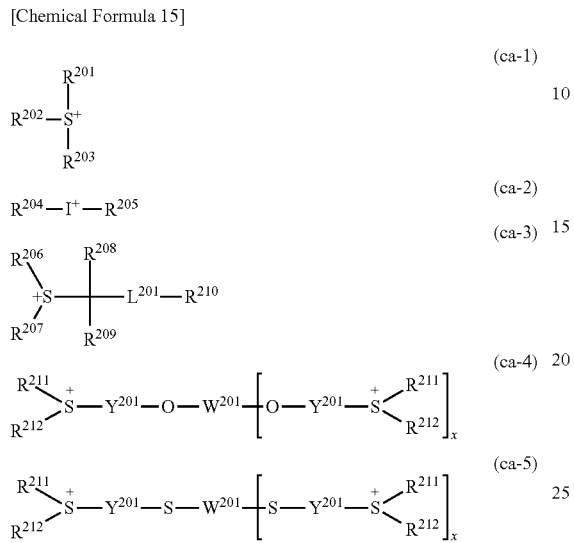

In the formulae, $R^{201}$ to $R^{207}$, $R^{211}$ and $R^{212}$ each independently represents an aryl group which may have a substituent, a heteroaryl group which may have a substituent, an alkyl group which may have a substituent, or an alkenyl group which may have a substituent. $R^{201}$ to $R^{203}$, $R^{206}$ and $R^{207}$, and $R^{211}$ and $R^{212}$ may be mutually bonded to form a ring with the sulfur atom. $R^{208}$ and $R^{209}$ each independently represents a hydrogen atom or an alkyl group of 1 to 5 carbon atoms. $R^{210}$ represents an aryl group which may have a substituent, an alkyl group which may have a substituent, an alkenyl group which may have a substituent, or an —SO$_2$— containing cyclic group which may have a substituent. $L^{201}$ represents —C(=O)— or —C(=O)—O—. Each $Y^{201}$ independently represents an arylene group, an alkylene group or an alkenylene group. x represents 1 or 2. $W^{201}$ represents an (x+1) valent linking group.

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

As the heteroaryl group for $R^{201}$ to $R^{207}$, $R^{211}$ and $R^{212}$, a group in which part of the carbon atoms constituting the aforementioned aryl group has been substituted with a hetero atom may be mentioned.

Examples of the hetero atom include an oxygen atom, a sulfur atom and a nitrogen atom. Examples of the heteroaryl group include a group in which 1 hydrogen atom has been removed from 9H-thioxanthene. Examples of the substituted heteroaryl group include a group in which 1 hydrogen atom has been removed from 9H-thioxanthen-9-one.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an oxo group (=O), an aryl group, and groups represented by formulae (ca-r-1) to (ca-r-10) shown below.

[Chemical Formula 16]

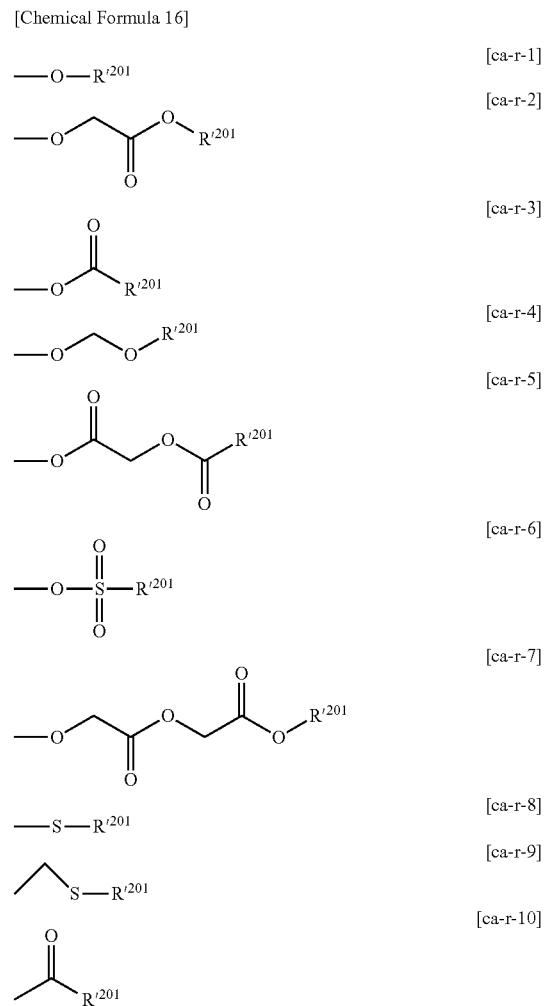

In the formulae, each $R'^{201}$ independently represents a hydrogen atom, a cyclic group which may have a substituent, a chain-like alkyl group which may have a substituent, or a chain-like alkenyl group which may have a substituent.

In formulae (ca-r-1) to (ca-r-10), $R'^{201}$ each independently represents a hydrogen atom, a cyclic group which may have a substituent, a chain alkyl group which may have a substituent or a chain alkenyl group which may have a substituent.

Cyclic group which may have a substituent:

The cyclic group is preferably a cyclic hydrocarbon group, and the cyclic hydrocarbon group may be either an aromatic hydrocarbon group or a cyclic aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R'^{201}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Specific examples of the aromatic ring contained in the aromatic hydrocarbon group for $R'^{201}$ include benzene, fluorene, naphthalene, anthracene, phenanthrene, biphenyl, an aromatic hetero ring in which part of the carbon atoms constituting any of these aromatic rings have been substituted with a hetero atom, or a ring in which part of the hydrogen atoms constituting any of these aromatic rings or aromatic hetero rings have been substituted with an oxo group or the like. Examples of the hetero atom within the aromatic hetero rings include an oxygen atom, a sulfur atom and a nitrogen atom.

Specific examples of the aromatic hydrocarbon group for $R'^{201}$ include a group in which 1 hydrogen atom has been removed from an aromatic ring (an aryl group, such as a phenyl group, a naphthyl group or an anthracenyl group), a group in which 1 hydrogen atom of the aforementioned aromatic ring has been substituted with an alkylene group (an arylalkyl group, such as a benzyl group, a phenethyl group, a 1-naphthylmethyl group, a 2-naphthylmethyl group, a 1-naphthylethyl group or a 2-naphthylethyl group), a group in which 1 hydrogen atom has been removed from a ring in which part of the hydrogen atoms constituting the aforementioned aromatic ring has been substituted with an oxo group or the like (such as anthraquinone), and a group in which 1 hydrogen atom has been removed from an aromatic hetero ring (such as 9H-thioxanthene or 9H-thioxanthen-9-one). The alkylene group (alkyl chain within the arylalkyl group) preferably has 1 to 4 carbon atom, more preferably 1 or 2, and most preferably 1.

Examples of the cyclic aliphatic hydrocarbon group for $R'^{201}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclodpdecane, and a polycycloalkane having a condensed ring polycyclic skeleton, such as a cyclic group having a steroid skeleton are preferable.

Among these examples, as the cyclic aliphatic hydrocarbon group for $R'^{201}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

Chain alkyl group which may have a substituent:

The chain alkyl group for $R'^{201}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain alkenyl group which may have a substituent:

The chain-like alkenyl group for $R'^{201}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the cyclic group, chain-like alkyl group or alkenyl group for $R'^{201}$, an alkoxy group, a halogen atom, a halogenated alkyl group, a hydroxyl group, a carbonyl group, a nitro group, an amino group, an oxo group, a cyclic group for $R'^{201}$ an alkylcarbonyl group, a thienylcarbonyl group or the like may be used.

Among these examples, as $R'^{201}$, a cyclic group which may have a substituent or a chain alkyl group which may have a substituent is preferable.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

In formula (ca-3), $R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

In formula (ca-3), $R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

In formulae (ca-4) and (ca-5), each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R'^{201}$.

Examples of the alkylene group and alkenylene group for $Y^{201}$ include groups in which one hydrogen atom has been removed from the chain alkyl group or the chain alkenyl group given as an example of $R'^{201}$.

In formulae (ca-4) and (ca-5), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups (which may have a substituent) as those described above for $Va^{22}$ in the aforementioned formula (u22-0) may be mentioned. The divalent linking group for $W^{201}$ may be linear, branched or cyclic, and cyclic is more preferable. Among these examples, an arylene group having two carbonyl groups, each bonded to the terminal thereof, or a group constituted of only an arylene group is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-24) shown below.

[Chemical Formula 17]

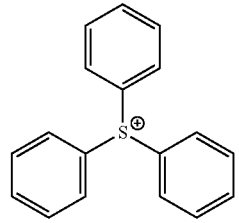

(ca-1-1)

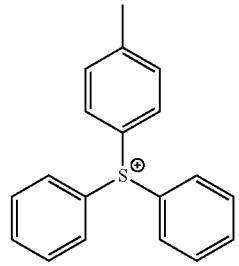

(ca-1-2)

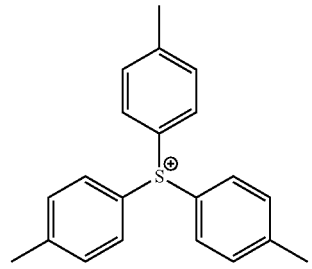

(ca-1-3)

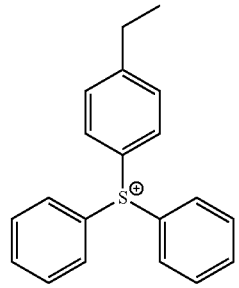

(ca-1-4)

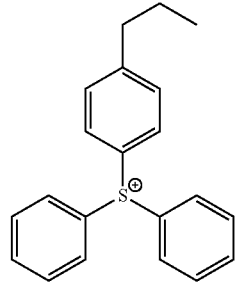

(ca-1-5)

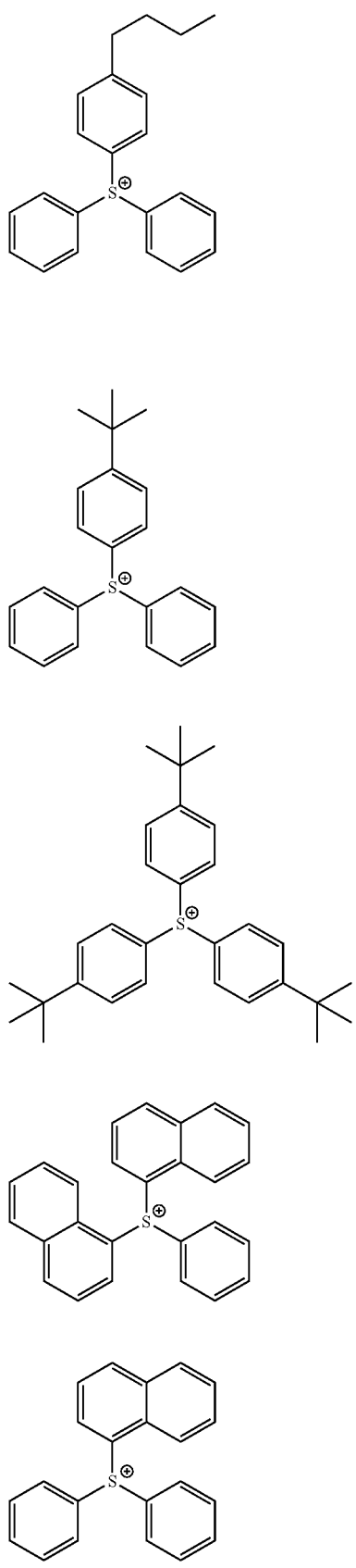
(ca-1-6)
(ca-1-7)
(ca-1-8)
(ca-1-9)
(ca-1-10)
[Chemical Formula 18]
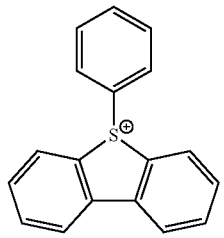
(ca-1-11)
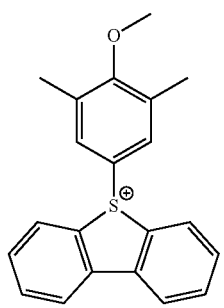
(ca-1-12)
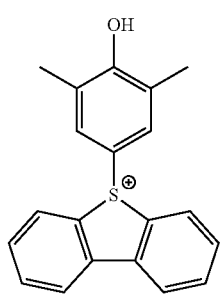
(ca-1-13)
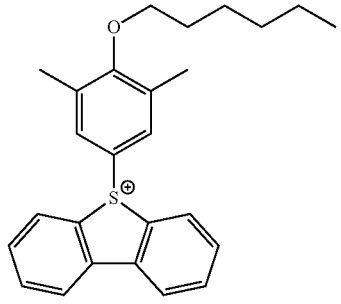
(ca-1-14)
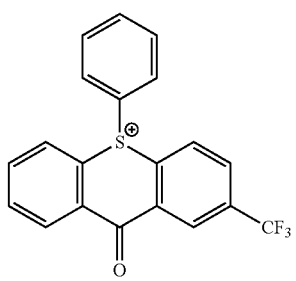
(ca-1-15)

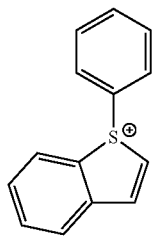 (ca-1-16)
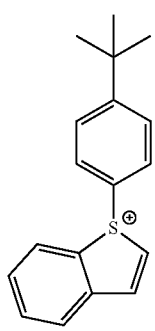 (ca-1-17)
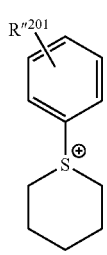 (ca-1-18)
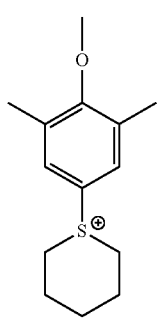 (ca-1-19)
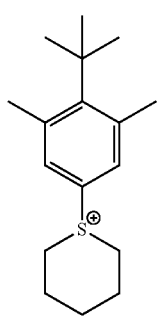 (ca-1-20)
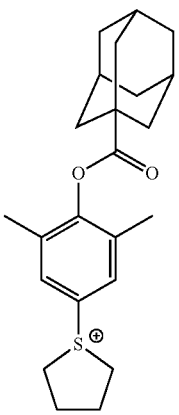 (ca-1-21)
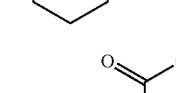 (ca-1-22)
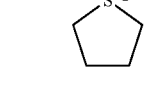 (ca-1-23)
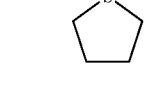 (ca-1-24)
In the formulae, $R''^{201}$ represents a hydrogen atom or a substituent. As the substituent, the same groups as those described above for substituting $R^{201}$ to $R^{207}$, $R^{210}$ and $R^{212}$ may be mentioned.

Further, examples of preferable cations represented by formula (ca-1) include cations represented by formulae (ca-1-25) to (ca-1-35) shown below.
[Chemical Formula 19]
[Chemical Formula 20]
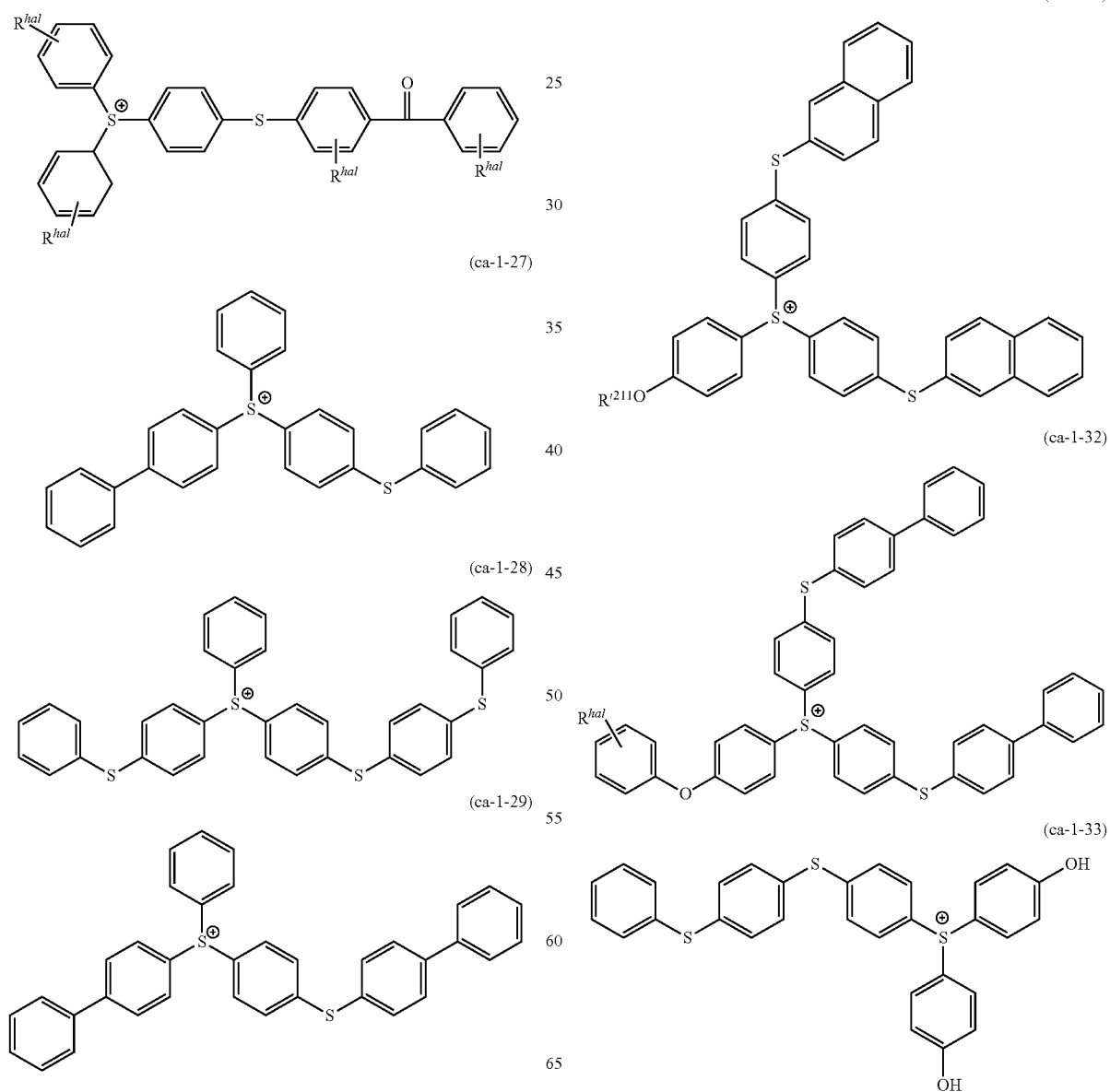

(ca-1-34)
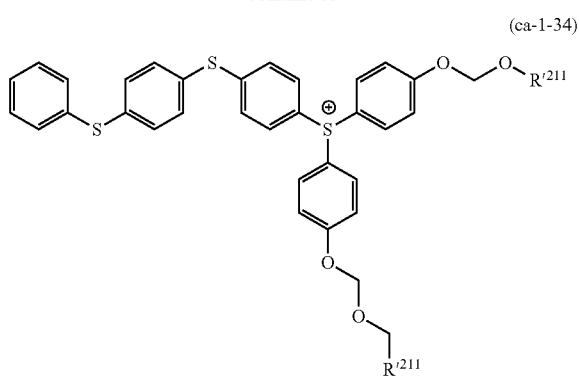
(ca-1-37)
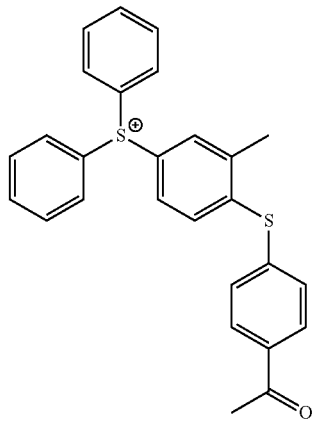
(ca-1-35)
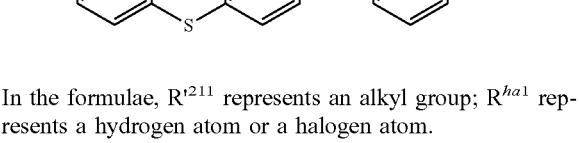
(ca-1-38)
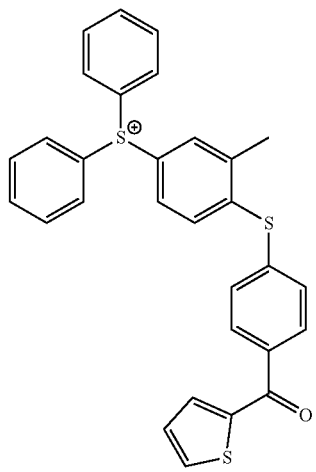
In the formulae, $R'^{211}$ represents an alkyl group; $R^{ha1}$ represents a hydrogen atom or a halogen atom.
Further, examples of preferable cations represented by formula (ca-1) include cations represented by formulae (ca-1-36) to (ca-1-46) shown below.
[Chemical Formula 21]
(ca-1-39)
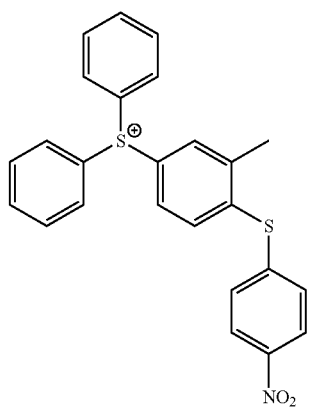
(ca-1-36)
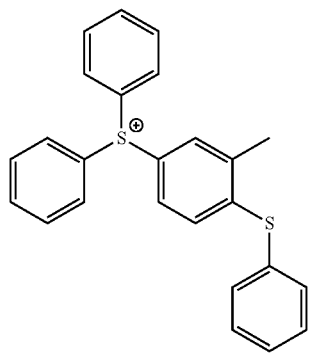
(ca-1-40)
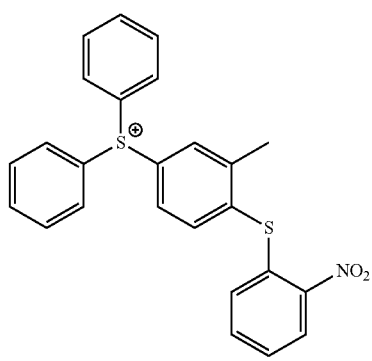

(ca-1-41)
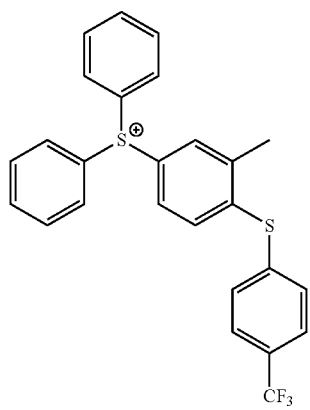
(ca-1-45)
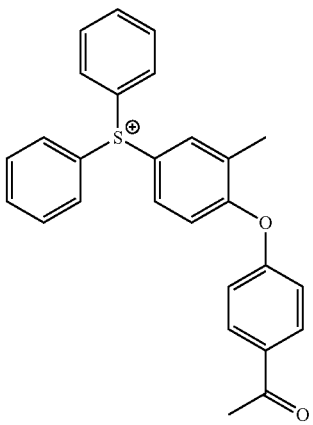
(ca-1-42)
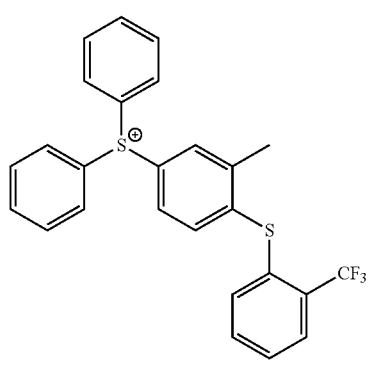
(ca-1-43)
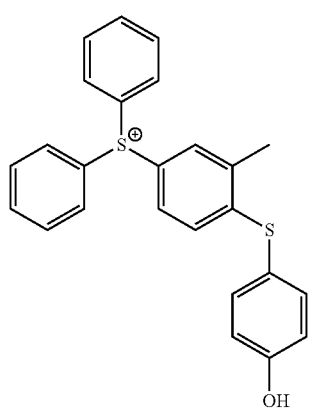
(ca-1-46)
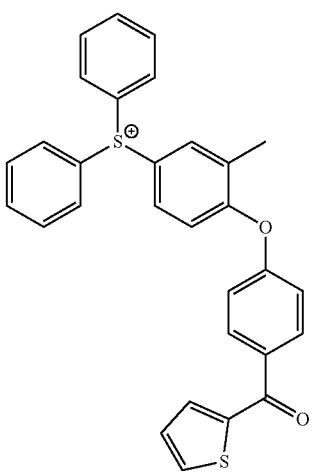
(ca-1-44)
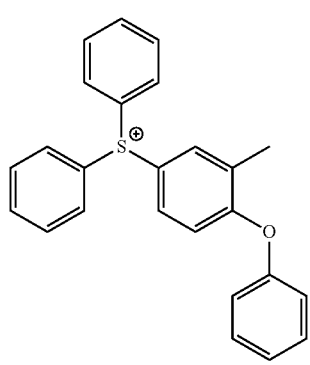
Specific examples of preferable cations represented by the formula (ca-2) include a dihphenyliodonium cation and a bis(4-tert-butylphenyl)iodonium cation.
Specific examples of preferable cations represented by formula (ca-4) include cations represented by formulae (ca-4-1) and (ca-4-2) shown below.

[Chemical Formula 22]
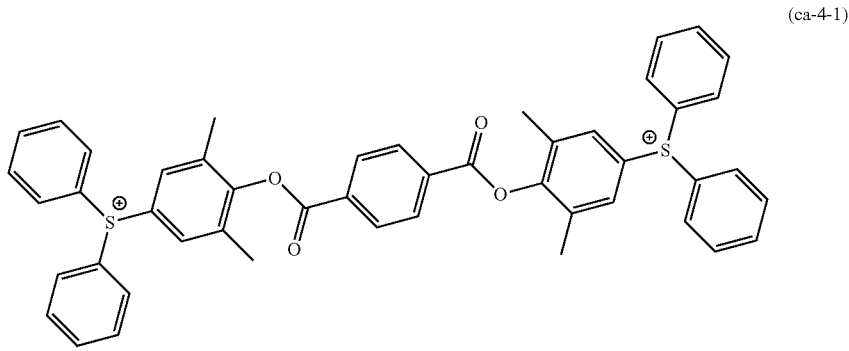
(ca-4-1)
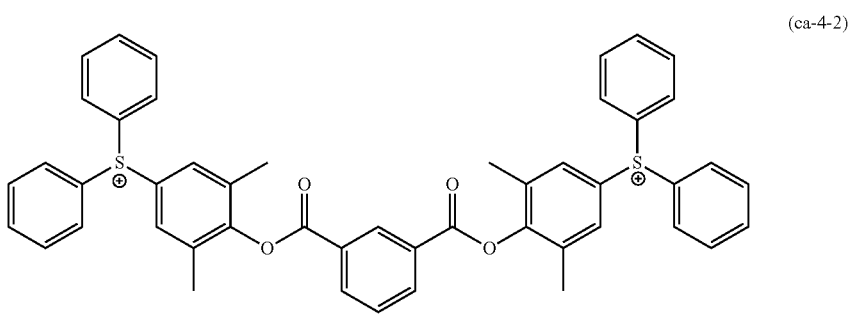
(ca-4-2)
Further, examples of preferable cations represented by formula (ca-5) include cations represented by formulae (ca-5-1) to (ca-5-3) shown below.
[Chemical Formula 23]
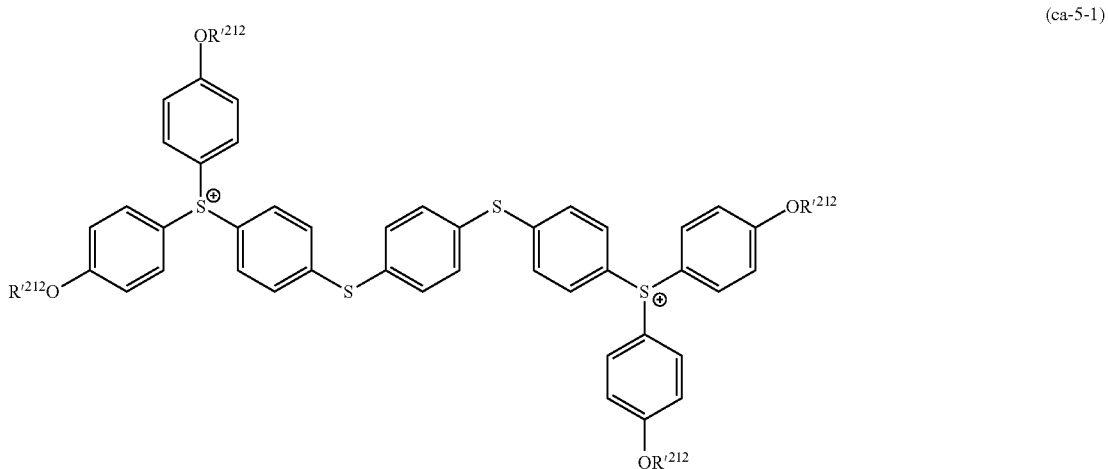
(ca-5-1)

(ca-5-2)

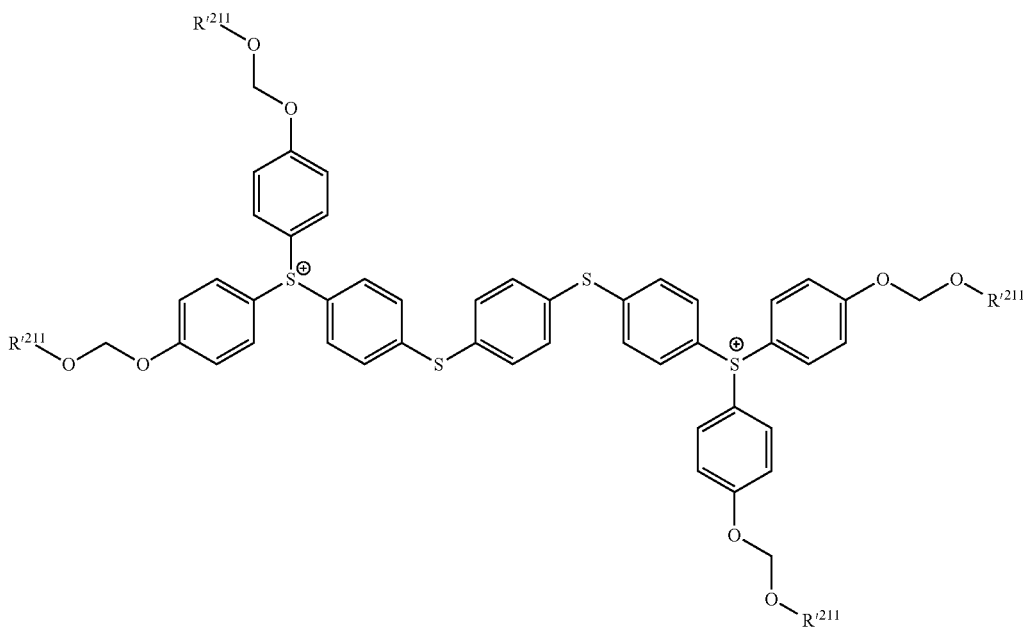

(ca-5-3)

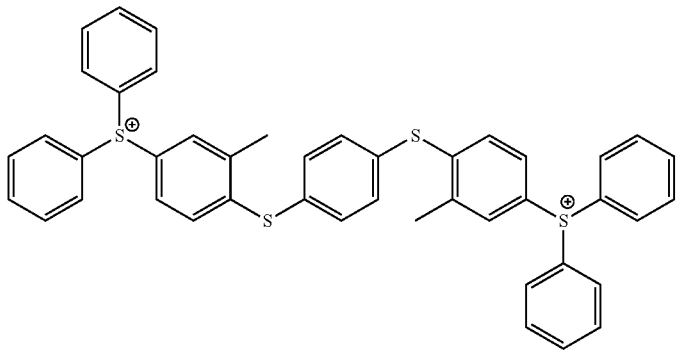

In the formulae, $R'^{212}$ represents an alkyl group or a hydrogen atom; and $R'^{211}$ represents an alkyl group.

Among these examples, as the cation moiety, a cation represented by general formula (ca-1) is preferable, and a cation represented by any of formulae (ca-1-1) to (ca-1-46) is more preferable.

Examples of the onium salt acid generator include an onium salt having an anion represented by general formula (b-an1) shown below, an anion represented by general formula (b-an2) shown below, or an anion represented by any one of general formulae (b-1) to (b-3) shown below.

[Chemical Formula 24]

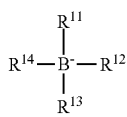
(b-an1)

In the formula, $R^{11}$ to $R^{14}$ each independently represents a fluorine atom, an alkyl group which may have a substituent, or an aryl group which may have a substituent.

In general formula (b-an1), the alkyl group for $R^{11}$ to $R^{14}$ is preferably an alkyl group of 1 to 20 carbon atoms, and the same chain-like or cyclic alkyl groups as those defined for $Ra^{t3}$ in the aforementioned formula (a1-r-1) may be mentioned.

The aryl group for $R^{11}$ to $R^{14}$ is preferably a phenyl group or a naphthyl group.

In the case where $R^{11}$ to $R^{14}$ represent an alkyl group or an aryl group, examples of the substituent include a halogen atom, a halogenated alkyl group, an alkyl group, an alkoxy group, an alkylthio group, a hydroxy group and a carbonyl group. Examples of the alkylthio group include an alkylthio group of 1 to 4 carbon atoms. Among these examples, a halogenated alkyl group, an alkyl group, an alkoxy group and an alkylthio group is preferable.

In general formula (b-an1), $R^{11}$ to $R^{14}$ is preferably a fluorine atom, a fluorinated alkyl group or a group represented by general formula (b-an1') shown below.

[Chemical Formula 25]

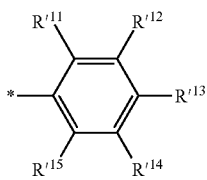

(b-an1′)

In the formula, $R'^{11}$ to $R'^{15}$ each independently represents a hydrogen atom, a fluorine atom, a trifluoromethyl group, an alkyl group of 1 to 4 carbon atoms, an alkoxy group of 1 to 4 carbon atoms or an alkylthio group of 1 to 4 carbon atoms.

In the general formula above, specific examples of the alkyl group of 1 to 4 carbon atoms include a methyl group, an ethyl group, an n-propyl group and an n-butyl group. Among these, a methyl group, an ethyl group or an n-butyl group is preferable, and a methyl group or an ethyl group is more preferable.

In the general formula above, specific examples of the alkoxy group of 1 to 4 carbon atoms include a methoxy group, an ethoxy group, an n-propoxy group, an iso-propoxy group, an n-butoxy group and a tert-butoxy group, and a methoxy group and an ethoxy group are more preferable.

In the general formula above, the alkylthio group of 1 to 4 carbon atoms is preferably a methylthio group, an ethylthio group, an n-propylthio group, an iso-propylthio group, an n-butylthio group or a tert-butylthio group, and more preferably a methylthio group or an ethylthio group.

Specific examples of the anion moiety represented by general formula (b-an1) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these examples, tetrakis(pentafluorophenyl)borate ($[B(C_6F_5)_4]^-$) is preferable.

The counteranion $X^-$ may be a halogen anion, a phosphoric acid anion, an antimonic acid anion ($SbF_6^-$), or an arsenic acid anion ($AsF_6^-$). Examples of the halogen atom include chlorine and bromine, and examples of the phosphate anion include $PF_6^-$ and an anion represented by general formula (b-an2) shown below.

[Chemical Formula 26]

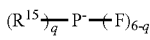

(b-an2)

In the formula, $R^{15}$ represents a fluorinated alkyl group of 1 to 8 carbon atoms; and q represents an integer of 1 to 6.

In general formula (b-an2), specific examples of the fluorinated alkyl group of 1 to 8 carbon atoms include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$ and $C(CF_3)_3$.

[Chemical Formula 27]

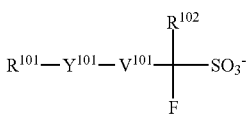

(b-1)

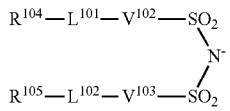

(b-2)

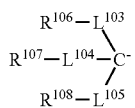

(b-3)

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; and $L^{103}$ to $L^{105}$ each independently represents a single bond, —CO— or —$SO_2$—.

{Anion Moiety}

—Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —$SO_2$—containing cyclic groups represented by the aforementioned formulas (a5-r-1) to (a5-r-4), substituted aryl groups represented by chemical formulae (r-ar-1) to (r-ar-8) shown below and monovalent heterocyclic groups represented by chemical formulae (r-hr-1) to (r-hr-16) shown below.

[Chemical Formula 28]
(r-ar-1) 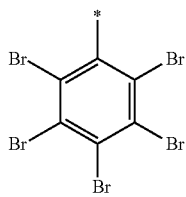
(r-ar-2) 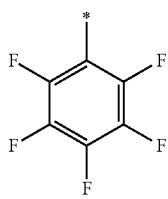
(r-ar-3) 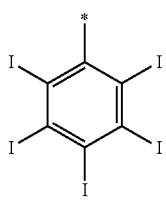
(r-ar-4) 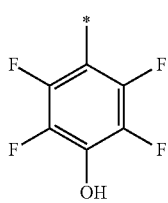
(r-ar-5) 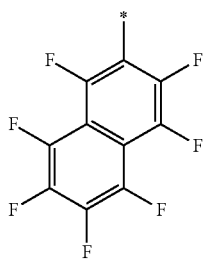
(r-ar-6) 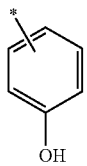
(r-ar-7) 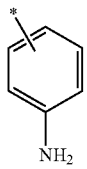
(r-ar-8) 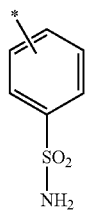
(r-hr-1) 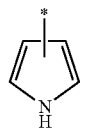
(r-hr-2) 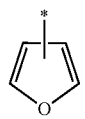
(r-hr-3) 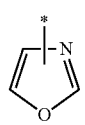
(r-hr-4) 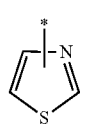
(r-hr-5) 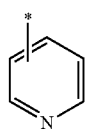
(r-hr-6) 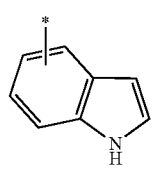
(r-hr-7) 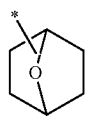
(r-hr-8) 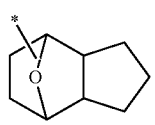
(r-hr-9) 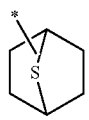
(r-hr-10) 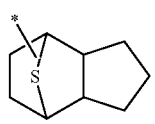

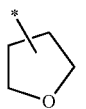 (r-hr-11)

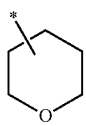 (r-hr-12)

 (r-hr-13)

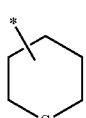 (r-hr-14)

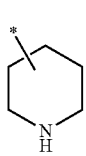 (r-hr-15)

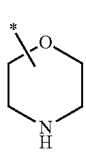 (r-hr-16)

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used.

Specific examples include groups represented by general formulae (a2-r-1) to (a2-r-7) shown below.

[Chemical Formula 29]

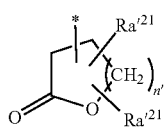 (a2-r-1)

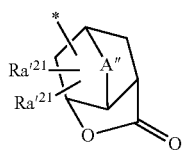 (a2-r-2)

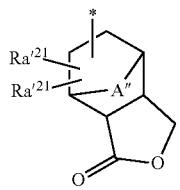 (a2-r-3)

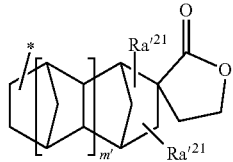 (a2-r-4)

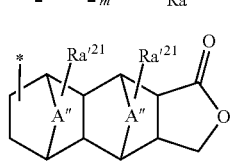 (a2-r-5)

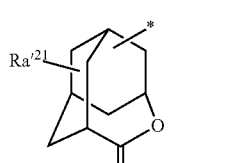 (a2-r-6)

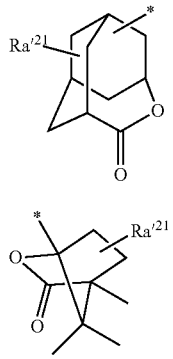 (a2-r-7)

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom (—O—), a sulfur atom (—S—) or an alkylene group of 1 to 5 carbon atoms which may contain an oxygen atom or a sulfur atom; n' represents an integer of 0 to 2; and m' represents 0 or 1.

In formulae (a2-r-1) to (a2-r-7), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for Ra'$^{21}$ include groups in which part or all of the hydrogen atoms within the aforementioned alkyl group for Ra'$^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for Ra'$^{21}$, R" represents a hydrogen atom, an alkyl group, a lactone-containing cyclic group, a carbonate-containing cyclic group or an —SO$_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing cyclic group for R" include groups represented by the aforementioned general formulae (a2-r-1) to (a2-r-7).

The carbonate-containing cyclic group for R" is the same as defined for the carbonate-containing cyclic group described later. Specific examples of the carbonate-containing cyclic group include groups represented by general formulae (ax3-r-1) to (ax3-r-3).

The —SO$_2$— containing cyclic group for R" is the same as defined for the —SO$_2$-containing cyclic group described later. Specific examples of the —SO$_2$— containing cyclic group include groups represented by general formulae (a5-r-1) to (a5-r-4).

The hydroxyalkyl group for Ra'$^{21}$ preferably has 1 to 6 carbon atoms, and specific examples thereof include the alkyl groups for Ra'$^{21}$ in which at least one hydrogen atom has been substituted with a hydroxy group.

In formulae (a2-r-2), (a2-r-3) and (a2-r-5), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a2-r-1) to (a2-r-7) are shown below.

[Chemical Formula 30]

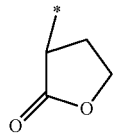
(r-lc-1-1)

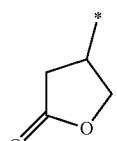
(r-lc-1-2)

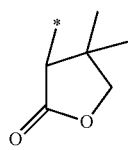
(r-lc-1-3)

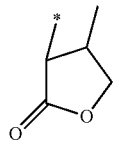
(r-lc-1-4)

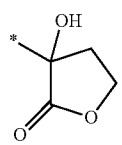
(r-lc-1-5)

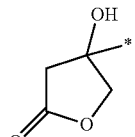
(r-lc-1-6)

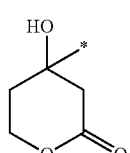
(r-lc-1-7)

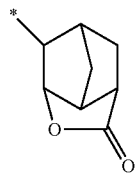
(r-lc-2-1)

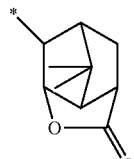
(r-lc-2-2)

(r-lc-2-3)
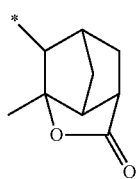
(r-lc-2-4)
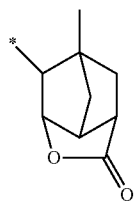
(r-lc-2-5)
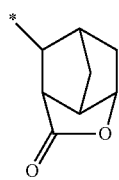
(r-lc-2-6)
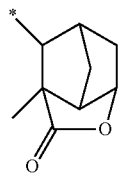
(r-lc-2-7)
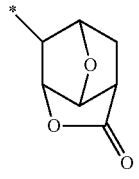
(r-lc-2-8)
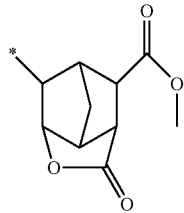
(r-lc-2-9)
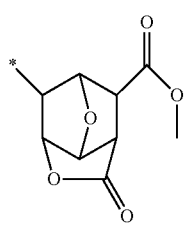
(r-lc-2-10)
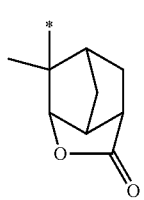
(r-lc-2-11)
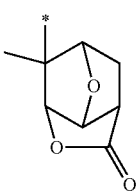
(r-lc-2-12)
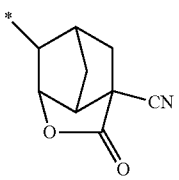
(r-lc-2-13)
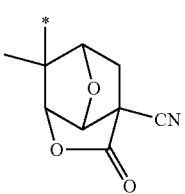
(r-lc-2-14)
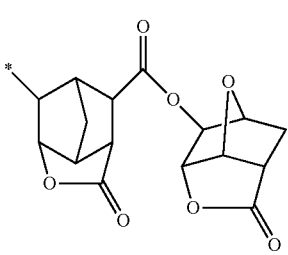
(r-lc-2-15)
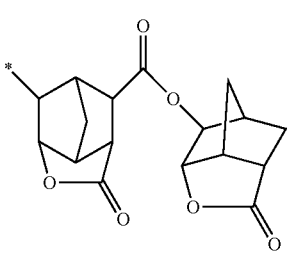
(r-lc-2-16)
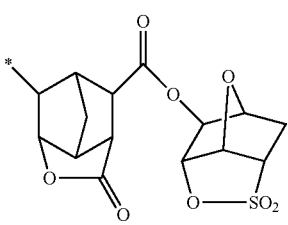
(r-lc-2-17)
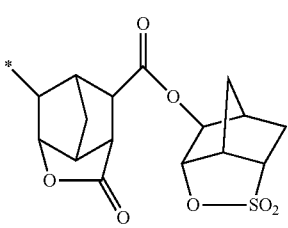

-continued
(r-lc-2-18)
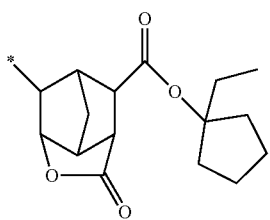
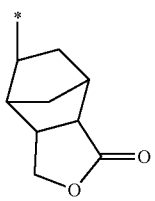
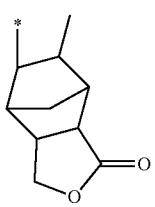
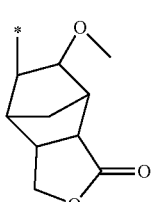
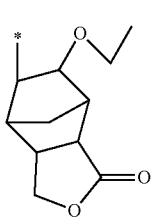
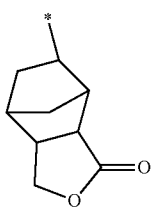
[Chemical Formula 31]
(r-lc-4-1)
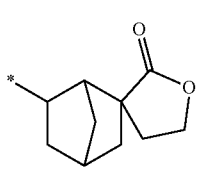
(r-lc-4-2)
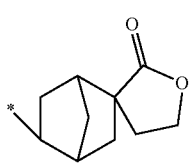
-continued
(r-lc-4-3)
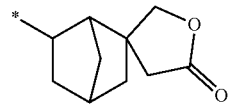
(r-lc-4-4)
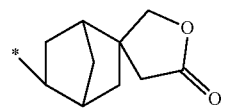
(r-lc-4-5)
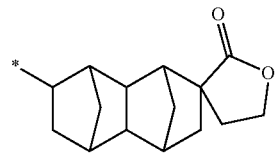
(r-lc-4-6)
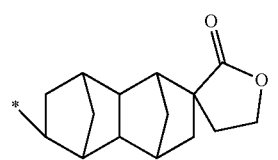
(r-lc-4-7)
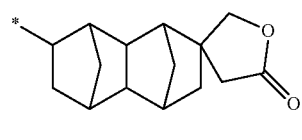
(r-lc-4-8)
(r-lc-4-9)
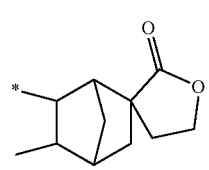
(r-lc-5-1)
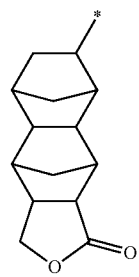
(r-lc-5-2)
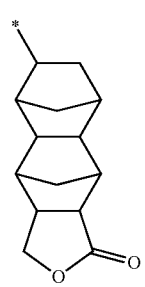

(r-lc-5-3)

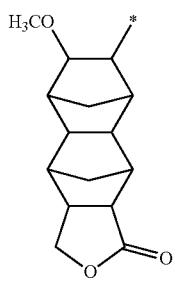

(r-lc-5-4)

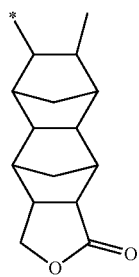

(r-lc-6-1)

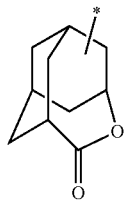

(r-lc-7-1)

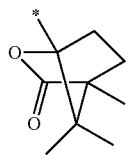

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (ax3-r-1) to (ax3-r-3) shown below.

[Chemical Formula 32]

(ax3-r-1)

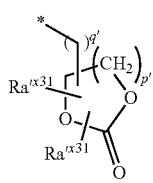

(ax3-r-2)

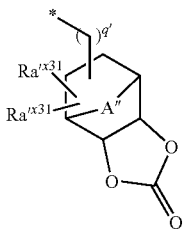

(ax3-r-3)

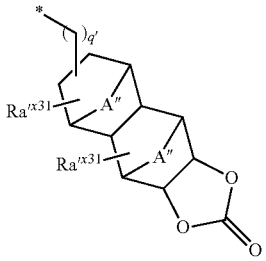

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulae (ax3-r-2) and (ax3-r-3), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 33]

(r-cr-1-1)

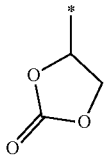

(r-cr-1-2)

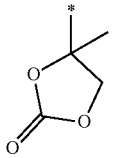

-continued
(r-cr-1-3)
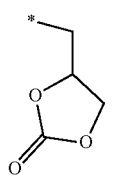
(r-cr-1-4)
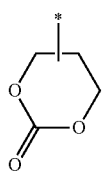
(r-cr-1-5)
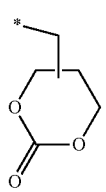
(r-cr-1-6)
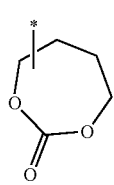
(r-cr-1-7)
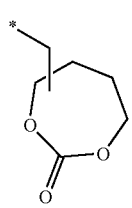
(r-cr-2-1)
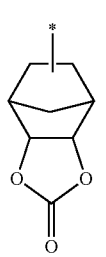
(r-cr-2-2)
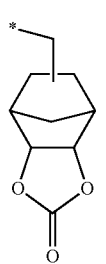
-continued
(r-cr-2-3)
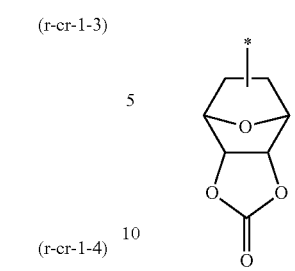
(r-cr-2-4)
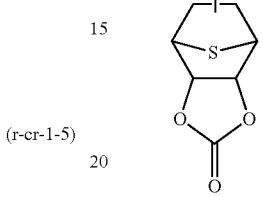
(r-cr-3-1)
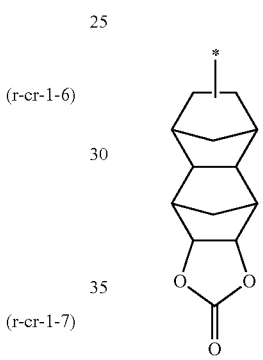
(r-cr-3-2)
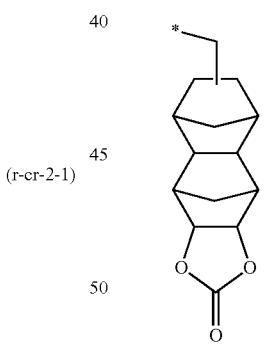
(r-cr-3-3)
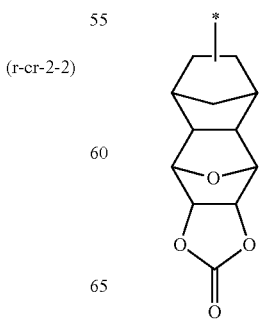

(r-cr-3-4)

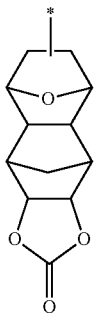

(r-cr-3-5)

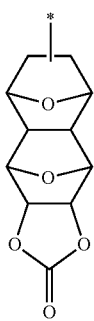

An "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

More specific examples of the —$SO_2$— containing cyclic group include groups represented by general formulas (a5-r-1) to (a5-r-4) shown below.

[Chemical Formula 34]

(a5-r-1)

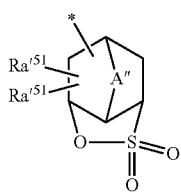

(a5-r-2)

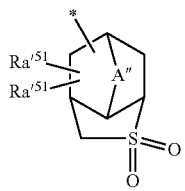

(a5-r-3)

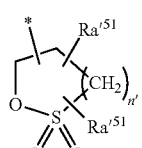

(a5-r-4)

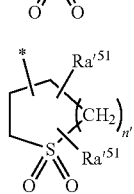

In the formulae, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —$SO_2$— containing cyclic group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) and (a5-r-2), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulas (a2-r-1) to (a2-r-7).

Specific examples of the groups represented by the aforementioned general formulae (a5-r-1) to (a5-r-4) are shown below. In the formulae shown below, "Ac" represents an acetyl group.

[Chemical Formula 35]

(r-sl-1-1)

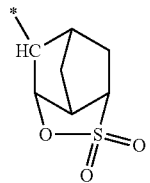

(r-sl-1-2)

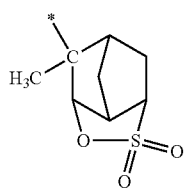

(r-sl-1-3)
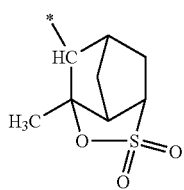
(r-sl-1-4)
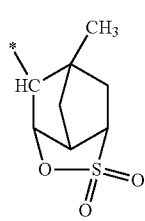
(r-sl-1-5)
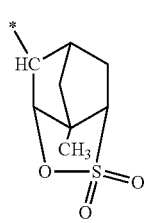
(r-sl-1-6)
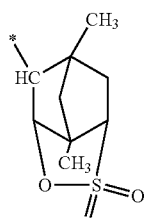
(r-sl-1-7)
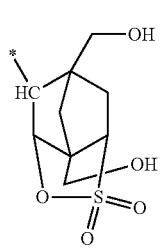
(r-sl-1-8)
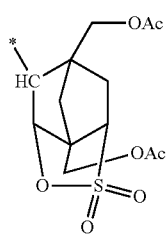
(r-sl-1-9)
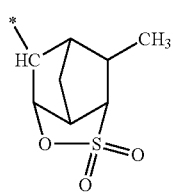
(r-sl-1-10)
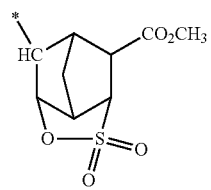
(r-sl-1-11)
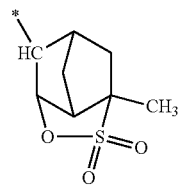
(r-sl-1-12)
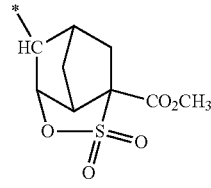
(r-sl-1-13)
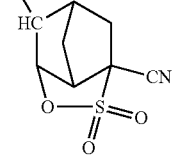
(r-sl-1-14)
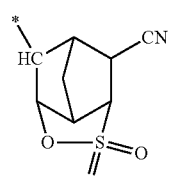
(r-sl-1-15)
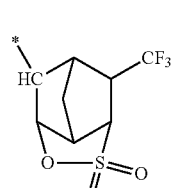
(r-sl-1-16)
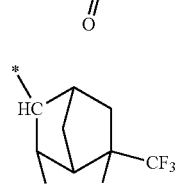
(r-sl-1-17)
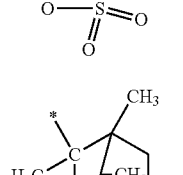

(r-sl-1-18)
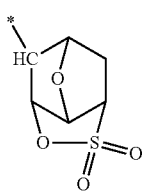
(r-sl-1-19)
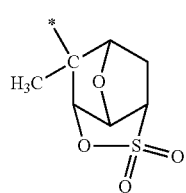
(r-sl-1-20)
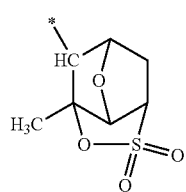
(r-sl-1-21)
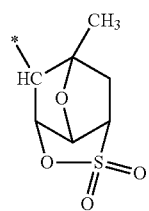
[Chemical Formula 36]
(r-sl-1-22)
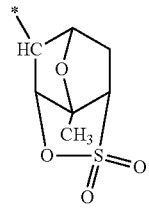
(r-sl-1-23)
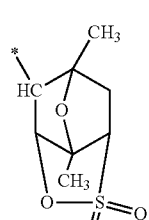
(r-sl-1-24)
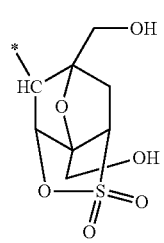
(r-sl-1-25)
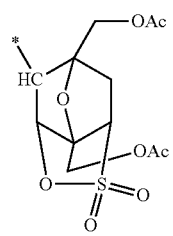
(r-sl-1-26)
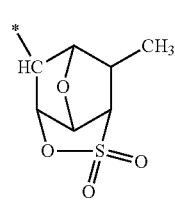
(r-sl-1-27)
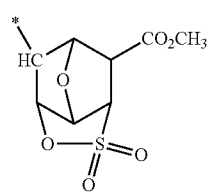
(r-sl-1-28)
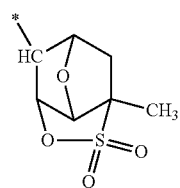
(r-sl-1-29)
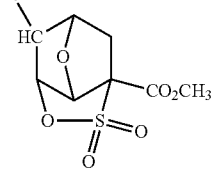
(r-sl-1-30)
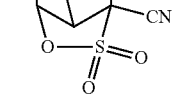
(r-sl-1-31)
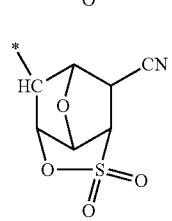
(r-sl-1-32)
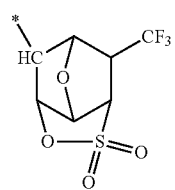

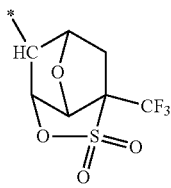 (r-sl-1-33)

[Chemical Formula 37]

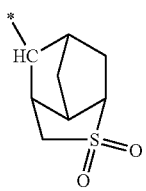 (r-sl-2-1)

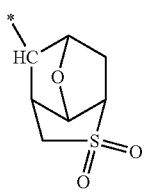 (r-sl-2-2)

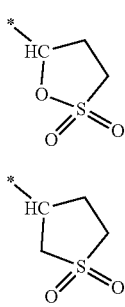 (r-sl-3-1)

(r-sl-4-1)

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-a1-1) to (y-a1-7) shown below can be mentioned.

[Chemical Formula 38]

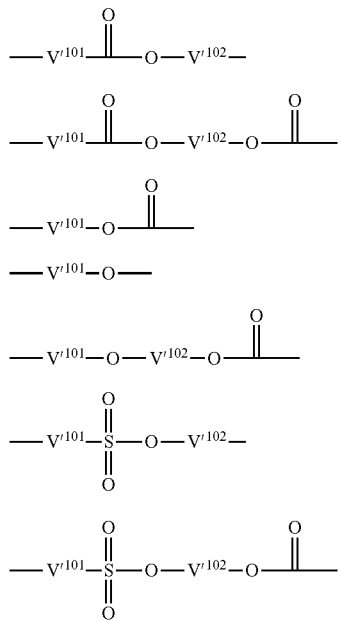

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; an alkylethylene group, such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $Ra'^3$ in the aforementioned formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 39]

(an-1)
$$R''^{101}-(CH_2)_{v''}-L''^{101}-O-(CH_2)_{q''}-\left[O-\underset{\underset{O}{\|}}{C}\right]_{n''}-V''^{101}-SO_3^-$$

(an-2)
$$R''^{102}-(CH_2)_{v''}-O-\underset{\underset{O}{\|}}{C}-\left[(CH_2)_{q''}-O\right]_{n''}-(CH_2)_{v''}-V''^{101}-SO_3^-$$

(an-3)
$$R''^{103}-(CH_2)_{v''}-O-\left[(CH_2)_{q''}-O-\underset{\underset{O}{\|}}{C}\right]_{n''}-V''^{101}-SO_3^-$$

In the formulae, $R''^{101}$ represents an aliphatic cyclic group which may have a substituent, a group represented by any one of the aforementioned formulae (r-hr-1) to (r-hr-6), or a chain alkyl group which may have a substituent; $R''^{102}$ represents an aliphatic cyclic group which may have a substituent, a lactone-containing cyclic group represented by any one of the aforementioned formulae (a2-r-1) to (a2-r-7), or an —$SO_2$— containing cyclic group represented by any one of the aforementioned formulae (a5-r-1) to (a5-r-4); $R''^{103}$ represents an aromatic cyclic group which may have a substituent, an aliphatic cyclic group which may have a substituent, or a chain alkenyl group which may have a substituent; $V''^{101}$ represents a fluorinated alkylene group; $L''^{101}$ represents —C(=O)— or —$SO_2$—; each v'' independently represents an integer of 0 to 3; each q'' independently represents an integer of 0 to 20; and n'' represents 0 or 1.

As the aliphatic cyclic group for $R''^{101}$, $R''^{102}$ and $R''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$ As the chain-like alkyl group for $R''^{101}$ which may have a substituent, the same groups as those described above for $R^{101}$ are preferable. As the chain-like alkenyl group for $R''^{103}$ which may have a substituent, the same groups as those described above for $R'^{101}$ are preferable.

V'''^{101} is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

Specific examples of the anion represented by general formula (an-1) are shown below. However, the present invention is not limited to these examples.

[Chemical Formula 40]

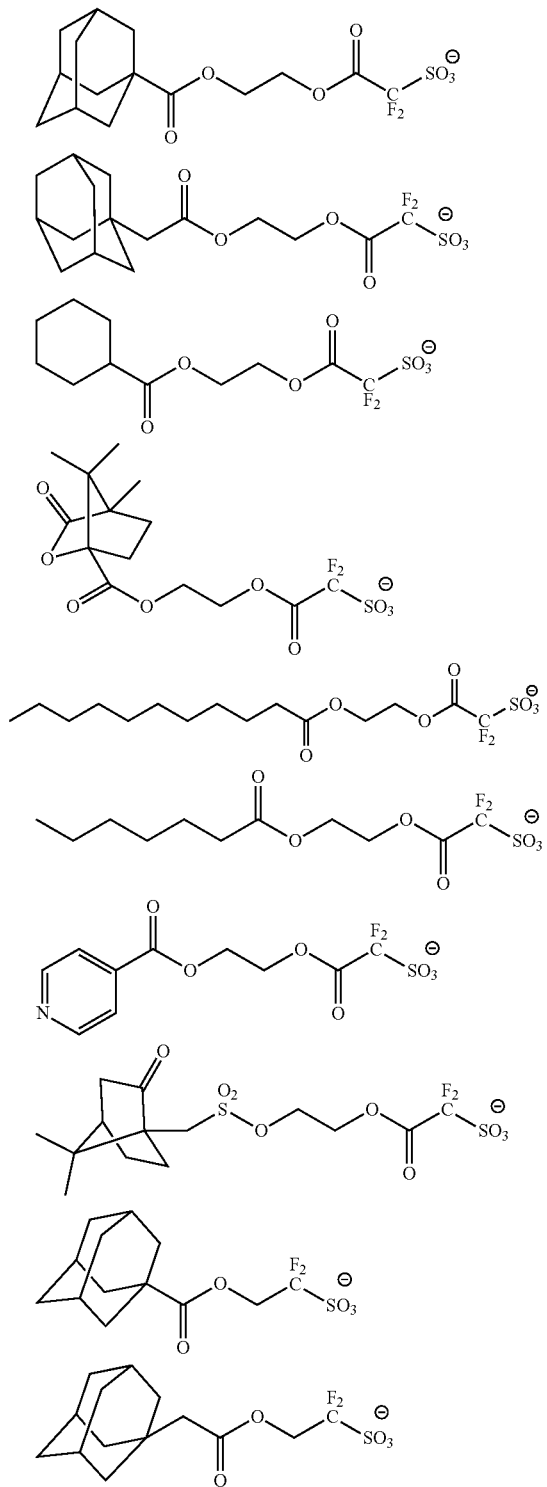
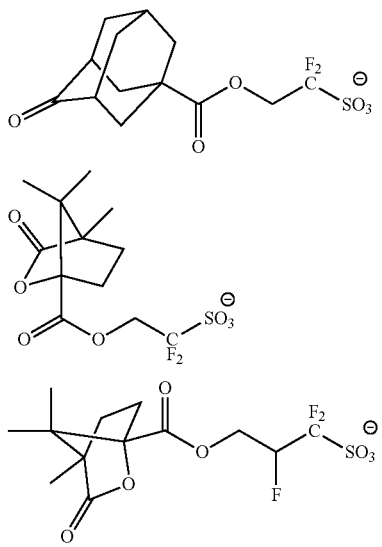

Specific examples of the anion represented by general formula (an-2) are shown below. However, the present invention is not limited to these examples.

[Chemical Formula 41]

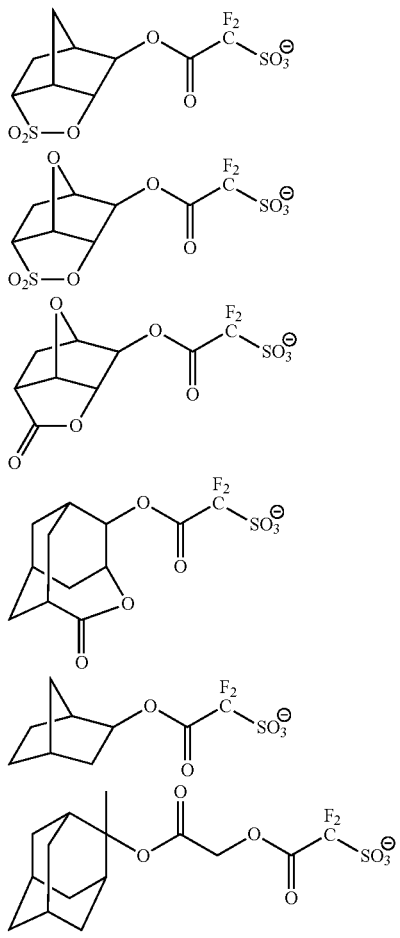

Specific examples of the anion represented by general formula (an-3) are shown below. However, the present invention is not limited to these examples.

[Chemical Formula 42]

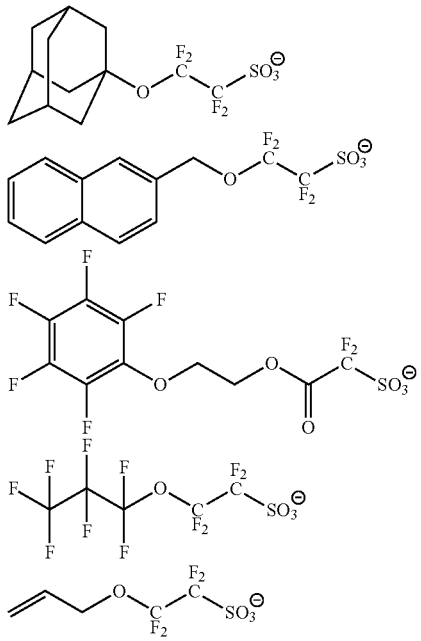

—Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Specific examples of the anion represented by general formula (b-2) are shown below. However, the present invention is not limited to these examples.

[Chemical Formula 43]

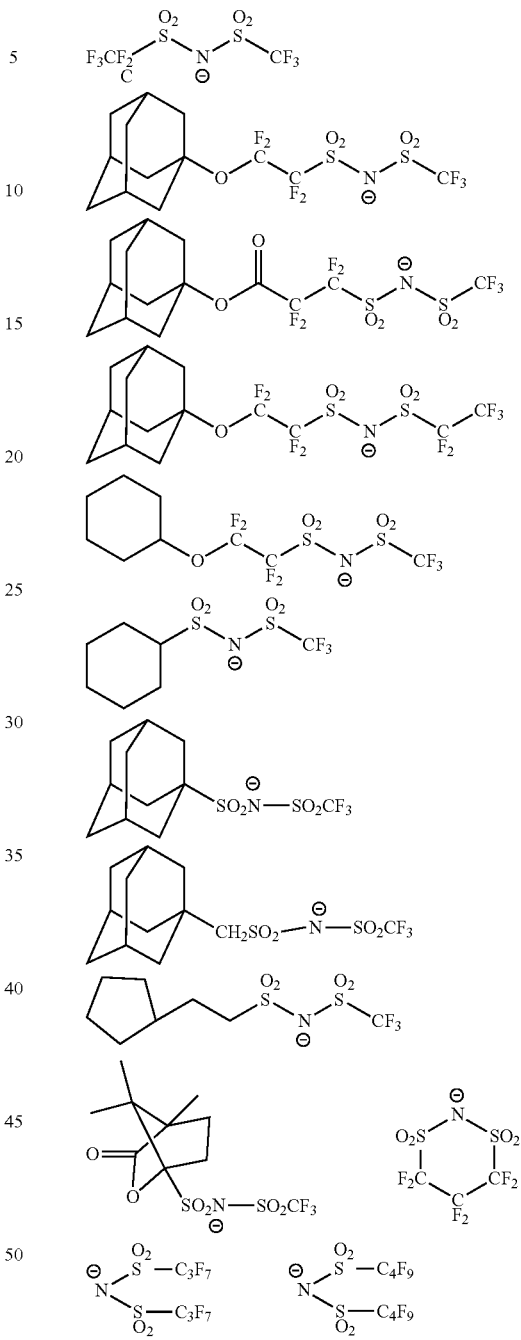

—Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —$SO_2$—.

Specific examples of the anion represented by general formula (b-3) are shown below. However, the present invention is not limited to these examples.

[Chemical Formula 44]

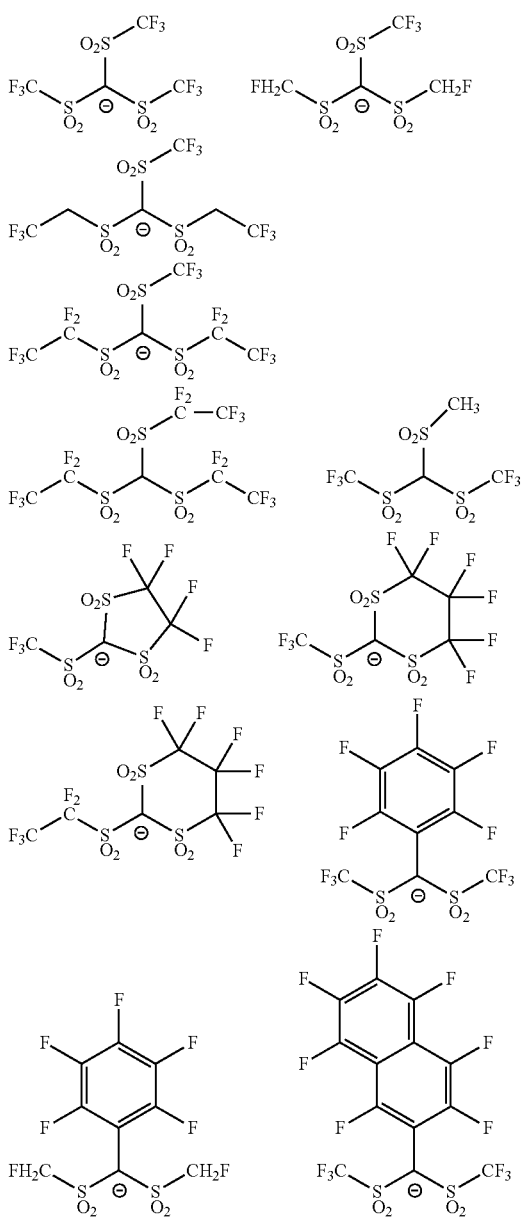

Among the above examples, as the anion moiety, an anion represented by general formula (b-an1), an anion represented by general formula (b-an2) or an anion represented by general formula (b-2) is preferable, and an anion represented by general formula (b-an2) is more preferable.

As the component (B), any acid generator other than those described above may be used.

Examples of other acid generators include a halogen-containing triazine compound, such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3, 5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3, 5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine tris(1,3-dibromopropyl)-1,3,5-triazine or tris(2,3-dibromopropyl)-1,3,5-triazine; and a halogen-containing triazine compound represented by general formula (b3) shown below, such as tris(2,3-dibromopropyl) isocyanurate.

[Chemical Formula 45]

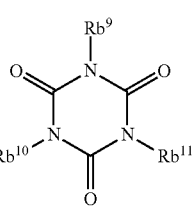

(b3)

In general formula (b3), $Rb^9$, $Rb^{10}$ and $Rb^{11}$ each independently represents a halogenated alkyl group.

Examples of other acid generators include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and a compound having an oxime sulfonate group represented by general formula (b4) shown below.

[Chemical Formula 46]

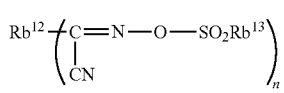

(b4)

In general formula (b4), $Rb^{12}$ represents a monovalent organic group, a divalent organic group or a trivalent organic group; $Rb^{13}$ represents a substituted or unsubstituted saturated hydrocarbon group, a substituted or unsubstituted unsaturated hydrocarbon group, or a substituted or unsubstituted aromatic compound group; and n represents the number of repeating units of the structure within the parenthesis.

In general formula (b4), an aromatic compound group refers to a group which shows physical and/or chemical properties typical of an aromatic compound, and examples thereof include an aryl group such as a phenyl group or a naphthyl group, and a heteroaryl group such as a furyl group or a thienyl group. The aromatic compound group may have, on the ring thereof, one or more substituents such as a halogen atom, an alkyl group, an alkoxy group or a nitro group. $Rb^{13}$ is preferably an alkyl group having 1 to 6 carbon atoms, and examples thereof include a methyl group, an ethyl group, a propyl group and a butyl group. A compound in which $Rb^{12}$ represents an aromatic compound group, and $Rb^{13}$ represents an alkyl group having 1 to 4 carbon atoms is preferable.

Examples of the acid generator represented by general formula (b4) include a compound in which n=1, $Rb^{12}$ is a phenyl group, a methylphenyl group or a methoxyphenyl group, and $Rb^{13}$ is a methyl group. Specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, and [2-(propylsulfonyloxyimino)-2,3-dihydroxythiophen-3-ylidene](o-tolyl)acetonitrile. Specific examples of acid generators represented by general formula (b4) in which n=2 include the acid generators represented by the following formulae.

[Chemical Formula 47]

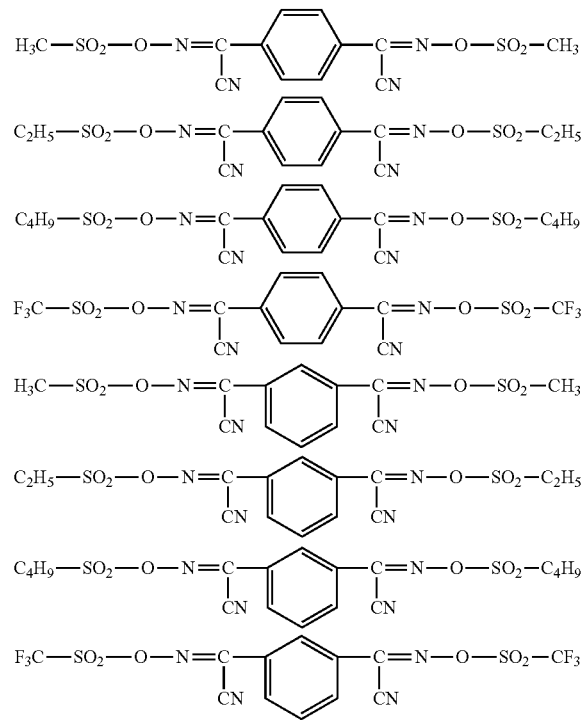

Examples of other acid generators include an onium salt having a naphthalene ring in the cation moiety thereof. The expression "having a naphthalene ring" means that the cation moiety has a structure derived from naphthalene, and the structure includes at least 2 rings and the aromaticity thereof is maintained. The naphthalene ring may have a substituent, such as a linear or branched alkyl group having 1 to 6 carbon atoms, a hydroxy group, or a linear or branched alkoxy group having 1 to 6 carbon atoms. The structure derived from a naphthalene ring may be a monovalent group (a group having one free valency) or a multivalent group (a group having two or more free valency), but is preferably a monovalent group (provided that the free valency is counted excluding the portion having the substituent bonded thereto). The number of the naphthalene rings is preferably 1 to 3.

As the cation moiety of such onium salt having a naphthalene ring in the cation moiety, a structure represented by general formula (b5) shown below is preferable.

[Chemical Formula 48]

In general formula (b5), at least one of $Rb^{14}$, $Rb^{15}$ and $Rb^{16}$ is a group represented by general formula (b6) shown below, and the remaining group is a linear or branched alkyl group having 1 to 6 carbon atoms, a phenyl group which may have a substituent, a hydroxy group, or a linear or branched alkoxy group having 1 to 6 carbon atoms. Alternatively, one of $Rb^{14}$, $Rb^{15}$ and $Rb^{16}$ is a group represented by general formula (b6) shown below, and the remaining groups are linear or branched alkylene groups having 1 to 6 carbon atoms, wherein the terminals thereof may be bonded together to form a ring.

[Chemical Formula 49]

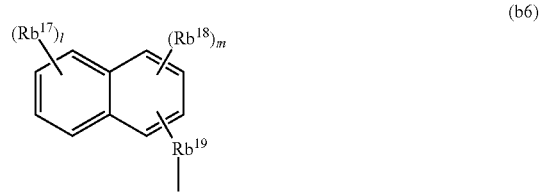

In formula (b6), $Rb^{17}$ and $Rb^{18}$ each independently represents a hydroxy group, a linear or branched alkoxy group having 1 to 6 carbon atoms, or a linear or branched alkyl group having 1 to 6 carbon atoms; $Rb^{19}$ represents a single bond or a linear or branched alkylene group having 1 to 6 carbon atoms optionally having a substituent; l and m each independently represents an integer of 0 to 2, provided that l+m is 3 or less; when a plurality of $Rb^{17}$ are present, the plurality of $Rb^{17}$ may be the same or different from each other; and when a plurality of $Rb^{18}$ are present, the plurality of $Rb^{18}$ may be the same or different from each other.

From the viewpoint of the stability of the compound, it is preferable that one of $Rb^{14}$, $Rb^{15}$ and $Rb^{16}$ is a group represented by general formula (b6), and the remaining groups are linear or branched alkylene groups having 1 to 6 carbon atoms wherein the terminals thereof may be bonded together to form a ring. In such a case, the two alkylene groups constitute 3- to 9-membered ring including the sulfur atom. The number of atoms (including the sulfur atom) constituting the ring is preferably 5 or 6.

Examples of the substituent for the alkylene group include an oxygen atom (in this case, the oxygen atom forms a carbonyl group together with a carbon atom constituting the alkylene group), and a hydroxy group.

Examples of the substituent for the phenyl group include a hydroxy group, an alkoxy group having 1 to 6 carbon atoms, and an alkyl group having 1 to 6 carbon atoms.

Preferable examples of the cation moiety include a structure represented by formula (b7), (b8) or (b18) shown below, and a structure represented by formula (b18) shown below is preferable.

[Chemical Formula 50]

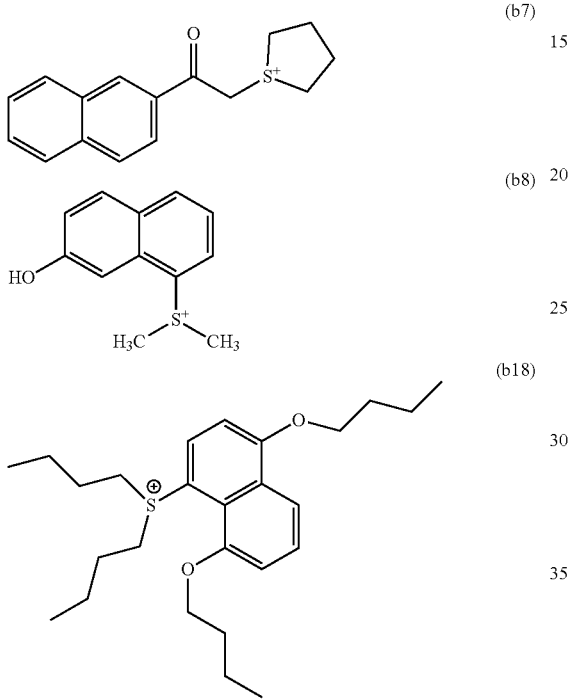

(b7)

(b8)

(b18)

Such a cation moiety may be an iodonium salt or a sulfonium salt. However, from the viewpoint of acid generation efficiency, a sulfonium salt is preferable.

Therefore, as the anion moiety of the onium salt having a naphthalene ring in the cation moiety, an anion capable of forming a sulfonium salt is preferable.

Examples of the anion moiety of such acid generator include a fluoroalkylsulfonate ion or an arylsulfonate ion.

The alkyl group in the fluoroalkylsulfonate ion may be a linear, branched or cyclic alkyl group having 1 to 20 carbon atoms. In view of the bulkiness of the acid generated and the acid diffusion length, the alkyl group preferably has 1 to 10 carbon atoms. In terms of short acid diffusion length, a branched or cyclic alkyl group is particularly desirable. In terms of cost in synthesis, a methyl group, an ethyl group, a propyl group, a butyl group or an octyl group is preferable.

The aryl group in the arylsulfonate ion is preferably an aryl group having 6 to 20 carbon atoms, and examples thereof include a phenyl group or a naphthyl group which may be substituted with an alkyl group or a halogen atom. In terms of cost in synthesis, an aryl group having 6 to 10 carbon atoms is preferable. Preferable examples of the aryl group include a phenyl group, a toluenesulfonyl group, an ethylphenyl group, a naphthyl group and a methylnaphthyl group.

In the fluoroalkyl sulfonate ion or aryl sulfonate ion, the fluorination rate when part or all of the hydrogen atoms are fluorinated is preferably 10 to 100%, more preferably 50 to 100%, In particular, those in which all hydrogen atoms are substituted with fluorine atoms are preferred because the strength of the acid is increased. Specific examples thereof include trifluoromethane sulfonate, perfluorobutane sulfonate, perfluorooctane sulfonate, and perfluorobenzene sulfonate.

Among these examples, as the anion moiety, an anion represented by general formula (b9) shown below is preferable.

[Chemical Formula 51]

$Rb^{20}SO_3^{\ominus}$ (b9)

In general formula (b9), $Rb^{20}$ is a group represented by general formula (b10) or (b11) shown below, or a group represented by formula (b12) shown below.

[Chemical Formula 52]

$-C_xF_{2x+1}$ (b10)

 (b11)

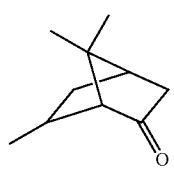 (b12)

In general formula (b10), x represents an integer of 1 to 4. In general formula (b11), $Rb^{21}$ represents a hydrogen atom, a hydroxy group, a linear or branched alkyl group having 1 to 6 carbon atoms, or an alkoxy group having 1 to 6 carbon atoms; and y represents an integer of 1 to 3. Among these examples, in terms of safety, trifluoromethanesulfonate or perfluorobutanesulfonate is preferable.

Alternatively, as the anion moiety, an anion containing nitrogen represented by general formula (b13) or (b14) shown below is preferable.

[Chemical Formula 53]

 (b13)

 (b14)

In formula (b13), Xb represents a linear or branched alkylene group in which at least one hydrogen atom has been substituted with a fluorine atom, and the alkylene group preferably has 2 to 6 carbon atoms, more preferably 3 to 5 carbon atoms, and most preferably 3 carbon atoms. In formula (b14), each of Yb and Zb independently represents a linear or branched alkyl group in which at least one hydrogen atom has been substituted with a fluorine atom, and the alkyl group preferably has 1 to 10 carbon atoms, more preferably 1 to 7 carbon atoms, and still more preferably 1 to 3 carbon atoms.

The smaller the number of the alkylene group represented by Xb or the alkyl group represented by Yb or Zb, the better the solubility in an organic solvent.

Further, in the alkylene group represented by Xb or the alkyl group represented by Yb or Zb, the larger the number of hydrogen atoms substituted with fluorine, the stronger the acid strength. The fluorination rate of the alkylene group or the alkyl group is preferably 70 to 100%, more preferably 90 to 100%. A perfluoroalkylene group or a perfluoroalkyl group in which all hydrogen atoms have been substituted with fluorine is most preferable.

Preferable examples of the onium salt having a naphthalene ring in the cation moiety include a compound represented by formula (b15), (b16) or (b17) shown below, and a compound represented by formula (b17) shown below is more preferable.

[Chemical Formula 54]

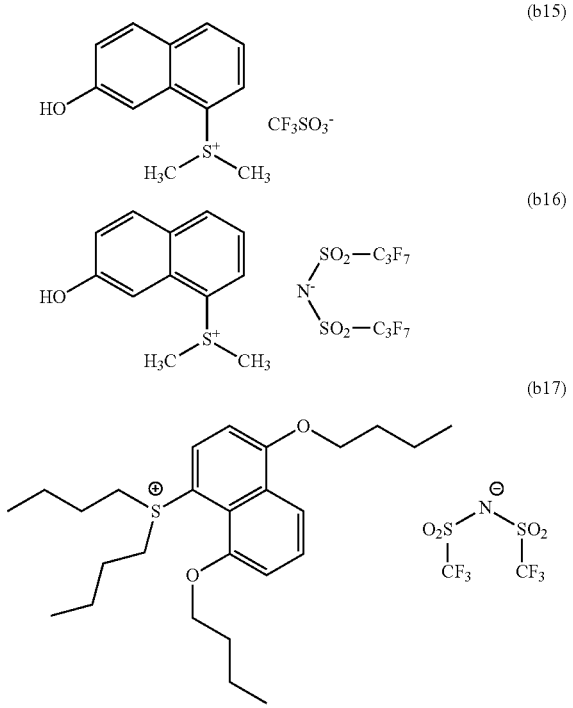

Examples of other acid generators include bis(sulfonyl)diazomethanes, such as bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane; nitrobenzyl derivatives, such as 2-nitrobenzyl p-toluenesulfonate, 2,6-dinitrobenzyl p-toluenesulfonate, nitrobenzyltosylate, dinitrobenzyltosylate, nitrobenzylsulfonate, nitrobenzylcarbonate and dinitrobenzylcarbonate; sulfonate esters, such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, and N-methylsulfonyloxyphthalimide; trifluoromethanesulfonate esters, such as N-hydroxyphthalimide, and N-hydroxynaphthalimide; onium salts, such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates, such as α-methylbenzointosylate; and other diphenyliodonium salts, triphenylsulfonium salts, phenyldiazonium salts and benzylcarbonates.

Other preferable examples of the acid generator include a compound represented by general formula (b5) in which $Rb^{17}$ and $Rb^{18}$ in general formula (b6) each independently represents a linear or branched alkoxy group having 1 to 6 carbon atoms, and $Rb^{19}$ represents a single bond.

As the acid generator (B), one kind of compound may be used, or two or more kinds of compounds may be used.

The amount of the acid generator (B) contained in the resist composition is not particularly limited as long as patterning is possible, and may be arbitrarily determined taking into account the kind of acid generator, resin components, other additives, film thickness used and the like. The amount of the acid generator (B) relative to 100 parts by weight of the resin component (component (P)) is preferably 0.1 to 10 parts by weight.

<<Other Components>>

The resist composition used in the method of forming a resist pattern according to the present embodiment may further include, in addition to the components (P1), (P2) and (B), any other component, if desired. Examples of optional components include the component (F), the component (E), the component (C) and the component (S) described below.

[Component (F): Acid Diffusion Control Agent]

For improving the shape of the resist pattern used as a mold, and improving the post exposure stability of the latent image formed by the pattern-wise exposure of the resist layer, the resist composition according to the present embodiment preferably includes an acid diffusion control agent (hereafter, sometimes referred to as "component (F)").

As the component (F), a nitrogen-containing compound (hereafter, sometimes referred to as "component (F1)") is preferable. If desired, an organic carboxylic acid, or a phosphorus oxo acid or derivative thereof (hereafter, sometimes referred to as "component (F2)") may be included.

Component (F1): Nitrogen-Containing Compound

Examples of the component (F1) include trimethylamine, diethylamine, triethylamine, di-n-propylamine, tri-n-propylamine, tri-n-pentylamine (triamylamine), n-hexylamine, n-heptylamine, n-octylamine, n-nonylamine, tribenzylamine, diethanolamine, triethanolamine, ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinolinone, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, and pyridine.

As the component (F1), commercially available hindered amine compounds, such as ADK STAB LA-52, ADK STAB LA-57, ADK STAB LA-63P, ADK STAB LA-68, ADK STAB LA-72, ADK STAB LA-77Y, ADK STAB LA-77G ADK STAB LA-81, ADK STAB LA-82 and ADK STAB A-87 (manufactured by ADEKA); substituted pyridines having the 2nd and 6th positions or 2nd, 4th and 6th positions substituted with a hydrocarbon group or the like, such as 2,6-diphenylpyridine, 2,6-di-tert-butylpyridine, 2,4,6-triphenylpyridine, and 2,4,6-tri-tert-butylpyridine; and substituted piperidines having substitutable portions substituted with a hydrocarbon or the like, such as 2,6-dimethylpiperidine, 1,3,5-trimethylpiperidine, 2,4,6-trimethylpiperidine, and 2,2,6,6-tetramethylpiperidine.

As the component (F1), one kind of compound may be used alone, or two or more kinds of compounds may be used in combination.

In the resist composition, the amount of the component (F1) relative to 100 parts by weight of the resin component (component (P)) is typically from 0 to 5 parts by weight, preferably 0 to 3 parts by weight, and more preferably 0 to 1 part by weight. When the amount of the component (D) is within the above-mentioned range, the shape of the resist pattern and the post exposure stability of the latent image formed by the pattern-wise exposure of the resist layer are improved.

Component (F2): organic carboxylic acid, or a phosphorus oxo acid or derivative thereof As the organic carboxylic acid for the component (F2), malonic acid, citric acid, malic acid, succinic acid, benzoic acid and salicylic acid is preferable, and salicylic acid is more preferable.

Examples of the phosphorus oxo acid or derivative thereof for the component (F2) include phosphoric acid or a derivative thereof (e.g., an ester), such as phosphoric acid, phosphoric acid di-n-butyl ester, and phosphoric acid diphenyl ester; phosphonic acid or derivative thereof (e.g., an ester), such as phosphonic acid, phosphonic acid dimethyl ester, phosphonic acid-di-n-butyl ester, phenylphosphonic acid and phosphonic acid dibenzyl ester; phosphinic acid and derivative thereof (e.g., ester), such as phosphinic acid and phenylphosphinic acid. Among these examples, phosphonic acid is preferable.

As the component (F2), one kind of compound may be used alone, or two or more kinds of compounds may be used in combination.

In the resist composition, the amount of the component (F2) relative to 100 parts by weight of the resin component (component (P)) is typically from 0 to 5 parts by weight, preferably 0 to 3 parts by weight, and more preferably 0 to 1 part by weight.

As the component (F), the component (F1) and the component (F2) may be used in same amounts.

Component (E): Sulfur-Containing Compound

In the case where the resist composition according to the present embodiment is used for forming a pattern on a metal substrate, is preferable that the resist composition further includes a sulfur-containing compound (hereafter, sometimes referred to as "component (E)").

Component (E) is a compound containing a sulfur atom which is capable of being coordinated to a metal. Regarding a compound capable of generating two or more tautomers, when at least one tautomer includes a sulfur atom capable of being coordinated to a metal constituting a metal layer, the compound falls under the definition of a "sulfur-containing compound".

When a resist pattern used as a plating mold is formed on a surface made of a metal such as Cu, defects in the cross-sectional shape such as footing tend to occur. However, in the case where the resist composition contains the component (E), even when a resist pattern is formed on the surface of a substrate made of a metal, defects in the cross-sectional shape such as footing is unlikely to occur.

When the resist composition is used for pattern formation on a substrate other than a metal substrate, the resist composition does not need to contain the component (E). However, there is no particular problem even if the resist composition used for pattern formation on a substrate other than a metal substrate contains the component (E).

The sulfur atom capable of being coordinated to a metal is contained in a sulfur-containing compound, for example, in the form of a mercapto group (—SH), a thiocarboxy group (—CO—SH), a dithiocarboxy group (—CS—SH), or a thiocarbonyl group (—CS—).

As the component (E), a compound having a mercapto group is preferred because they may be reliably coordinated to a metal and may exhibit excellent effect of suppressing footing.

Preferable examples of the sulfur-containing compound having a mercapto group include a compound represented by general formula (e1) shown below.

[Chemical Formula 55]

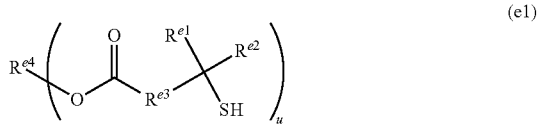

(e1)

In the formula, $R^{e1}$ and $R^{e2}$ each independently represents a hydrogen atom or an alkyl group; $R^{e3}$ represents a single bond or an alkylene group; $R^{e4}$ represents a u-valent aliphatic group which may contain an atom other than carbon; and u represents an integer of 2 to 4.

In the case where each of $R^{e1}$ and $R^{e2}$ is an alkyl group, the alkyl group may be linear or branched, and is preferably linear. In the case where each of $R^{e1}$ and $R^{e2}$ is an alkyl group, the number of carbon atoms of the alkyl group is not particularly limited, as long as the objects of the present invention are not impaired. The alkyl group preferably has 1 to 4 carbon atoms, more preferably 1 or 2 carbon atoms, and still more preferably 1 carbon atom. As the combination of $R^{e1}$ and $R^{e2}$, it is preferable that either one is a hydrogen atom, and the other is an alkyl group, and it is more preferable that either one is a hydrogen atom, and the other is a methyl group.

In the case where $R^{e3}$ is an alkylene group, the alkylene group may be linear or branched, and is preferably linear. In the case where $R^{e3}$ is an alkylene group, the number of carbon atoms of the alkylene group is not particularly limited, as long as the objects of the present invention are not impaired. The alkylene group preferably has 1 to 10 carbon atoms, more preferably 1 to 5 carbon atoms, still more preferably 1 or 2 carbon atoms, and still more preferably 1 carbon atom.

$R^{e4}$ is a divalent, trivalent or tetravalent aliphatic group which may contain an atom other than carbon. As the atom other than carbon that $R^{e4}$ may contain, a nitrogen atom, an oxygen atom, a sulfur atom, a fluorine atom, a chlorine atom, a bromide atom and an iodine atom may be mentioned. The structure of the aliphatic group for $R^{e4}$ may be linear, branched or cyclic, or a combination thereof.

As the compound represented by formula (e1), a compound represented by formula (e2) shown below is preferable.

[Chemical Formula 56]

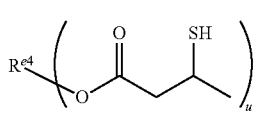

(e2)

In formula (e2), $R^{e4}$ and u are the same as defined in formula (e1).

As the compound represented by formula (e2), the following compounds are preferable.

[Chemical Formula 57]

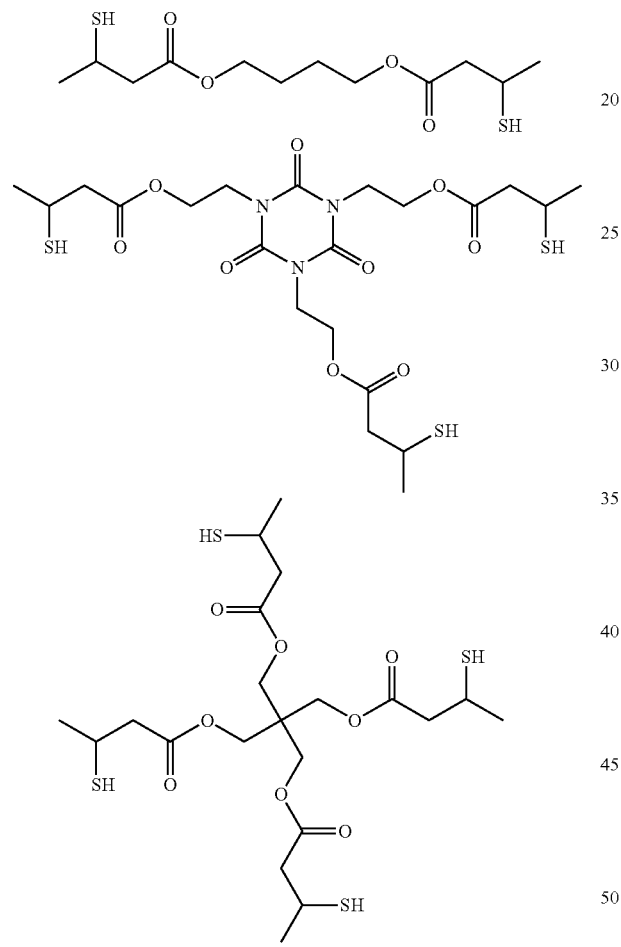

The compounds represented by the following formulae (e3-L1) to (e3-L7) may also be given as preferable examples of the sulfur-containing compound having a mercapto group.

[Chemical Formula 58]

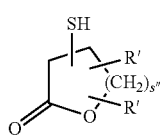

(e3-L1)

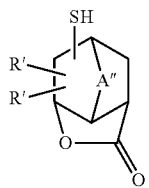

(e3-L2)

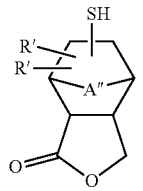

(e3-L3)

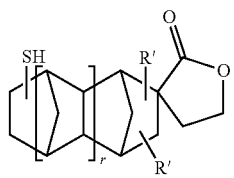

(e3-L4)

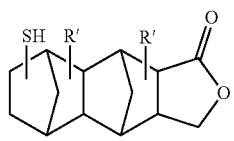

(e3-L5)

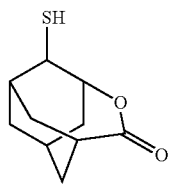

(e3-L6)

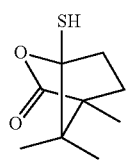

(e3-L7)

In formulae (e3-L1) to (e3-L7), R', s", A" and r are the same as defined for $Ra'^{21}$, n', A" and m' in the aforementioned general formula (a2-r-1) to (a2-r-7), respectively.

Specific examples of sulfur-containing compounds having a mercapto group represented by formulae (e3-L1) to (e3-L7) include the following compounds.

[Chemical Formula 59]

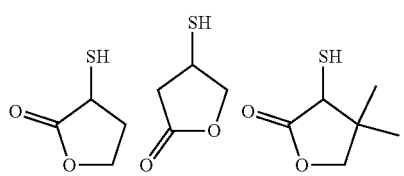

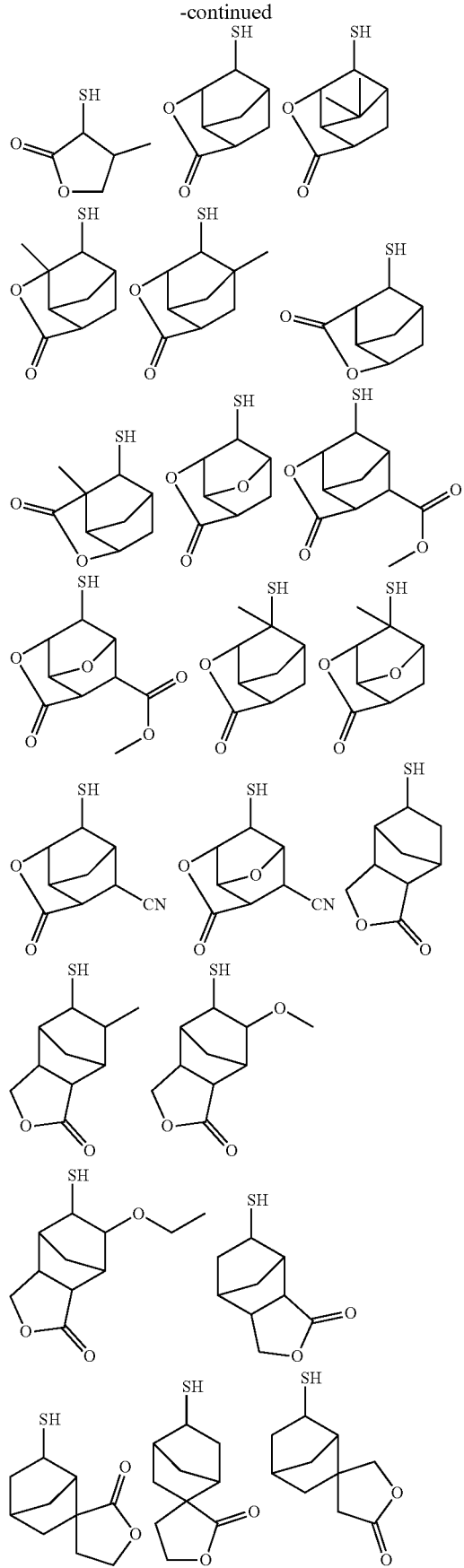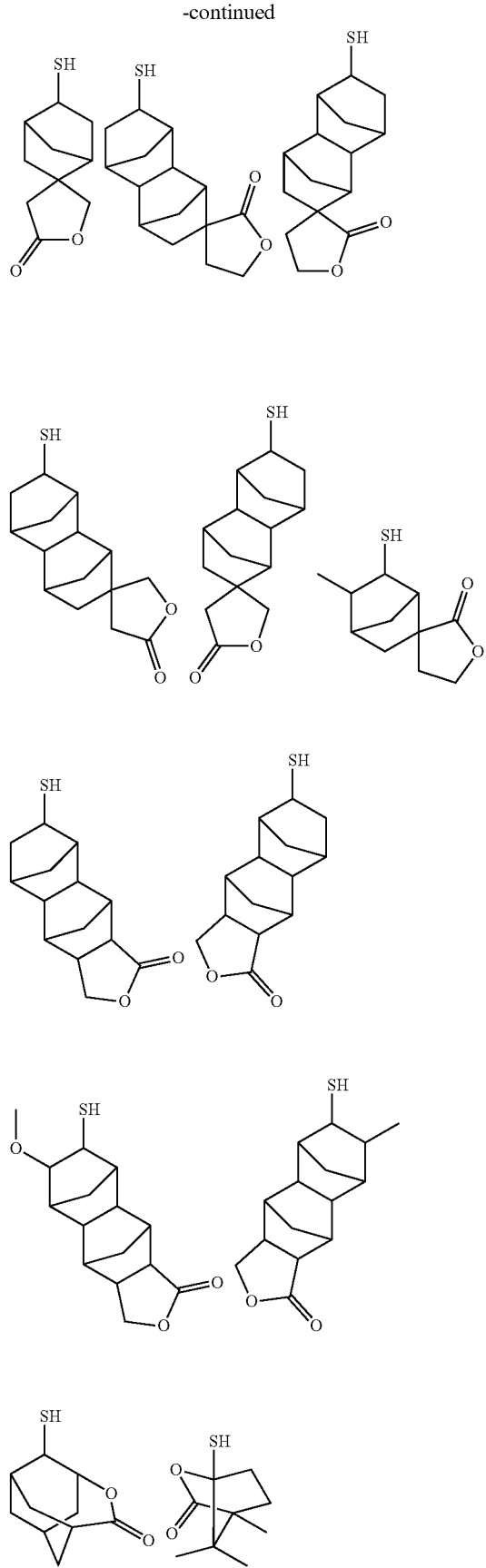

The compounds represented by the following formulae (e3-1) to (e3-4) may also be given as preferable examples of the sulfur-containing compound having a mercapto group.

[Chemical Formula 60]

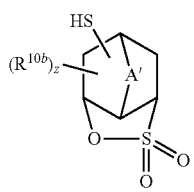
(e3-1)

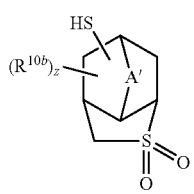
(e3-2)

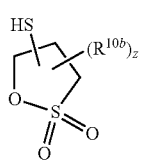
(e3-3)

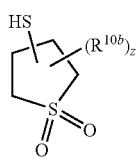
(e3-4)

In formulae (e3-1) to (e3-4), $R^{10b}$ is the same as defined for $Ra'^{51}$ in the aforementioned formula (a5-r-1) to (a5-r-4). z is an integer of 0 to 4.

Specific examples of mercapto compounds represented by formulae (e3-1) to (e3-4) include the following compounds.

[Chemical Formula 61]

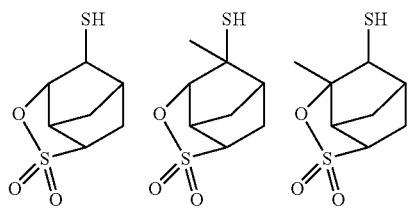

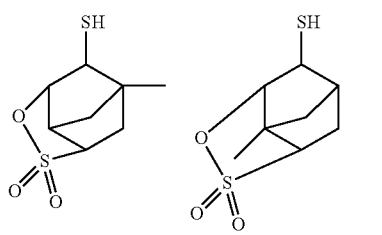

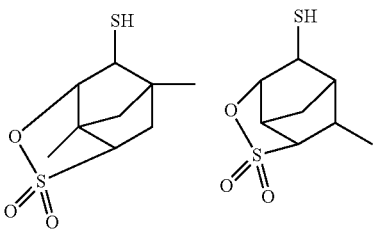

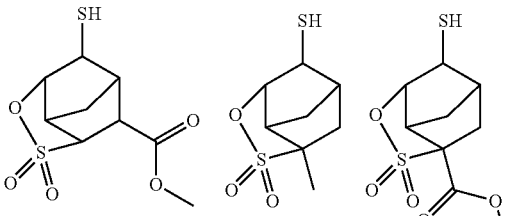

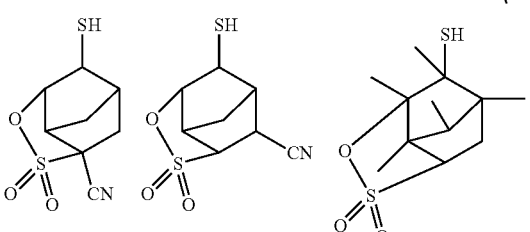

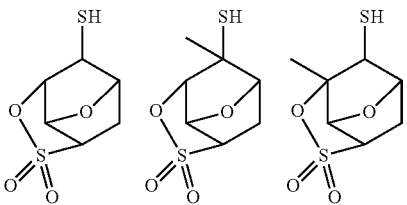

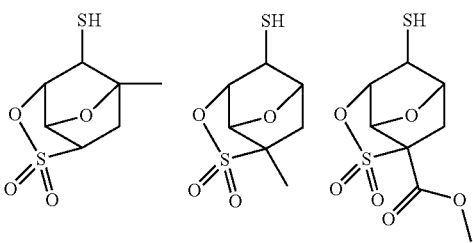

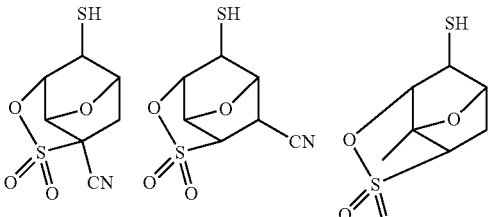

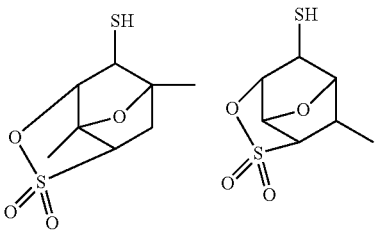

-continued

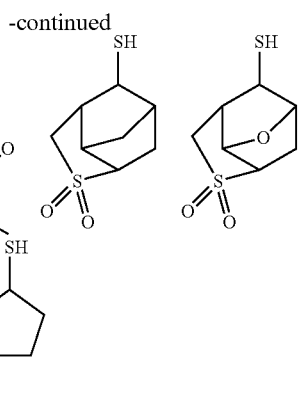

Further, as another preferable example of the compound having a mercapto group, a compound represented by the following formula (e4) may be mentioned.

[Chemical Formula 62]

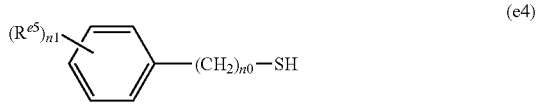

In formula (e4), $R^{e5}$ represents a hydroxy group, an alkyl group having 1 to 4 carbon atoms, an alkoxy group having 1 to 4 carbon atoms, an alkylthio group having 1 to 4 carbon atoms, a hydroxyalkyl group having 1 to 4 carbon atoms, a mercaptoalkyl group having 1 to 4 carbon atoms, a halogenated alkyl group having 1 to 4 carbon atoms, or a halogen atom; n1 represents an integer of 0 to 3; n0 represents an integer of 0 to 3; provided that, when n1 is 2 or 3, the plurality of $R^{e5}$ may be the same or different.

In the case where $R^{e5}$ represents an alkyl group of 1 to 4 carbon atoms which may have a hydroxy group, specific examples thereof include a methyl group, an ethyl group, an n-propyl group, an isopropyl group, an n-butyl group, an isobutyl group, a sec-butyl group and a tert-butyl group. Among these examples, a methyl group, a hydroxymethyl group or an ethyl group is preferable.

In the case where $R^{e5}$ represents an alkoxy group having 1 to 4 carbon atoms, specific examples thereof include a methoxy group, an ethoxy group, an n-propyloxy group, an isopropyloxy group, an n-butyloxy group, an isobutyloxy group, a sec-butyloxy group, and a tert-butyloxy group. Among these examples, a methoxy group or an ethoxy group is preferable, and a methoxy group is more preferable.

In the case where $R^{e5}$ represents an alkylthio group having 1 to 4 carbon atoms, specific examples thereof include a methylthio group, an ethylthio group, an n-propylthio group, an isopropylthio group, an n-butylthio group, an isobutylthio group, a sec-butylthio group, and a tert-butylthio group. Among these examples, a methylthio group or an ethylthio group is preferable, and a methylthio group is more preferable.

In the case where $R^{e5}$ represents a hydroxyalkyl group having 1 to 4 carbon atoms, specific examples thereof include a hydroxymethyl group, a 2-hydroxyethyl group, a 1-hydroxyethyl group, a 3-hydroxy-n-propyl group, and a 4-hydroxy-n-butyl group. Among these examples, a hydroxymethyl group, a 2-hydroxyethyl group or a 1-hydroxyethyl group is preferable, and a hydroxymethyl group is preferable.

In the case where $R^{e5}$ represents a mercaptoalkyl group having 1 to 4 carbon atoms, specific examples thereof include a mercaptomethyl group, a 2-mercaptoethyl group, a 1-mercaptoethyl group, a 3-mercapto-n-propyl group, and a 4-mercapto-n-butyl group. Among these examples, a mercaptomethyl group, a 2-mercaptoethyl group or a 1-mercaptoethyl group is preferable, and a mercaptomethyl group is more preferable.

In the case where $R^{e5}$ represents a halogenated alkyl group having 1 to 4 carbon atoms, examples of the halogen atoms contained in the halogenated alkyl group include fluorine, chlorine, bromine and iodine.

In the case where $R^{e5}$ represents a halogenated alkyl group having 1 to 4 carbon atoms, specific examples thereof include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, a 3-chloro-n-propyl group, a 3-bromo-n-propyl group, a 3-fluoro-n-propyl group, and a 4-chloro-n-butyl group. Among these examples, a chloromethyl group, a bromomethyl group, an iodomethyl group, a fluoromethyl group, a dichloromethyl group, a dibromomethyl group, a difluoromethyl group, a trichloromethyl group, a tribromomethyl group or a trifluoromethyl group is preferable, and a chloromethyl group, a dichloromethyl group, a trichloromethyl group or a trifluoromethyl group is more preferable.

In the case where $R^{e5}$ represents a halogen atom, specific examples thereof include fluorine, chlorine, bromine and iodine.

In formula (e4), n1 is an integer of 0 to 3, preferably 1. In the case where n1 is 2 or 3, the plurality of $R^{e5}$ may be the same or different.

In the compound represented by formula (e4), the substitution position of $R^{e5}$ on the benzene ring is not particularly limited. The substitution position of $R^{e5}$ on the benzene ring is preferably the meta-position or para-position of the bonding position of —$(CH_2)_{n0}$—SH.

As the compound represented by formula (e4), a compound having at least one group selected from an alkyl group, a hydroxyalkyl group and a mercaptoalkyl group as $R^{e5}$ is preferable, and a compound having one group selected from an alkyl group, a hydroxyalkyl group and a mercaptoalkyl group as $R^{e5}$ is more preferable.

In the case where the compound represented by formula (e4) has one group selected from an alkyl group, a hydroxyalkyl group and a mercaptoalkyl group as $R^{e5}$, the substitution position of the alkyl group, the hydroxyalkyl group or the mercaptoalkyl group on the benzene ring is preferably the meta-position or the para-position of the bonding position of —$(CH_2)_{n0}$—SH, more preferably the para-position.

In formula (e4), n0 is an integer of 0 to 3. In terms of ease in the synthesis of the compound and availability of the compound, n is preferably 0 or 1, and more preferably 0.

Specific examples of the compound represented by formula (e4) include p-mercaptophenol, p-thiocresol, m-thiocresol, 4-(methylthio) benzenethiol, 4-methoxybenzenethiol, 3-methoxybenzenethiol, 4-ethoxybenzenethiol, 4-isopropyloxybenzenethiol, 4-tert-butoxybenzenethiol, 3,4-dimethoxybenzenethiol, 3,4,5-trimethoxybenzenethiol, 4-ethylbenzenethiol, 4-isopropylbenzenethiol, 4-n-butylbenzenethiol, 4-tert-butylbenzenethiol, 3-ethylbenzenethiol, 3-isopropylbenzenethiol, 3-n-butylbenzenethiol, 3-tert-butylbenzenethiol, 3,5-dimethylbenzenethiol, 3,4-dimethylbenzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl) phenol, 3-(mercaptomethyl) phenol, 1,4-di (mercaptomethyl) phenol, 1,3-di (mercaptomethyl) phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, and 4-tert-butylthiobenzenethiol.

Other examples of the sulfur-containing group having a mercapto group include a compound having a nitrogen-containing aromatic hetero ring substituted with a mercapto group, and a tautomer of a compound having a nitrogen-containing aromatic hetero ring substituted with a mercapto group.

Preferable specific examples of the nitrogen-containing aromatic hetero ring include imidazole, pyrazole, 1,2,3-triazole, 1,2,4-triazole, oxazole, thiazole, pyridine, pyrimidine, pyridazine, pyrazine, 1,2,3-triazine, 1,2,4-triazine, 1,3,5-triazine, indole, indazole, benzimidazole, benzoxazole, benzothiazole, 1H-benzotriazole, quinoline, isoquinoline, cinnoline, phthalazine, quinazoline, quinoxaline, and 1,8-naphthyridine.

Preferable examples of the compound having a nitrogen-containing aromatic hetero ring substituted with a mercapto group, and the tautomer of a compound having a nitrogen-containing aromatic hetero ring substituted with a mercapto group include the following compounds.

[Chemical Formula 63]

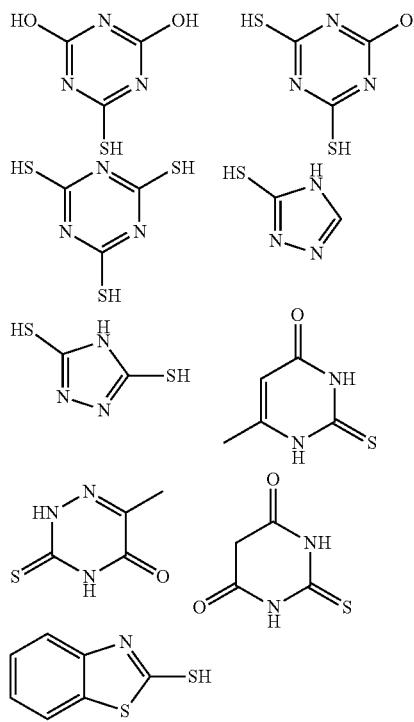

As the component (E), one kind of compound may be used alone, or two or more kinds of compounds may be used in combination.

In the case where the resist composition contains the component (E), the amount of the component (E) in the resist composition, relative to 100 parts by weight of the resin component (component (P)) is preferably 0.01 to 5 parts by weight, more preferably 0.02 to 3 parts by weight, and still more preferably 0.02 to 2 parts by weight.

Component (C): Lewis Acid Compound

The resist composition according to the present embodiment may include a Lewis acid compound (hereafter, sometimes referred to as "component (C)").

A "Lewis acid compound" refers to a compound which has an unoccupied orbital capable of receiving at least one electron pair, and is capable of acting as an electron-pair acceptor.

The component (C) is not particularly limited as long as it is a compound recognizable by a skilled person as a Lewis acid compound. As the component (C), a compound which does not fall under the definition of a Bronsted acid (proton acid) is used preferably.

Specific examples of the component (C) include boron fluoride, an ether complex of boron fluoride (e.g., $BF_3 \cdot Et_2$, $BF_3 \cdot Me_2O$, $BF_3 \cdot THF$, wherein Et is an ethyl group, Me is a methyl group, and THF is tetrahydrofuran), an organoboron compound (e.g., tri-n-octyl borate, tri-n-butyl borate, triphenyl borate, and triphenyl boron), titanium chloride, aluminum chloride, aluminum bromide, gallium chloride, gallium bromide, indium chloride, thallium trifluoroacetate, tin chloride, zinc chloride, zinc bromide, zinc iodide, zinc trifluoromethanesulfonate, zinc acetate, zinc nitrate, zinc tetrafluoroborate, manganese chloride, manganese bromide, nickel chloride, nickel bromide, nickel cyanide, nickel acetylacetonate, cadmium chloride, cadmium bromide, stannous chloride, stannous bromide, stannous sulfate, and stannous tartrate.

Other specific examples of the component (C) include chlorides, bromides, sulfates, nitrates, carboxylates or trifluoromethanesulfonates of a rare earth metal; cobalt chloride; ferrous chloride; and yttrium chloride.

Examples of the rare earth metal element include lanthanum, cerium, praseodymium, neodymium, samarium, europium, gadolinium, terbium, dysprosium, holmium, erbium, thulium, ytterbium, and lutetium.

In terms of availability and the effect of addition thereof, the component (C) preferably contains a Lewis acidic compound containing a group 13 element of the periodic table.

Examples of the group 13 element of the periodic table include boron, aluminum, gallium, indium, and thallium.

Among the above examples, in terms of availability of the component (C) and the effect of addition thereof, boron is preferable. That is, the component (C) is preferably includes a Lewis acid compound containing boron.

Examples of Lewis acidic compounds containing boron include boron fluoride, an ether complex of boron fluoride, boron halides such as boron chloride and boron bromide; and various organoboron compounds. As the Lewis acid compound containing boron, an organoboron compound is preferable because the content ratio of halogen atoms in the Lewis acidic compound is small, and the resist composition may be reliably applied to uses requiring a low halogen content.

As a preferable example of the organoboron compound, a boron compound represented by the following formula (c1) may be given:

$$B(R^{c1})_{n1}(OR^{c2})_{(3-n1)} \qquad (c1)$$

in formula (c1), $R^{c1}$ and $R^{c2}$ each independently represents a hydrocarbon group having 1 to 20 carbon atoms; wherein the hydrocarbon group may have 1 or more substituents; n1 represents an integer of 0 to 3; when a plurality of $R^{c1}$ are present, 2 of the plurality of $R^1$ may be mutually bonded to form a ring; and when a plurality of $OR^{c2}$ are present, 2 of the plurality of $OR^{c2}$ may be mutually bonded to form a ring.

It is preferable that the resist composition contains, as the component (C), at least one kind of the boron compound represented by formula (c1).

In formula (c1), in the case where each of $R^{c1}$ and $R^{c2}$ represents a hydrocarbon group, the hydrocarbon group has 1 to 20 carbon atoms. The hydrocarbon group having 1 to 20 carbon atoms may be an aliphatic hydrocarbon group, an aromatic hydrocarbon group, or a hydrocarbon group which is a combination of an aliphatic group and an aromatic group.

As the hydrocarbon group having 1 to 20 carbon atoms, a saturated aliphatic hydrocarbon group or an aromatic hydrocarbon group is preferable. The hydrocarbon group for $R^{c1}$ and $R^{c2}$ preferably has 1 to 10 carbon atoms. In the case where the hydrocarbon group is an aliphatic hydrocarbon group, the hydrocarbon group preferably has 1 to 6 carbon atoms, more preferably 1 to 4 carbon atoms.

The hydrocarbon group for $R^{c1}$ and $R^{c2}$ may be a saturated hydrocarbon group or an unsaturated hydrocarbon group, but is preferably a saturated hydrocarbon group.

In the case where the hydrocarbon group for $R^{c1}$ and $R^{c2}$ is an aliphatic hydrocarbon group, the aliphatic hydrocarbon group may be linear, branched, cyclic, or a combination thereof.

Preferable specific examples of the aromatic hydrocarbon group include a phenyl group, a naphthalen-1-yl group, a naphthalen-2-yl group, a 4-phenylphenyl group, a 3-phenylphenyl group and a 2-phenylphenyl group. Among these examples. a phenyl group is preferable.

As the saturated aliphatic hydrocarbon group, an alkyl group is preferable. Preferable specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group and an n-decyl group.

The hydrocarbon group for $R^{c1}$ and $R^{c2}$ may have 1 or more substituents. Examples of the substituent include a halogen atom, a hydroxy group, an alkyl group, an aralkyl group, an alkoxy group, a cycloalkyloxy group, an aryloxy group, an aralkyloxy group, an alkylthio group, a cycloalkylthio group, an arylthio group, an aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N,N-disubstituted amino group, a carbamoyl group (—CO—NH$_2$), an N-monosubstituted carbamoyl group, an N,N-disubstituted carbamoyl group, a nitro group, and a cyano group.

The number of carbon atoms of the substituent is not particularly limited as long as the objects of the present invention are not impaired, but is preferably 1 to 10, and more preferably 1 to 6.

Specific examples of organoboron compounds represented by formula (c1) include the following compounds. In the following formulae, Pen indicates a pentyl group, Hex indicates a hexyl group, Hep indicates a heptyl group, Oct indicates an octyl group, Non indicates a nonyl group, and Dec indicates a decyl group.

[Chemical Formula 64]

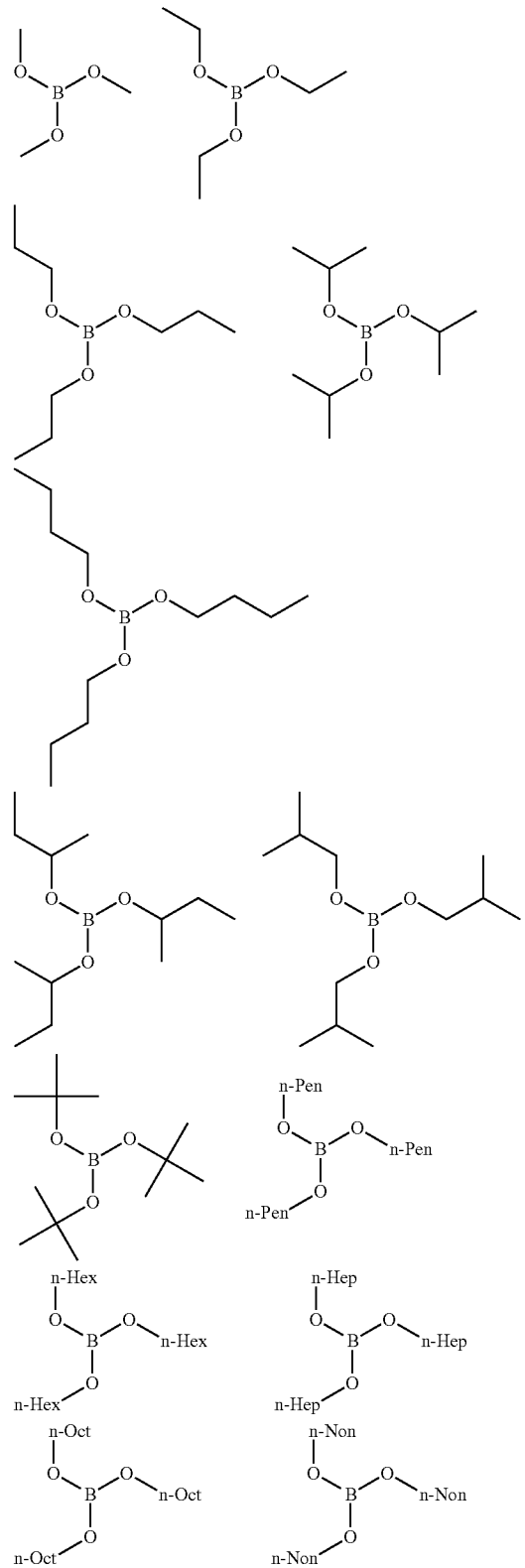

-continued
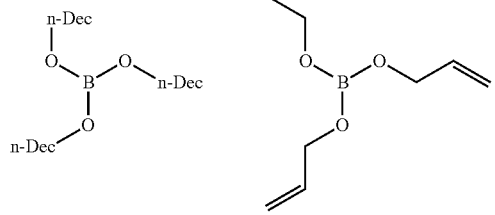
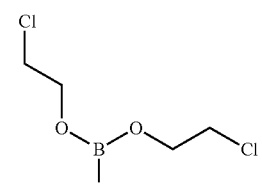
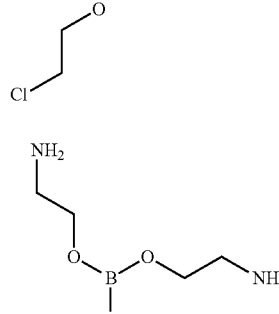
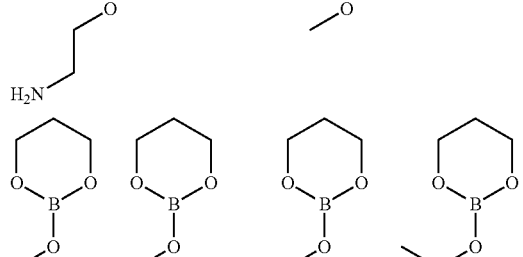
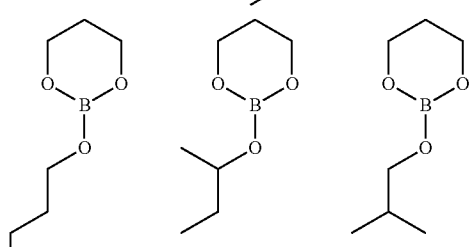
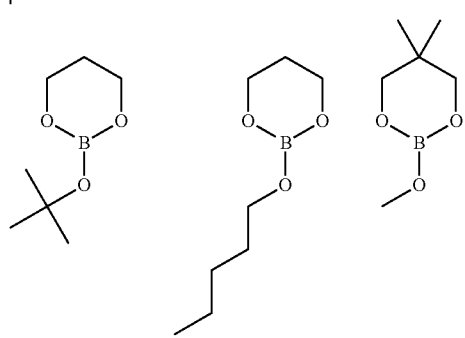
-continued
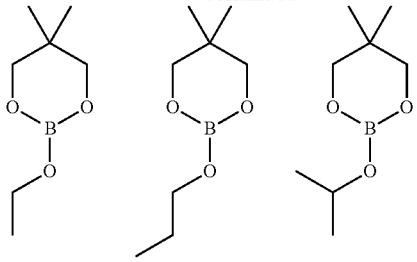
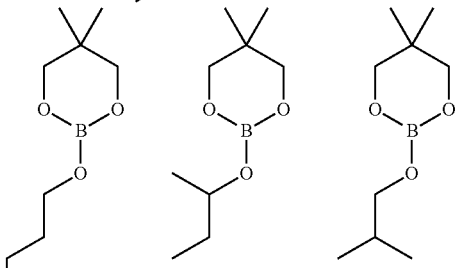
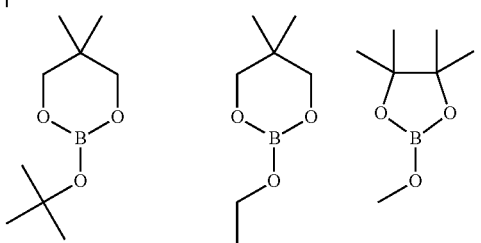
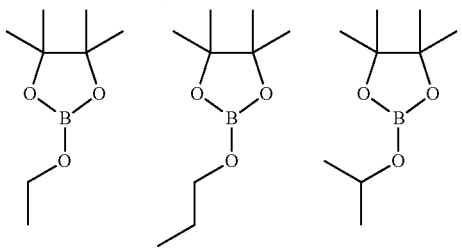
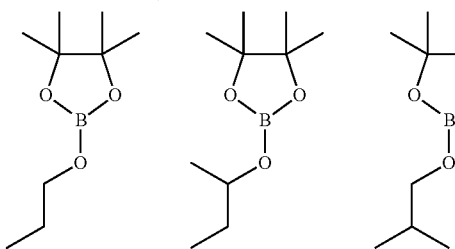
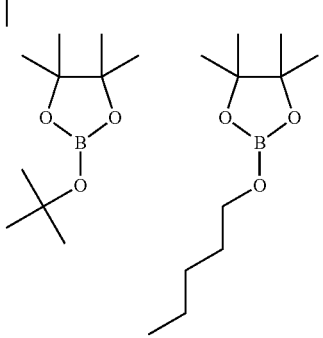

119
-continued
[Chemical Formula 65]
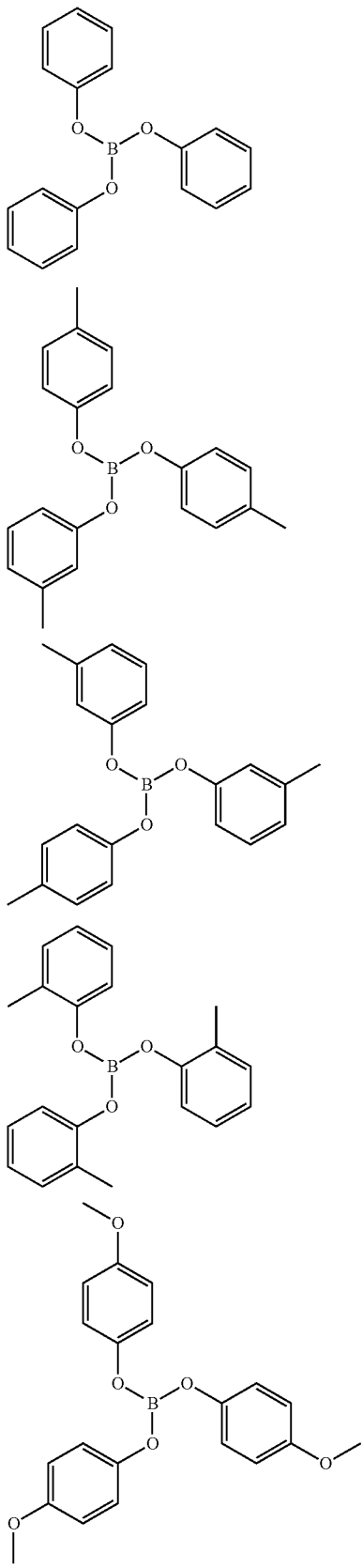
120
-continued
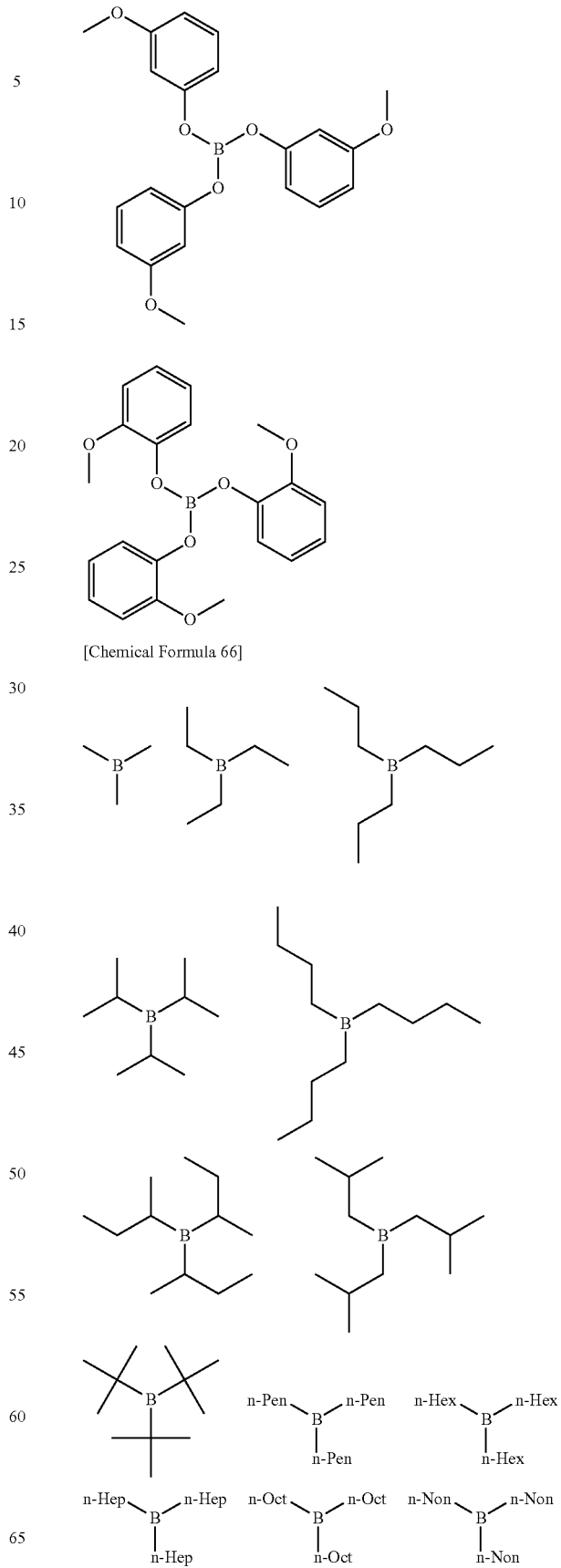
[Chemical Formula 66]

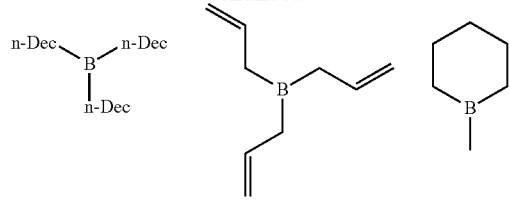
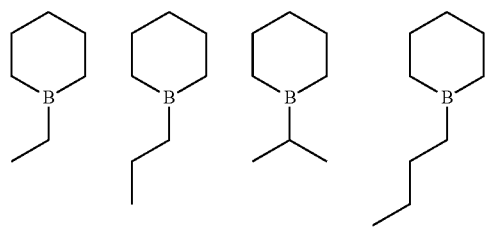
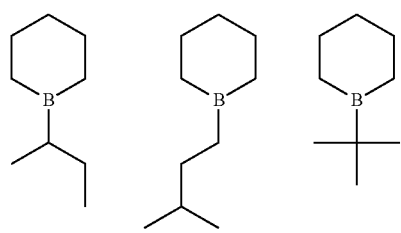
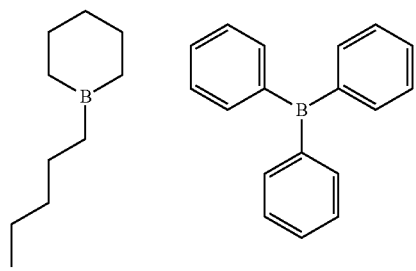
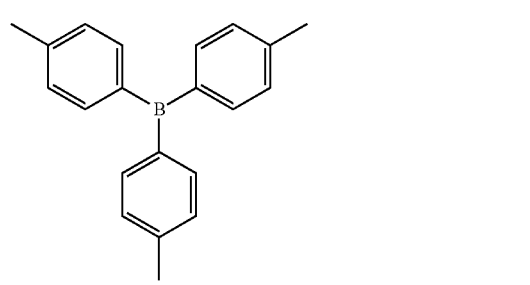
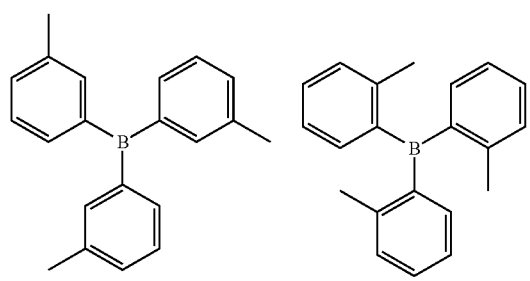
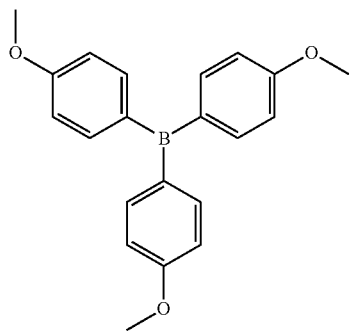
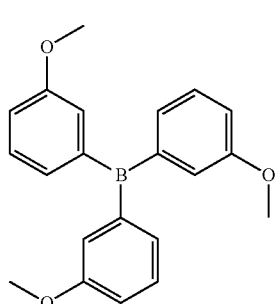
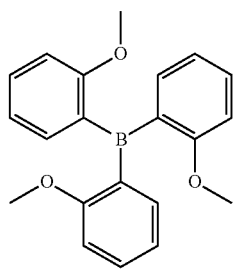
[Chemical Formula 67]
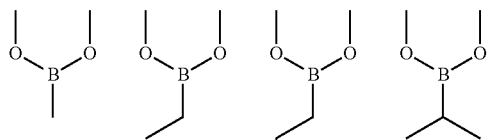
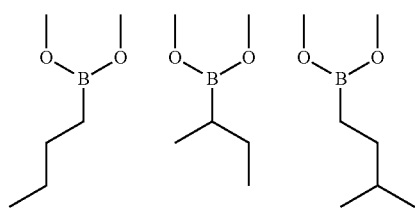
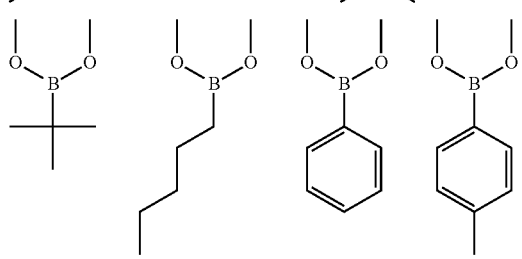

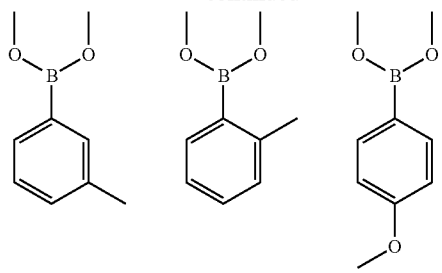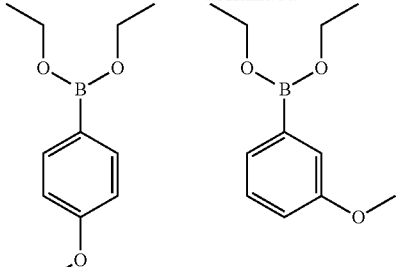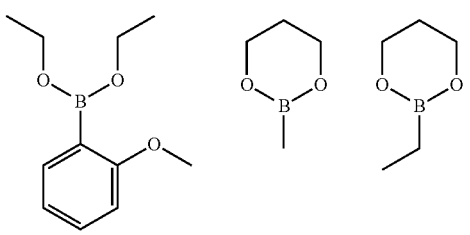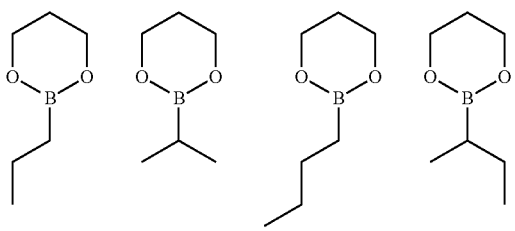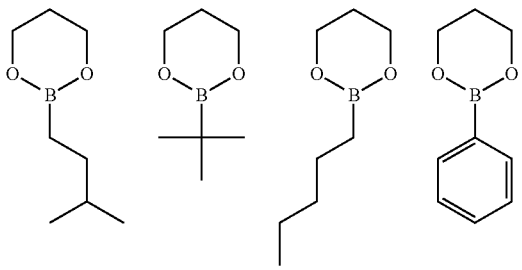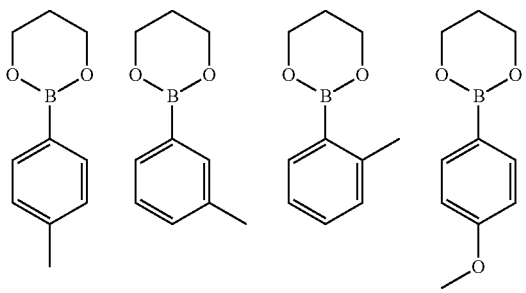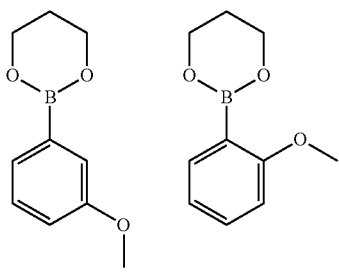

[Chemical Formula 68]

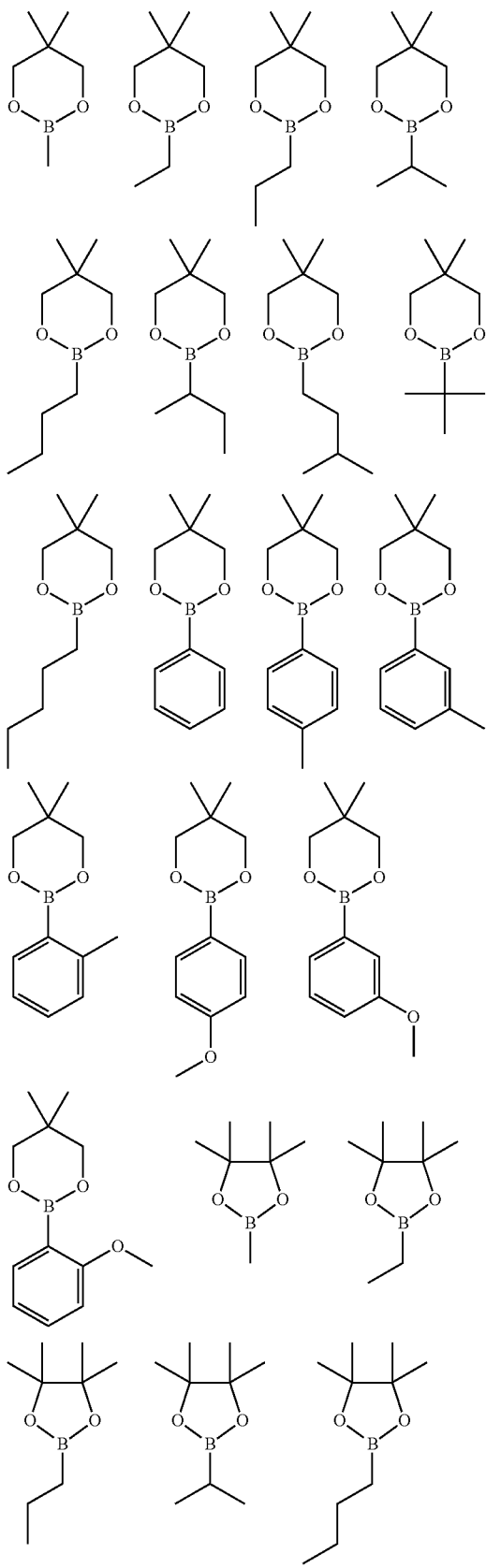
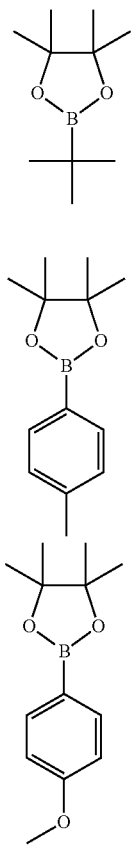

As the component (C), one kind of compound may be used, or two or more kinds of compounds may be used.

In the case where the resist composition contains the component (C), the amount of the component (C) in the resist composition, relative to 100 parts by weight of the resin component (component (P)) is preferably 0.01 to 5 parts by weight, more preferably 0.01 to 3 parts by weight, and still more preferably 0.05 to 2 parts by weight.

If desired, other miscible additives can also be added to the resist composition. Examples of such miscible additives include additive resins for improving the performance of the resist film, dissolution inhibitors, plasticizers, stabilizers, colorants, halation prevention agents, and dyes.

Component (S): Organic Solvent

The resist composition may be prepared by dissolving the resist materials for the resist composition in an organic solvent (hereafter, frequently referred to as "component (S)").

The component (S) may be any organic solvent which can dissolve the respective components to give a homogeneous solution, and one or more organic solvents can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl 3-methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

The component (S) can be used individually, or in combination as a mixed solvent.

Among these examples, PGMEA, 3-methoxybutyl acetate, butyl acetate and 2-heptanone is preferable.

The amount of the component (S) is not particularly limited, and is appropriately adjusted to a concentration which enables coating of a coating solution to a substrate. Generally, in the case where the resist composition is used in an application where a resist film obtained by spin-coating method or the like is desired to have a film thickness of 1 μm or more, the component (S) is used in an amount such that the solid content of the resist composition becomes within the range from 15 to 65% by weight.

The resist composition may further contain a polyvinyl resin in order to improve plasticity. Specific examples of the polyvinyl resin include polyvinyl chloride, polystyrene, polyhydroxystyrene, polyvinyl acetate, polyvinyl benzoic acid, polyvinyl methyl ether, polyvinyl ethyl ether, polyvinyl alcohol, polyvinyl pyrrolidone, polyvinyl phenol, and copolymers thereof. The polyvinyl resin is preferably polyvinyl methyl ether because of its low glass transition point.

The resist composition may further contain an adhesion assistant in order to improve the adhesion to the substrate.

Moreover, the resist composition may further contain a surfactant in order to improve applicability, defoaming property, leveling property and the like. As the surfactant, for example, a fluorine-based surfactant or a silicone-based surfactant is preferably used.

Specific examples of the fluorine-based surfactant include BM-1000 and BM-1100 (both manufactured by BM Chemie); MEGAFACE F142D, MEGAFACE F172, MEGAFACE F173, and MEGAFACE F183 (each of which is manufactured by DIC Corporation); Fluorad FC-135, Fluorad FC-170C, Fluorad FC-430, and Fluorad FC-431 (each of which is manufactured by Sumitomo 3M Limited); Surflon S-112, Surflon S-113, Surflon S-131, Surflon S-141, and Surflon S-145 (each of which is manufactured by AGC Inc.); SH-28PA, SH-190, SH-193, SZ-6032, and SF-8428 (each of which is manufactured by Toray Silicone). However, the fluorine-based surfactant is not limited to these examples.

Preferable examples of silicone surfactants include unmodified silicone surfactants, polyether-modified silicone surfactants, polyester-modified silicone surfactants, alkyl-modified silicone surfactants, aralkyl-modified silicone surfactants, and reactive silicone-based surfactants.

As the silicone surfactant, a commercially available silicone surfactant may be used. Specific examples of commercially available silicone surfactants include Paintad M (manufactured by Dow Toray Co., Ltd.); Topeka K1000, Topeka K2000, and Topeka K5000 (each of which is manufactured by Takachiho Sangyo Co., Ltd.); XL-121 (a polyether-modified silicone surfactant manufactured by Clariant); and BYK-310 (a polyester-modified silicone surfactant manufactured by BYK).

The resist composition may further contain an acid, an acid anhydride, or a high boiling point solvent in order to finely adjust the solubility in an alkali developing solution.

Examples of acids and acid anhydrides include a monocarboxylic acid, such as acetic acid, propionic acid, n-butyric acid, isobutyric acid, n-valeric acid, isovaleric acid, benzoic acid, or cinnamic acid; a hydroxymonocarboxylic acid, such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, or 5-hydroxyisophthalic acid; a polycarboxylic acid, such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexane tricarboxylic acid, butanetetracarboxylic acid, trimellitic acid, pyromellitic acid, cyclopentanetetracarboxylic acid, butanetetracarboxylic acid, or 1,2,5,8-naphthalenetetracarboxylic acid; and an acid anhydride, such as itaconic anhydride, succinic anhydride, citraconic anhydride, dodecenyl succinic anhydride, tricarbanilic anhydride, maleic anhydride, hexahydrophthalic anhydride, methyltetrahydrophthalic anhydride, hymic anhydride, 1,2,3,4-butanetetracarboxylic anhydride, cyclopentanetetracarboxylic dianhydride, phthalic anhydride, pyromellitic anhydride, trimellitic anhydride, benzophenone tetracarboxylic anhydride, ethylene glycol bistrimellitic anhydride, or glycerin trisanhydrous trimellitate.

Examples of high boiling point solvents include N-methylformamide, N,N-dimethylformamide, N-methylformanilide, N-methylacetamide, N,N-dimethylacetamide, N-methylpyrrolidone, dimethylsulfoxide, benzylethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and ethyl phthalyl ethyl glycolate.

The amount of the above-mentioned compound used for finely adjusting the solubility in an alkali developing solution may be adjusted depending on the application and coating method, and is not particularly limited as long as the composition may be mixed uniformly. However, the amount of such compound, based on the total weight of the composition to be obtained is 60% by weight or less, preferably 40% by weight or less.

As described above, in the method of forming a resist pattern according to the present invention, a resist composition containing a combination of a first resin component (P1) and a second resin component (P2) which satisfy a specific relationship with respect to the dissolution rate (i.e., $DR_{MIX} < DR_{P1}$, and $DR_{MIX} < DR_{P2}$) is used. That is, the dissolution rate of the mixed resin in an alkaline developing solution is set to a smaller value than the dissolution rate of each individual resin in an alkaline developing solution. As a result, the difference in the solubility of the resist film in a developing solution between the unexposed portions and the exposed portions (dissolution contrast) may be increased. In addition, film thickness loss of the unexposed portions of the resist film may be suppressed, and residue is unlikely to be generated in exposed portions of the resist film. In this manner, a resist pattern can be formed with high sensitivity and high resolution.

In the present embodiment, as a preferable component (P1), a polymeric compound (p10) having a combination of the structural unit (a1) and the structural unit (a0) may be used, and as a preferable component (P2), a polymeric compound having a structural unit (u0) containing a phenolic hydroxy group may be used. A mixed resin of the component (p10) and the component (p20) exhibits a mixed state in which the dissolution rate ($DR_{MIX}$) of the mixed resin is smaller than the dissolution rate ($DR_{P1}$) of the component (p10), and also smaller than the dissolution rate ($DR_{P2}$) of the component (p20).

Although the reason for this has not been elucidated yet, for example, it is presumed that the —COOH portion (alkali-soluble portion) of the structural unit (a0) in the component (p10) and the —OH portion (alkali-soluble portion) of the structural unit (u0) containing a phenolic hydroxyl group in the component (p20) causes steric hindrance by the hydrogen bonds. As a result, it is presumed that the neutralization reaction between the alkali-soluble portions and the alkali component in the alkali developing solution is unlikely to proceed, such that the mixed resin exhibits a low solubility in an alkali developing solution.

In the method of forming a resist pattern according to the present embodiment, even when a copper substrate that tends to generate footing or residue is used, it is unlikely that a residue is generated in an exposed portion of the resist film, and a resist pattern having a good shape may be formed.

(Method of Producing Resist Composition)

One aspect of the present invention is a method of producing a resist composition which generates acid upon exposure and exhibits increased solubility in an alkali developing solution under action of acid, the method including: mixing a first resin component (P1) with a second resin component (P2).

In the case where the first resin component (P1) is a polymeric compound (p10) including a structural unit (a1) derived from an acrylate ester containing an acid decomposable group that exhibits increased polarity by the action of acid, the acrylate ester optionally having the hydrogen atom bonded to the carbon atom on the α-position substituted with a substituent, and a structural unit (a0) derived from acrylic acid optionally having the hydrogen atom bonded to the carbon atom on the α-position substituted with a substituent, the second resin component (P2) is a polymeric compound (p20) including a structural unit (u0) containing a phenolic hydroxy group, when the dissolution rate of the first resin component (P1) in an alkali developing solution is defined $DR_{P1}$, the dissolution rate of the second resin component (P2) in an alkali developing solution is defined $DR_{P2}$, and the dissolution rate of a mixed resin of the first resin component (P1) and the second resin component (P2) is defined $DR_{MIX}$, the first resin component (P1) and the second resin component that satisfy the following relationship are used in combination:

$DR_{MIX} < DR_{P1}$ and $DR_{MIX} < DR_{P2}$.

The component (P1), the component (P2) and the resist composition containing the components (P1) and (P2) are the same as defined under the aforementioned <Resist composition>.

The (P1) component and the (P2) component may be mixed together by a known method, and if necessary, the components (P1) and (P2) may be dispersed and mixed together using a disperser such as a dissolver, a homogenizer, or a three roll mill.

The dissolution rates of the component (P1), the component (P2) and the mixed resin thereof in an alkali developing solution may be controlled by appropriately selecting the kind of the raw material monomer of each resin, the combination of the component (P1) and the component (P2), the mixing ratio of the component (P1) to the component (P2), and the like.

EXAMPLES

As follows is a description of examples of the present invention, although the scope of the present invention is by no way limited by these examples.

<Resin Component>

In the examples, the following polymeric compounds were used.

<Polymeric Compound (p10)> p10-1 to p10-7: Acrylic resins having structural units derived from the following monomers (m1) to (m7) in a unit ratio indicated in Table 1

[Chemical Formula 69]

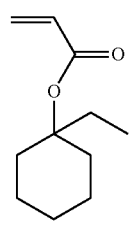

Monomer (m1)

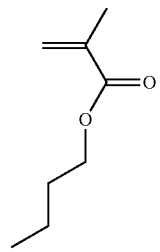

Monomer (m2)

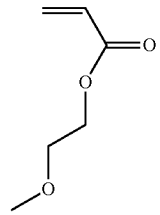

Monomer (m3)

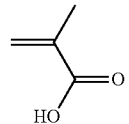

Monomer (m4)

-continued

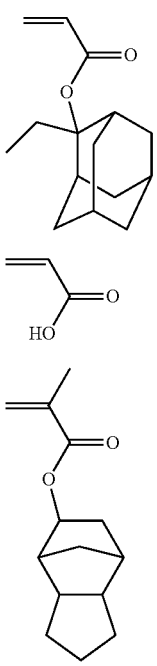

Monomer (m5)

Monomer (m6)

Monomer (m7)

TABLE 1

| Polymeric compound (p10) | Unit ratio of units derived from each monomer (molar ratio) | | | | | | | Total (mol %) | Weight average molecular weight Mw |
|---|---|---|---|---|---|---|---|---|---|
| | Monomer (m1) | Monomer (m2) | Monomer (m3) | Monomer (m4) | Monomer (m5) | Monomer (m6) | Monomer (m7) | | |
| p10-1 | 22 | 12 | 33 | 17 | 16 | — | — | 100 | 30000 |
| p10-2 | 33 | 13 | 37 | 17 | — | — | — | 100 | 240000 |
| p10-3 | 33 | 13 | 37 | 17 | — | — | — | 100 | 80000 |
| p10-4 | 34 | 13 | 40 | — | — | 13 | — | 100 | 230000 |
| p10-5 | 17 | 8 | 22 | 23 | — | — | 30 | 100 | 40000 |
| p10-6 | 29 | 8 | 22 | 23 | — | — | 18 | 100 | 40000 |
| p10-7 | 30 | 12 | 33 | 9 | 16 | — | — | 100 | 30000 |

<<Novolak Phenolic Resin (p21)>> p21-1: A novolak resin having a weight average molecular weight of 16,000 to 17,000, which is a reaction product obtained by addition condensation of a mixture of m-cresol and p-cresol (m-cresol/p-cresol=60/40 molar ratio) and formaldehyde in the presence of an acid catalyst, followed by separation with water and methanol.

p21-2: A novolak resin obtained by condensing a mixture of m-cresol and 2,3,5-trimethylphenol (m-cresol/2,3,5-trimethylphenol=90/10 molar ratio) and formaldehyde. The weight average molecular weight: 30,000 to 35,000

<<Polyhydroxystyrene Resin (p22)>> p22-1: A copolymer having a weight average molecular weight of 2,500, and a unit ratio (molar ratio) of hydroxystyrene and styrene of 85:15 p22-2: A resin in which a polyhydroxystyrene (weight average molecular weight 10,000) has 27 mol % of the structural units introduced with t-Boc as an acid dissociable group p22-3: A resin having a weight average molecular weight of 10,000, and a unit ratio (molar ratio) of hydroxystyrene, styrene and t-butyl acrylate of 60:15:25 p22-4: A resin having a weight average molecular weight of 10,000, and a unit ratio (molar ratio) of hydroxystyrene, styrene and t-butyl acrylate of 70:5:25 p22-5: A resin having a weight average molecular weight of 10,000, and a unit ratio (molar ratio) of hydroxystyrene, styrene and t-butyl acrylate of 60:25:15

<Measurement of Dissolution Rate of Resin in Alkali Developing Solution>

The dissolution rates of resins (individual resin and mixed resin) in an alkali developing solution were measured in accordance with the following steps (1) to (6).

Step (1): Propylene glycol monomethyl ether acetate (PGMEA), 100 parts by weight of a resin and 0.05 to 0.1 parts by weight of a surfactant (BYK-310; manufactured by BYK) were mixed together, so as to prepare a resin solution having a resin content capable of forming a resin film having a film thickness of about 3 μm in the following film-forming step (step (2)).

Step (2): The resin solution was spin-coated on a silicon wafer, followed by a film-forming heat treatment (PAB) on a hot plate at 120° C. for 90 seconds, so as to form a resin film having a film thickness of 3 m.

Step (3): The film thickness of the resin film (initial film thickness X) was measured by a film-thickness measuring apparatus (optical interference-type film thickness measuring apparatus: nanospec model 3000).

Step (4): the silicon wafer having the resin film formed thereon was developed using an alkali developing solution under one of the following conditions (i) to (iii).

Development condition (i): Using a developing apparatus (Clean trackACT8; manufactured by Tokyo Electron), development was conducted at 23° C. with a 2.38 wt % aqueous solution of tetramethylammonium hydroxide (TMAH) for 30 seconds or 60 seconds, followed by washing with pure water and drying (spin-drying).

Development condition (ii): in the case where all of the resin film is dissolved by 30 seconds paddle development under the condition (i), a separate silicon wafer having the resin film formed thereon is subjected to a dip development at 23° C. with a 2.38 wt % aqueous solution of TMAH, and the time required to completely dissolve the resin film (dissolution time Z) was measured.

Development condition (iii): silicon wafer having the resin film formed thereon is subjected to a dip development at 23° C. with a 5 wt % aqueous solution of TMAH, and after the time required for completely dissolving the resin film (dissolution time Z) or after 120 seconds in the case the resin film is not completely dissolved, the silicon wafer is washed with pure water, followed by N2 blowing.

Step (5): After the alkali development, the film thickness of the resin film (film thickness Y after development) was measured in the same manner as in step (3).

Step (6): The dissolution rate (DR) of the resin in an alkaline developing solution is calculated.

In the case where (Y)>0: DR(nm/s)=(X−Y)/developing time]

In the case where (Y)=0: DR(nm/s)=(X)/(Z)

[Measurement Results of Dissolution Rate (1): Individual Resins]

For each of the resins p10-1 to p10-7, p21-1, p21-2, p22-1, p22-2, p22-3, p22-4 and p22-5, the dissolution rate (DR) in an alkali developing solution was measured. The results are shown in Tables 2 and 3.

Table 2 shows the dissolution rate (DR) as measured using a 2.38 wt % aqueous solution of TMAH. Table 3 shows the dissolution rate (DR) as measured using a 5 wt % aqueous solution of TMAH.

TABLE 2

| 2.38 wt % TMAHaq. | DR (nm/s) |
|---|---|
| p10-1 | 76.06 |
| p10-2 | 76.32 |
| p10-3 | 1399.20 |
| p10-4 | 38.11 |
| p10-5 | −3.49 |
| p10-6 | 10.04 |
| p10-7 | −3.99 |
| p21-1 | 6.31 |
| p21-2 | 10.10 |
| p22-1 | 99.53 |
| p22-2 | −0.07 |
| p22-3 | 0.21 |
| p22-4 | 16.40 |
| p22-5 | 0.01 |

TABLE 3

| 5 wt % TMAHaq. | DR (nm/s) |
|---|---|
| p10-1 | 2120.35 |
| p22-2 | 27.61 |
| p22-3 | 36.37 |
| p22-4 | 340.25 |
| p22-5 | 16.19 |

[Measurement Results of Dissolution Rate(2): Mixed Resins]

For each of the mixed resins, the dissolution rate ($DR_{MIX}$) in an alkali developing solution was measured. The results are shown in Tables 4 to 13.

TABLE 4

| 2.38 wt % TMAHaq. Mixed resin (weight ratio) | | $DR_{MIX}$ (nm/s) |
|---|---|---|
| p21-1 | p10-2 | |
| 100 | 0 | 6.31 |
| 90 | 10 | 2.40 |
| 70 | 30 | 3.43 |
| 50 | 50 | 4.81 |
| 0 | 100 | 76.32 |

TABLE 5

| 2.38 wt % TMAHaq. Mixed resin (weight ratio) | | $DR_{MIX}$ (nm/s) | | |
|---|---|---|---|---|
| p21-2 | Other resin | p10-1 | p10-2 | p22-1 |
| 100 | 0 | 10.10 | 10.10 | 10.10 |
| 90 | 10 | 0.38 | 0.59 | 12.33 |
| 70 | 30 | 0.19 | 0.95 | 26.21 |
| 50 | 50 | 0.82 | 4.36 | 62.97 |
| 30 | 70 | 3.34 | 9.30 | 80.92 |
| 20 | 80 | 17.93 | — | — |
| 10 | 90 | 52.06 | 40.15 | 92.44 |
| 0 | 100 | 76.06 | 76.32 | 99.53 |

TABLE 6

| 2.38 wt % TMAHaq. Mixed resin (weight ratio) | | $DR_{MIX}$ (nm/s) | |
|---|---|---|---|
| p22-1 | Other resin | p10-1 | p10-2 |
| 100 | 0 | 99.53 | 99.53 |
| 90 | 10 | 69.27 | 93.02 |
| 80 | 20 | 42.22 | — |
| 70 | 30 | 26.38 | 62.64 |
| 50 | 50 | 16.80 | 60.37 |
| 30 | 70 | 27.19 | 65.32 |
| 20 | 80 | 60.74 | — |
| 10 | 90 | 72.15 | 72.64 |
| 0 | 100 | 76.06 | 76.32 |

TABLE 7

| 2.38 wt % TMAHaq. Mixed resin (weight ratio) | | $DR_{MIX}$ (nm/s) | |
|---|---|---|---|
| p22-3 | Other resin | p22-4 | p22-5 |
| 100 | 0 | 0.21 | 0.21 |
| 90 | 10 | 0.33 | 0.18 |
| 80 | 20 | 0.51 | 0.16 |
| 70 | 30 | 0.74 | 0.13 |
| 60 | 40 | 1.23 | 0.11 |
| 50 | 50 | 1.95 | 0.09 |
| 40 | 30 | 2.98 | 0.08 |
| 30 | 70 | 5.11 | 0.07 |
| 20 | 80 | 7.23 | 0.04 |
| 10 | 90 | 11.26 | 0.02 |
| 0 | 100 | 16.40 | 0.01 |

TABLE 8

| 5 wt % TMAHaq. Mixed resin (weight ratio) | | $DR_{MIX}$ (nm/s) | |
|---|---|---|---|
| p22-3 | Other resin | p22-4 | p22-5 |
| 100 | 0 | 36.37 | 36.37 |
| 90 | 10 | 48.62 | 33.29 |
| 80 | 20 | 64.70 | 30.91 |
| 70 | 30 | 85.71 | 27.06 |
| 60 | 40 | 108.98 | 26.58 |
| 50 | 50 | 139.26 | 25.07 |
| 40 | 30 | 169.41 | 22.80 |
| 30 | 70 | 203.52 | 21.95 |
| 20 | 80 | 246.01 | 19.58 |
| 10 | 90 | 290.37 | 18.19 |
| 0 | 100 | 340.25 | 16.19 |

TABLE 9

| 2.38 wt % TMAHaq. Mixed resin (weight ratio) | | $DR_{MIX}$ (nm/s) |
|---|---|---|
| p10-2 | p10-3 | |
| 100 | 0 | 76.32 |
| 90 | 10 | 93.57 |
| 70 | 30 | 175.31 |
| 50 | 50 | 331.70 |
| 30 | 70 | 681.83 |
| 10 | 90 | 1262.80 |
| 0 | 100 | 1399.20 |

TABLE 10

| 5 wt % TMAHaq. Mixed resin (weight ratio) | | $DR_{MIX}$ (nm/s) |
|---|---|---|
| p22-2 | p10-1 | |
| 100 | 0 | 27.61 |
| 90 | 10 | 12.18 |
| 80 | 20 | 7.81 |
| 70 | 30 | 4.68 |
| 50 | 50 | 5.09 |
| 30 | 70 | 25.37 |
| 20 | 80 | 593.26 |
| 10 | 90 | 1584.14 |
| 0 | 100 | 2120.35 |

TABLE 11

| 5 wt % TMAHaq. Mixed resin (weight ratio) | | $DR_{MIX}$ (nm/s) |
|---|---|---|
| p22-3 | p10-1 | |
| 100 | 0 | 36.37 |
| 90 | 10 | 15.60 |
| 80 | 20 | 11.06 |
| 70 | 30 | 8.48 |
| 50 | 50 | 13.07 |
| 30 | 70 | 46.55 |
| 20 | 80 | 900.75 |
| 10 | 90 | 2081.26 |
| 0 | 100 | 2120.35 |

TABLE 12

| 2.38 wt % TMAHaq. Mixed resin (weight ratio) | | | | $DR_{MIX}$ (nm/s) |
|---|---|---|---|---|
| p21-1 | p22-1 | p10-5 | p10-6 | |
| — | — | 100 | — | -3.49 |
| — | — | — | 100 | 10.04 |
| 100 | — | — | — | 6.31 |
| 80 | 20 | — | — | 24.80 |
| — | — | 50 | 50 | -5.62 |
| 60 | — | 40 | — | 0.24 |
| 60 | — | — | 40 | 0.46 |
| 50 | 10 | — | 40 | 0.34 |
| 50 | 10 | 20 | 20 | 0.19 |

TABLE 13

| 2.38 wt % TMAHaq. Mixed resin (weight ratio) | | | | | $DR_{MIX}$ (nm/s) |
|---|---|---|---|---|---|
| p21-2 | p22-1 | p22-2 | p10-1 | p10-7 | |
| — | — | — | 100 | — | 76.06 |
| — | — | — | — | 100 | -3.99 |
| 100 | — | — | — | — | 10.10 |
| 70 | — | — | 30 | — | 0.19 |
| 70 | — | — | — | 30 | 0.09 |
| 70 | — | — | 15 | 15 | 0.14 |
| — | — | — | 50 | 50 | 55.00 |
| 60 | 10 | — | 30 | — | 0.29 |
| 45 | 15 | — | 40 | — | 0.16 |
| 86 | 14 | — | — | — | 19.46 |
| 75 | — | 25 | — | — | 2.43 |

Tables 7 to 9 show the measurement results of the dissolution rate of a mixed resin obtained by a conventional method in which alkali-soluble resins having a different introduction ratio (protection ratio) of an acid dissociable group (protective group) are prepared, and then mixed together In this case, it is indicated the relationship of the dissolution rate between the poorly solubilized resin $P'_{MIX}$ (dissolution rate: $DR'_{MIX}$) obtained after the mixing, the resin $P'_H$ (dissolution rate: $DR'_{PH}$) with high protection ratio and low dissolution rate prior to mixing, and the resin $P'_L$ (dissolution rate: $DR'_{PL}$) with low protection ratio and high dissolution rate prior to mixing is $DR'_{PH} < DR'_{MIX} < DR'_{PL}$.

Regarding the combinations of resins shown in tables other than Tables 7 to 9, it can be confirmed that the mixed resin has a composition (weight ratio) which exhibits a low dissolution rate in an alkali developing solution, as compared to the dissolution rate of the individual resin in an alkali developing solution (i.e., it can be confirmed whether or not the composition of the mixed resin enables the mixed resin to exhibit dissolution inhibiting effect).

Production of Resist Composition (1)

Examples 1 to 4, Comparative Examples 1 to 5

The components shown in Table 14 were mixed together and dissolved in propylene glycol monomethyl ether acetate (PGMEA) to obtain each resist composition (solid content: 28 wt %).

TABLE 14

| | Component (P2) | Component (P1) | Component (B) | Component (F1) | Component (F2) | Component (E) | Component (Add) |
|---|---|---|---|---|---|---|---|
| Comp. Ex. 1 | — | (P1)-1 [100] | (B)-1 [2.0] | (F1)-1 [0.01] | (F2)-1 [0.017] | (E)-1 [0.02] | Add-1 [0.05] |
| Comp. Ex. 2 | — | (P1)-2 [100] | (B)-1 [2.0] | (F1)-1 [0.01] | (F2)-1 [0.017] | (E)-1 [0.02] | Add-1 [0.05] |
| Comp. Ex. 3 | (P2)-1 [100] | — | (B)-1 [2.0] | (F1)-1 [0.01] | (F2)-1 [0.017] | (E)-1 [0.02] | Add-1 [0.05] |

TABLE 14-continued

| | Component (P2) | | Component (P1) | | Component (B) | Component (F1) | Component (F2) | Component (E) | Component (Add) |
|---|---|---|---|---|---|---|---|---|---|
| Comp. Ex. 4 | (P2)-1 [80] | (P2)-2 [20] | — | — | (B)-1 [2.0] | (F1)-1 [0.01] | (F2)-1 [0.017] | (E)-1 [0.02] | Add-1 [0.05] |
| Comp. Ex. 5 | — | — | (P1)-1 [50] | (P1)-2 [50] | (B)-1 [2.0] | (F1)-1 [0.01] | (F2)-1 [0.017] | (E)-1 [0.02] | Add-1 [0.05] |
| Ex. 1 | (P2)-1 [60] | — | (P1)-1 [40] | — | (B)-1 [2.0] | (F1)-1 [0.01] | (F2)-1 [0.017] | (E)-1 [0.02] | Add-1 [0.05] |
| Ex. 2 | (P2)-1 [60] | — | — | (P1)-2 [40] | (B)-1 [2.0] | (F1)-1 [0.01] | (F2)-1 [0.017] | (E)-1 [0.02] | Add-1 [0.05] |
| Ex. 3 | (P2)-1 [50] | (P2)-2 [10] | — | (P1)-2 [40] | (B)-1 [2.0] | (F1)-1 [0.01] | (F2)-1 [0.017] | (E)-1 [0.02] | Add-1 [0.05] |
| Ex. 4 | (P2)-1 [50] | (P2)-2 [10] | (P1)-1 [20] | (P1)-2 [20] | (B)-1 [2.0] | (F1)-1 [0.01] | (F2)-1 [0.017] | (E)-1 [0.02] | Add-1 [0.05] |

In Table 14, the reference characters indicate the following. The values in brackets [ ] indicate the amount (in terms of parts by weight) of the component added.

(P2)-1: The aforementioned novolak phenolic resin p21-1

(P2)-2: The aforementioned polyhydroxystyrene resin p22-1

(P1)-1: The aforementioned polymeric compound p10-5

(P1)-2: The aforementioned polymeric compound p10-6

(B)-1: Acid generator consisting of a compound represented by chemical formula (B1) shown below (F1)-1: Triamylamine (F2)-1: Salicylic acid (E)-1: Sulfur-containing compound represented by chemical formula (E-1) shown below Add-1: Surfactant BYK-310 (manufactured by BYK)

[Chemical Formula 70]

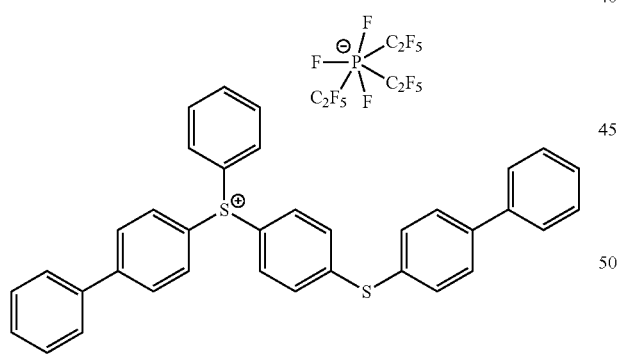

(B-1)

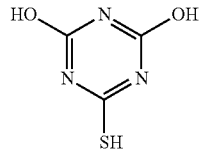

(E-1)

Production of Resist Composition (2)

Examples 5 to 9, Comparative Examples 6 to 13

The components shown in Table 15 were mixed together and dissolved in propylene glycol monomethyl ether acetate (PGMEA) to obtain each resist composition (solid content: 29 wt %).

TABLE 15

| | Component (P2) | Component (P1) | Component (B) | Component (F1) | Component (F2) | Component (E) | Component (Add) |
|---|---|---|---|---|---|---|---|
| Comp. Ex. 6 | — | (P1)-3 [100] | (B)-2 [1.2] | (F1)-1 [0.05] | (F2)-1 [0.08] | (E)-1 [0.02] | Add-1 [0.05] |
| Comp. Ex. 7 | — | (P1)-4 [100] | (B)-2 [1.2] | (F1)-1 [0.05] | (F2)-1 [0.08] | (E)-1 [0.02] | Add-1 [0.05] |
| Comp. Ex. 8 | (P2)-3 [100] | — | (B)-2 [1.2] | (F1)-1 [0.05] | (F2)-1 [0.08] | (E)-1 [0.02] | Add-1 [0.05] |
| Comp. Ex. 9 | (P2)-4 [100] | — | (B)-2 [1.2] | (F1)-1 [0.05] | (F2)-1 [0.08] | (E)-1 [0.02] | Add-1 [0.05] |
| Comp. Ex. 10 | (P2)-5 [100] | — | (B)-2 [1.2] | (F1)-1 [0.05] | (F2)-1 [0.08] | (E)-1 [0.02] | Add-1 [0.05] |
| Comp. Ex. 11 | (P2)-4 [50] (P2)-5 [50] | — | (B)-2 [1.2] | (F1)-1 [0.05] | (F2)-1 [0.08] | (E)-1 [0.02] | Add-1 [0.05] |
| Comp. Ex. 12 | (P2)-6 [100] | — | (B)-2 [1.2] | (F1)-1 [0.05] | (F2)-1 [0.08] | (E)-1 [0.02] | Add-1 [0.05] |
| Ex. 5 | (P2)-3 [70] | (P1)-3 [30] | (B)-2 [1.2] | (F1)-1 [0.05] | (F2)-1 [0.08] | (E)-1 [0.02] | Add-1 [0.05] |
| Ex. 6 | (P2)-3 [70] | (P1)-4 [30] | (B)-2 [1.2] | (F1)-1 [0.05] | (F2)-1 [0.08] | (E)-1 [0.02] | Add-1 [0.05] |
| Ex. 7 | (P2)-3 [70] | (P1)-3 [15] (P1)-4 [15] | (B)-2 [1.2] | (F1)-1 [0.05] | (F2)-1 [0.08] | (E)-1 [0.02] | Add-1 [0.05] |
| Comp. Ex. 13 | — | (P1)-3 [50] (P1)-4 [50] | (B)-2 [1.2] | (F1)-1 [0.05] | (F2)-1 [0.08] | (E)-1 [0.02] | Add-1 [0.05] |
| Ex. 8 | (P2)-3 [60] (P2)-2 [10] | (P1)-3 [30] | (B)-2 [1.2] | (F1)-1 [0.05] | (F2)-1 [0.08] | (E)-1 [0.02] | Add-1 [0.05] |
| Ex. 9 | (P2)-3 [45] (P2)-2 [15] | (P1)-3 [40] | (B)-2 [1.2] | (F1)-1 [0.05] | (F2)-1 [0.08] | (E)-1 [0.02] | Add-1 [0.05] |

In Table 15, the reference characters indicate the following. The values in brackets [ ] indicate the amount (in terms of parts by weight) of the component added.

(P2)-2: The aforementioned polyhydroxystyrene resin p22-1

(P2)-3: The aforementioned novolak phenolic resin p21-2$_o$ (P2)-4: The aforementioned polyhydroxystyrene resin p22-3$_o$ (P2)-5: The aforementioned polyhydroxystyrene resin p22-4

(P2)-6: The aforementioned polyhydroxystyrene resin p22-5

(P1)-3: The aforementioned polymeric compound p10-1

(P1)-4: The aforementioned polymeric compound p10-7

(B)-2: Acid generator consisting of a compound represented by chemical formula (B-2) shown below (F1)-1: Triamylamine (F2)-1: Salicylic acid (E)-1: Sulfur-containing compound represented by chemical formula (E-1) shown below Add-1: Surfactant BYK-310 (manufactured by BYK)

[Chemical Formula 71]

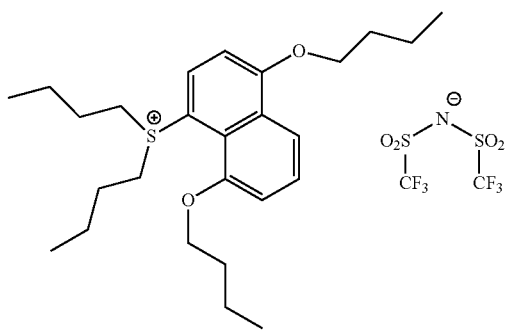

(B-2)

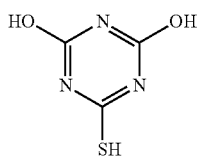

(E-1)

<Formation of Resist Pattern>

As an evaluation substrate, a Cu-sputtered substrate obtained by sputtering Ti (thickness: 50 nm)/Cu (thickness: 500 nm) on a silicon wafer was used.

Each resist composition of the examples was applied to the Cu-sputtered substrate, and then subjected to a heat treatment (post applied bake (PAB)) at 120° C. for 120 seconds and dried, so as to form a resist film having a film thickness of 3 μm (3,000 nm).

Then, using an exposure apparatus "Low NA i-Line stepper" (FPA-5510iV, manufactured by Canon), the resist film was selectively exposed through a mask pattern.

Subsequently, the Cu-sputtered substrate was placed on a hot plate, and a post-exposure bake (PEB) was conducted at 110° C. for 90 seconds.

Thereafter, using a developing apparatus (Cleantrack ACT8, manufactured by Tokyo Electron), an alkali developing was conducted at 23° C. for 60 seconds with a 2.38 wt % aqueous solution of tetramethylammonium hydroxide (TMAH) (product name: "NMD-3", manufactured by Tokyo Ohka Kogyo Co., Ltd.)

In the case where the resist compositions of Examples 1 to 4 and Comparative Examples 1 to 5 was used, as a result of the alkali development, it was observed that that a line and space resist pattern (LS pattern) having a line width of 2 μm and a pitch of 4 m was formed (A), or a resist pattern could not be formed (B: all of the resin film was dissolve, a pattern could not be resolved, swelling of the resist film occurred, etc.). In the case where an LS pattern was formed, the exposure dose (Dose; mJ/cm$^2$) with which the LS pattern could be formed was determined.

Observation of the pattern was conducted using a FEB critical dimension scanning electron microscope (S9220, manufactured by Hitachi High Technologies). In the table, the criteria was "A" when an LS pattern was formed, and the criteria was "B" when a pattern could not be formed. The results are shown in Table 16.

TABLE 16

| Resist composition | Dissolution rate of resin component in alkali developing solution (nm/s) | Evaluation of 2 μm LS pattern | Dose (mJ/cm$^2$) | State after alkali development |
|---|---|---|---|---|
| Comp. Ex. 1 | −3.49 | B | — | Partially resolved, but undulation due to swelling |
| Comp. Ex. 2 | 10.04 | B | — | Pattern dissolved |
| Comp. Ex. 3 | 6.31 | B | — | Could not be resolved |
| Comp. Ex. 4 | 24.80 | B | — | Could not be resolved |
| Comp. Ex. 5 | −5.62 | B | — | Swelling |
| Ex. 1 | 0.24 | A | 1350 | — |
| Ex. 2 | 0.46 | A | 320 | — |
| Ex. 3 | 0.34 | A | 210 | — |
| Ex. 4 | 0.19 | A | 650 | — |

As seen from the results shown in Table 16, it was confirmed that, by the method of forming a resist pattern using the resist compositions of Examples 1 to 4 applying the present invention, film thickness loss by development could be suppressed, and an LS pattern could be satisfactorily formed.

In the case where the resist compositions of Examples 5 to 9 and Comparative Examples 6 to 13 was used, as a result of the alkali development, it was observed that that a line and space resist pattern (LS pattern) having a line width of 2 μm and a pitch of 4 μm was formed (A), or a resist pattern could not be formed (B: all of the resin film was dissolve, a pattern could not be resolved, swelling of the resist film occurred, etc.). In the case where an LS pattern was formed, the exposure dose (Dose; mJ/cm$^2$) with which the LS pattern could be formed was determined.

Further, the target size was changed, and formation of an LS pattern was conducted in the same manner as in the above "Formation of resist pattern". As a result of the alkali development, a line width of 1 μm and a pitch of 2 μm was formed, or a resist pattern could not be formed (all of the resin film was dissolve, a pattern could not be resolved, swelling of the resist film occurred, etc.). In the case where an LS pattern was formed, the state of residue at space portions was evaluated, and the exposure does (Dose; mJ/cm$^2$) with which the LS pattern could be formed was determined.

Observation of the pattern was conducted using a FEB critical dimension scanning electron microscope (S9220, manufactured by Hitachi High Technologies). In the table, the criteria was "A" when an LS pattern was formed, and the criteria was "B" when a pattern could not be formed. Further, in the case where an LS pattern could be formed, the state of pattern residue of the LS pattern was evaluated (A: No residue, B: small amount of residue was confirmed, C: large amount of residue was confirmed). The results are shown in Table 17.

TABLE 17

| Resist composition | Dissolution rate of resin component in alkali developing solution (nm/s) | Formation/residue evaluation of 2 μm LS pattern | Formation/residue evaluation of 1 μm LS pattern | Dose (mJ/cm$^2$) | State after alkali development |
|---|---|---|---|---|---|
| Comp. Ex. 6 | 76.06 | B | x | — | All dissolved |
| Comp. Ex. 7 | −3.99 | B | x | — | Swelling |
| Comp. Ex. 8 | 10.10 | B | x | — | Could not be resolved |
| Comp. Ex. 9 | 0.21 | A/C | x | 780 | — |
| Comp. Ex. 10 | 16.40 | A/A | A/A | 190 | Film thickness loss was large, and non-conforming |
| Comp. Ex. 11 | 1.95 | A/B | A/C | 370 | — |
| Comp. Ex. 12 | 0.01 | A/C | B | 870 | — |
| Ex. 5 | 0.19 | A/A | A/A | 540 | — |
| Ex. 6 | 0.09 | A/A | A/C | 1200 | — |
| Ex. 7 | 0.14 | A/A | A/B | 870 | — |
| Comp. Ex. 13 | 55.00 | B | B | — | All dissolved |

TABLE 17-continued

| Resist composition | Dissolution rate of resin component in alkali developing solution (nm/s) | Formation/residue evaluation of 2 μm LS pattern | Formation/residue evaluation of 1 μm LS pattern | Dose (mJ/cm²) | State after alkali development |
|---|---|---|---|---|---|
| Ex. 8 | 0.29 | A/A | A/A | 320 | — |
| Ex. 9 | 0.16 | A/A | A/A | 280 | — |

As seen from the results shown in Table 17, it was confirmed that, by the method of forming a resist pattern using the resist compositions of Examples 5 to 9 applying the present invention, film thickness loss by development could be suppressed, and an LS pattern could be satisfactorily formed.

In addition, by the method of forming a resist pattern using the resist compositions of Examples 5, 8 and 9, an LS pattern having a smaller size could be satisfactorily formed, and residue is hardly generated.

By the method of forming a resist pattern using the resist composition of Comparative Example 10, with respect to both the 2 μm LS pattern and the 1 μm LS pattern, the pattern was resolved without generation of residue when observed from the upper side of the pattern. However, since the dissolution rate (nm/s) of the resin composition in an alkali developing solution was too high, film thickness loss of unexposed portions could not be suppressed (the state after alkali development: the film thickness after application was 3μ, but the film thickness after development was 2 μm).

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a resist pattern, comprising:
   forming a resist film using a resist composition which generates acid upon exposure and exhibits increased solubility in an alkali developing solution under action of acid;
   exposing the resist film; and
   alkali-developing the exposed resist film to form a positive-tone resist pattern,
   wherein the resist composition comprises a first alkali-soluble resin (P1) and a second resin (P2) which is different from the first alkali-soluble resin (P1),
   the first alkali-soluble resin (P1) is a polymeric compound (p10) comprising a structural unit (a1) derived from an acrylate ester containing an acid decomposable group that exhibits increased polarity by the action of acid, the acrylate ester optionally having the hydrogen atom bonded to the carbon atom on the a-position substituted with a substituent, and a structural unit (a0) derived from acrylic acid optionally having the hydrogen atom bonded to the carbon atom on the a-position substituted with a substituent,
   the second resin (P2) is a polymeric compound (p20) comprising a structural unit (u0) containing a phenolic hydroxy group, and
   when the dissolution rate of the first alkali-soluble resin (P1) in an alkali developing solution is defined $DR_{P1}$, the dissolution rate of the second resin (P2) in an alkali developing solution is defined $DR_{P2}$ and the dissolution rate of a mixed resin of the first resin (P1) and the second resin (P2) is defined $DR_{MIX}$, a combination of the first alkali-soluble resin (P1) and the second resin (P2) which satisfies the following relationship is used:
   $DR_{MIX} < DR_{P1}$ and $DR_{MIX} < DR_{P2}$, and
   a dissolution rate of the polymeric compound (P10) in an alkali developing solution is 10 nm/second or more.

2. The method according to claim 1, wherein the structural unit (a0) is represented by general formula (a0-0) shown below:

(a0-0)

wherein $R^0$ represents a hydrogen atom, an alkyl group of 1 to 5 carbon atoms or a halogenated alkyl group of 1 to 5 carbon atoms.

3. The method according to claim 1, wherein the polymeric compound (p20) is at least one member selected from the group consisting of a phenolic novolak resin (p21) and a polyhydroxystyrene resin (p22).

4. The method according to claim 3, wherein the phenolic novolak resin (p21) is a resin comprising a structural unit represented by general formula (u21-0) shown below:

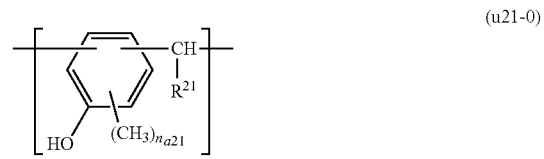

(u21-0)

wherein $R^{21}$ is a hydrogen atom or an organic group; and $n_{a21}$ represents an integer of 1 to 3.

5. The method according to claim 3, wherein the polyhydroxystyrene resin (p22) is a resin comprising a structural unit represented by general formula (u22-0) shown below:

(u22-0)

wherein $R^{22}$ represents a hydrogen atom, an alkyl group of 1 to 5 carbon atoms or a halogenated alkyl group of 1 to 5 carbon atoms; $Va^{22}$ represents a divalent linking group or a single bond; $Wa^{22}$ represents an aromatic hydrocarbon group having a valency of $(n_{a22}+1)$; and $n_{a22}$ represents an integer of 1 to 3.

6. The method according to claim 1, wherein a dissolution rate of the polymeric compound (P20) in an alkali developing solution is 5 nm/sec or more.

7. The method according to claim 6, wherein $DR_{MIX}$ is more than 0 nm/second and 35 nm/second or less.

8. The method according to claim 1, wherein the amount of the first alkali-soluble resin (P1), relative to 100 parts by weight of the total of the first alkali-soluble resin (P1) and the second resin (P2) is 10 to 70 parts by weight.

* * * * *